US012597400B2

(12) United States Patent (10) Patent No.: US 12,597,400 B2
Jiang et al. (45) Date of Patent: Apr. 7, 2026

(54) DISPLAY PANEL AND DISPLAY DEVICE

(71) Applicant: Xiamen Tianma Microelectronics Co., Ltd., Xiamen (CN)

(72) Inventors: Bin Jiang, Xiamen (CN); Min Huang, Xiamen (CN); Jiancai Huang, Xiamen (CN)

(73) Assignee: Xiamen Tianma Microelectronics Co., Ltd., Xiamen (CN)

( * ) Notice: Subject to any disclaimer, the term of this patent is extended or adjusted under 35 U.S.C. 154(b) by 0 days.

(21) Appl. No.: 18/913,703

(22) Filed: Oct. 11, 2024

(65) Prior Publication Data

US 2025/0037678 A1 Jan. 30, 2025

(30) Foreign Application Priority Data

Apr. 12, 2024 (CN) ........................ 202410445684.X

(51) Int. Cl.
*G09G 3/32* (2016.01)
*G09G 3/3266* (2016.01)
*G09G 3/36* (2006.01)
*G09G 3/20* (2006.01)
*G11C 19/28* (2006.01)

(52) U.S. Cl.
CPC ............. *G09G 3/3677* (2013.01); *G09G 3/32* (2013.01); *G09G 3/3266* (2013.01); *G09G 3/20* (2013.01); *G09G 3/3648* (2013.01); *G09G 2310/0267* (2013.01); *G09G 2310/0286* (2013.01); *G09G 2310/08* (2013.01); *G09G 2330/021* (2013.01); *G11C 19/28* (2013.01); *G11C 19/287* (2013.01)

(58) Field of Classification Search
CPC ...... G09G 3/3677; G09G 3/32; G09G 3/3266; G09G 3/3648; G09G 3/20; G09G 2310/0267; G09G 2310/0286; G09G 2310/08; G09G 2330/021; G11C 19/28; G11C 19/287
See application file for complete search history.

(56) References Cited

U.S. PATENT DOCUMENTS

| | | | | |
|---|---|---|---|---|
| 2008/0055293 A1* | 3/2008 | Kuo | ..................... | G09G 3/3677 345/204 |
| 2013/0293529 A1* | 11/2013 | You | ..................... | G09G 3/3611 345/212 |
| 2017/0025068 A1* | 1/2017 | Jeoung | ................. | G09G 3/3677 |
| 2017/0069275 A1* | 3/2017 | Sengoku | .............. | G09G 3/3677 |
| 2017/0102805 A1* | 4/2017 | Xiao | ........................ | G09G 3/20 |
| 2022/0093047 A1* | 3/2022 | Zhang | ................. | G09G 3/3266 |
| 2022/0180782 A1* | 6/2022 | Nishio | ................. | G09G 3/3233 |

* cited by examiner

*Primary Examiner* — Adam J Snyder
(74) *Attorney, Agent, or Firm* — KDW Firm PLLC

(57) ABSTRACT

Provided is a display panel. In the same shift register unit, an input module receives an input signal and a scan control signal and controls a signal of a first node; a reset module receives a reset clock signal and the scan control signal and controls a signal of a second node; an output module receives the signal of the first node, the signal of the second node, a first level signal, and an output clock signal and outputs a gate drive signal; and the refresh control module controls, according to the first refresh control signal, the time interval of the active level of the gate drive signal output by the shift register unit, and controls, according to the second refresh control signal, the time period of the inactive level of the gate drive signal output by the shift register unit.

19 Claims, 25 Drawing Sheets

20

01

DISPLAY PANEL AND DISPLAY DEVICE

CROSS-REFERENCE TO RELATED APPLICATION

This application claims priority to Chinese Patent Application No. 202410445684.X, filed on Apr. 12, 2024, the disclosure of which is incorporated herein by reference in its entirety.

TECHNICAL FIELD

The present application relates to the field of display technology, for example, a display panel and a display device.

BACKGROUND

As the display technology advances, the application scenarios of display panels are becoming increasingly diverse, and users' display requirements for display panels are also becoming more varied. For example, in short video applications, short videos are often displayed in only the central area of a display panel. Therefore, relatively high refresh rate requirements are imposed on the central area. In contrast, lower refresh rate requirements are imposed on other areas such as the static comment section, menu area, or black borders.

In the related art, in a display panel, the driver circuit refreshes pixels at the same rate across all areas, not satisfying the display requirements for partitioned refresh of the display panel.

SUMMARY

The present application provides a display panel and a display device, enabling partitioned refresh and partitioned frequency display, reducing power consumption of the display panel.

According to an aspect of the present application, a display panel is provided. The display panel includes a driver circuit. The driver circuit includes N cascaded shift register units. N is positive integer.

A shift register unit of the N shift register units includes an input module, a reset module, a refresh control module, and at least one output module.

In the same shift register unit, the input module is configured to receive at least an input signal and a scan control signal and control a signal of a first node; the reset module is configured to receive at least a reset clock signal and the scan control signal and control a signal of a second node; the output module is configured to, within at least part of the working time period of the display panel, receive the signal of the first node, the signal of the second node, a first level signal, and an output clock signal and output a gate drive signal; and the refresh control module is configured to receive at least a first refresh control signal and a second refresh control signal, to control, according to the first refresh control signal, the time interval of the active level of the gate drive signal output by the shift register unit, and to control, according to the second refresh control signal, the time period of the inactive level of the gate drive signal output by the shift register unit.

The time interval between an active pulse of the first refresh control signal and an active pulse of the second refresh control signal is $\Delta t$. $\Delta t > 0$.

According to another aspect of the present application, a display device is provided. The display device includes the preceding display panel.

It is to be understood that the content described in this section is neither intended to identify key or critical features of the embodiments of the present application nor intended to limit the scope of the present application. Other features of the present application become easily understood through the description provided hereinafter.

BRIEF DESCRIPTION OF DRAWINGS

To illustrate solutions of embodiments of the present application more clearly, the drawings used in the description of the embodiments are briefly described hereinafter. Apparently, the drawings described hereinafter illustrate part of the embodiments of the present application, and those of ordinary skill in the art may obtain other drawings based on the drawings described hereinafter on the premise that no creative work is done.

DETAILED DESCRIPTION

Figure 1:
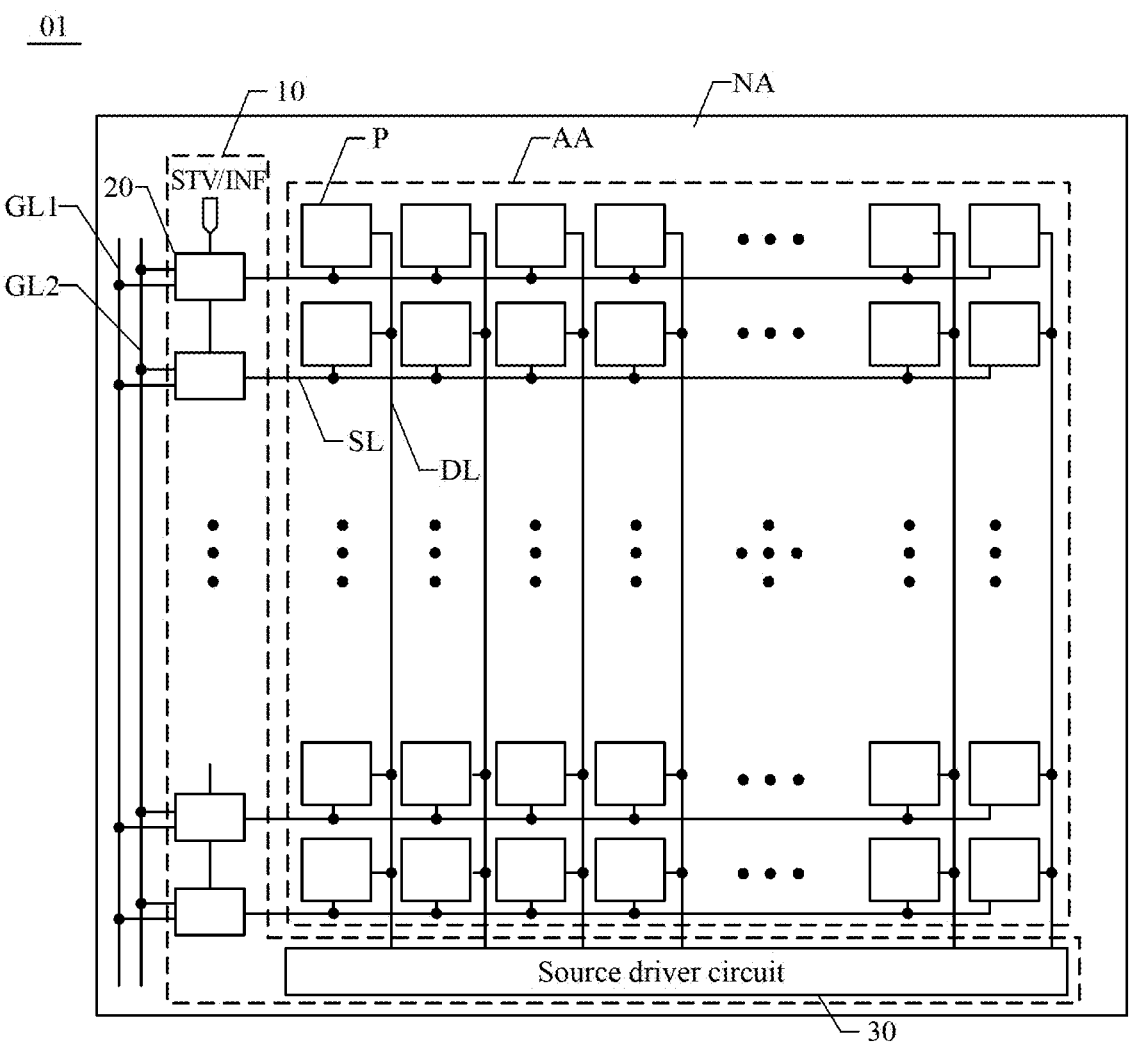
FIG. 1 is a top view of a display panel according to embodiments of the present application.

To make solutions of the present application better understood by those skilled in the art, solutions of embodiments of the present application are described hereinafter clearly and completely in conjunction with drawings in embodiments of the present application. Apparently, the embodiments described hereinafter are part, not all, of embodiments of the present application. Based on embodiments of the present application, all other embodiments obtained by those of ordinary skill in the art are within the scope of the present application on the premise that no creative work is done.

It is to be noted that terms such as "first" and "second" in the description, claims, and above drawings of the present disclosure are used for distinguishing between similar objects and are not necessarily used for describing a particular order or sequence. It is to be understood that data used in this manner are interchangeable where appropriate so that the embodiments of the present disclosure described herein can be implemented in an order not illustrated or described herein. In addition, the terms "including", "having", and any other variations thereof are intended to cover a non-exclusive inclusion. For example, a process, a method, a system, a product, or a device that includes a series of steps or units may include not only the expressly listed steps or units but also other steps or units that are not expressly listed or are inherent to the process, the method, the product, or the device.

As described in the background, the driver circuit of the display panel typically charges and discharges all pixels uniformly. Thus, all areas of the display panel are refreshed at the same rate. By lowering the refresh rate of the display panel, it is possible to reduce power consumption but fail to satisfy the smooth display requirements of a video. To achieve smooth video display, a high refresh rate is required for all areas of the display panel, inconducive to low power consumption of the display panel.

To solve this problem, embodiments of the present application provide a display panel. The display panel includes a driver circuit. The driver circuit includes N cascaded shift register units. N is positive integer. A shift register unit of the N shift register units includes an input module, a reset module, a refresh control module, and at least one output module. In the same shift register unit, the input module is configured to receive at least an input signal and a scan control signal and control a signal of a first node; the reset module is configured to receive at least a reset clock signal and the scan control signal and control a signal of a second node; the output module is configured to, within at least part of the working time period of the display panel, receive the signal of the first node, the signal of the second node, a first level signal, and an output clock signal and output a gate drive signal; and the refresh control module is configured to receive at least a first refresh control signal and a second refresh control signal, to control, according to the first refresh control signal, the time interval of the active level of the gate drive signal output by the shift register unit, and to control, according to the second refresh control signal, the time period of the inactive level of the gate drive signal output by the shift register unit. The time interval between an active pulse of the first refresh control signal and an active pulse of the second refresh control signal is $\Delta t$. $\Delta t > 0$.

This solution involves disposing a refresh control module in the shift register unit. When data signals required to be written to pixels in certain areas are continuously the same or similar across consecutive display frames, the time interval of active pulses of the gate drive signal output by some shift register units can be increased. Meanwhile, the time period during which the gate drive signal output by these shift register units remains at an inactive level can be extended. This reduces the frequency of an active pulse of the gate drive signal output by these shift register units, thereby lowering the refresh rate of pixels in these areas. Moreover, the time interval of an active pulse of the gate drive signal output by other shift register units as well as the time period during which the output gate drive signal remains at an inactive level may be different. This allows pixels in other areas to continue being refreshed at a high frequency. Thus, not only can the refresh rate of pixels in some areas be reduced, but the high refresh rate requirements for smooth display in other areas can also be satisfied. In this manner, on the premise that the display quality is ensured, the power consumption of the display panel is reduced. Additionally, an active pulse of the first refresh control signal and an active pulse of the second refresh control signal do not overlap and the time interval between them is greater than zero so that the first refresh control signal and the second refresh control signal are prevented from being at an active level at the same time period, and this prevents the refresh control module from becoming uncontrollable, thereby improving the reliability of the refresh control module and benefiting the display effect of the display panel.

The preceding is a core idea of the present application. Based on the embodiments of the present application, all other embodiments obtained by those of ordinary skill in the art are within the scope of the present application on the premise that no creative work is done. Technical solutions in the embodiments of the present disclosure are described clearly and completely hereinafter in conjunction with the drawings in the embodiments of the present disclosure.

FIG. 1 is a top view of a display panel according to embodiments of the present application. Referring to FIG. 1, the display panel 01 includes a driver circuit 10, multiple scan lines SL, multiple data lines DL, and multiple pixels P located in the display area AA. At least some of the pixels P in the same row can be electrically connected to the same scan line SL. At least some of the pixels P in the same column can be electrically connected to the same data line DL.

The driver circuit 10 includes N cascaded shift register units 20. N is a positive integer. The first-stage shift register unit 20 receives a start signal STV as an input signal INF. From the second stage onwards, the input signal INF of each stage shift register unit 20 comes from the previous stage of shift register unit 20, but not limited to the gate drive signal output by the previous stage of shift register unit 20. The gate drive signals output by the N shift register units 20 shift successively. The shift register unit 20 is electrically connected to at least one scan line SL to provide a gate drive signal for the scan line SL. When at an active level, the gate drive signal transmitted by the scan line SL can control the switch devices in the pixels P electrically connected to that scan line SL to turn on. This allows the pixels P electrically connected to that scan line SL to receive data signals transmitted by the data lines DL and display corresponding grayscale according to the data signals, thereby achieving refresh of the pixels P electrically connected to that scan line SL.

FIG. 1 illustrates that the driver circuit 10 is located in the non-display area NA outside the display area AA. However, in other feasible embodiments, the driver circuit 10 may also be located in the display area AA. Additionally, FIG. 1 illustrates the shift register units 20 located on the left side of the display area AA. In other feasible embodiments, the driver circuit 10 may be located on other sides of the display area AA or even on multiple sides such as two sides, three sides, or four sides of the display area AA. Embodiments of the present application do not limit the position of the driver circuit 10.

Figure 2:
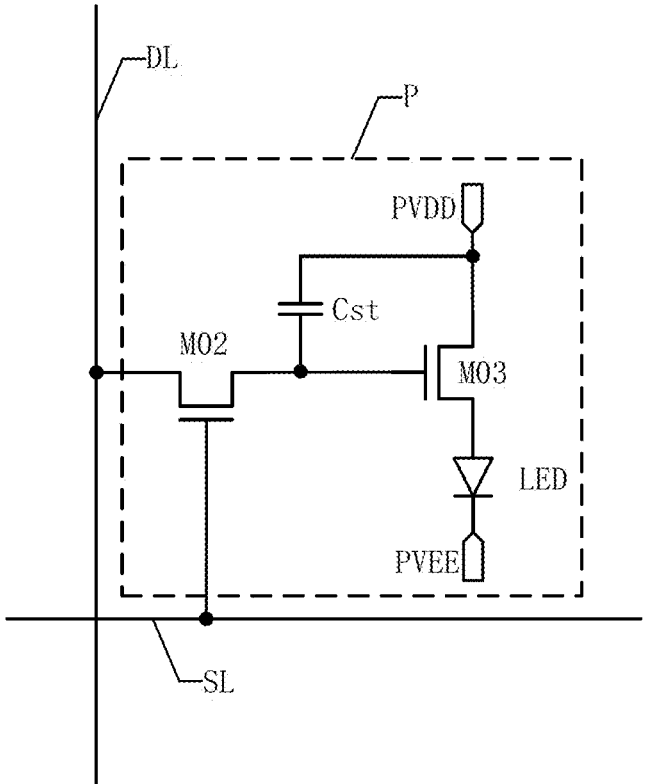
FIG. 2 is a circuit diagram of a pixel according to embodiments of the present application.
Figure 3:
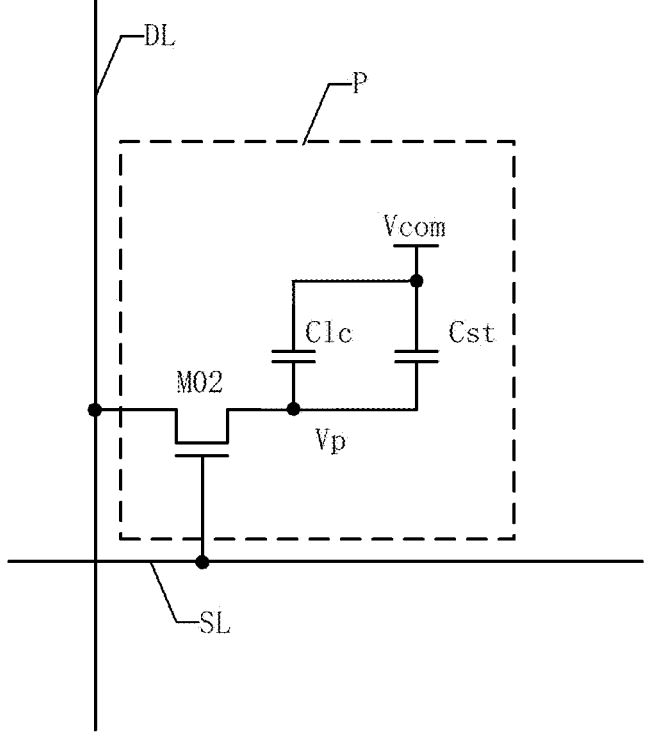
FIG. 3 is a circuit diagram of a pixel according to embodiments of the present application.

FIG. 2 and FIG. 3 are each a circuit diagram of a pixel according to embodiments of the present application. When the display panel 01 operates as an LED display, the pixel P may include a write transistor M02, a drive transistor M03, a storage capacitor Csr, and a light-emitting element LED. In this case, the pixel P receives a gate drive signal from the scan line SL, a data signal from the data line GL, a first power supply signal PVDD, and a second power supply signal PVEE. As shown in FIG. 2, controlled by the gate drive signal, the write transistor M02 may write the data signal into the gate of drive transistor M03. The drive transistor M03 then provides corresponding drive current to the light-emitting element LED based on the data signal, driving the LED to emit light. When the display panel 01 operates as an LCD display, the pixel P may include a write transistor M02, a liquid crystal capacitor Clc, a storage capacitor Cst, a pixel electrode Vp, and a common electrode Vcom. In this case, the pixel P receives a gate drive signal from the scan line SL, a data signal from the data line GL, and a common electrode signal. As shown in FIG. 3, controlled by the gate drive signal, the write transistor M02 may write the data signal into the pixel electrode Vp. The liquid crystal capacitor Clc stores the data signal at the pixel electrode Vp, forming an electric field between the pixel electrode Vp and the common electrode Vcom. This controls the rotation of liquid crystal molecules (not shown) to adjust the light flux.

FIG. 2 and FIG. 3 each illustrate the circuit structure of a pixel. In other feasible embodiments, the pixel P may also include additional components. Embodiments of the present application do not limit the type of display panel or the composition of the pixel P.

Figure 4:
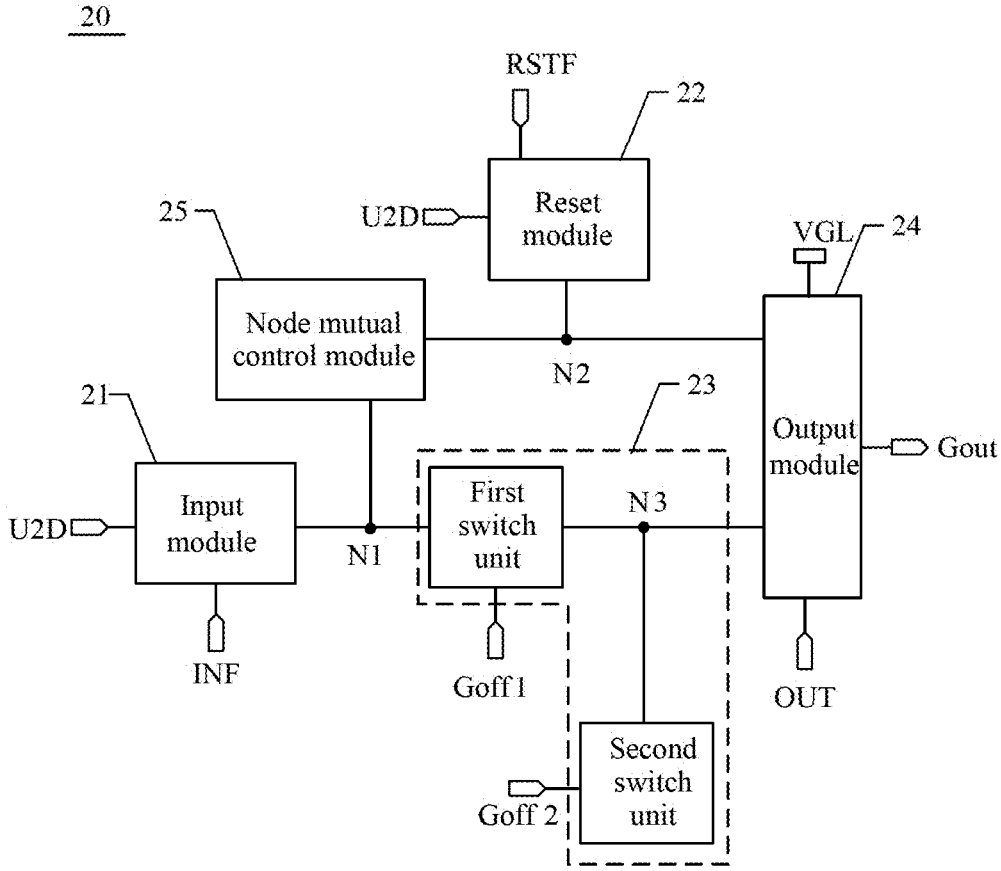
FIG. 4 is a diagram illustrating the structure of a shift register unit according to embodiments of the present application.
Figure 5:
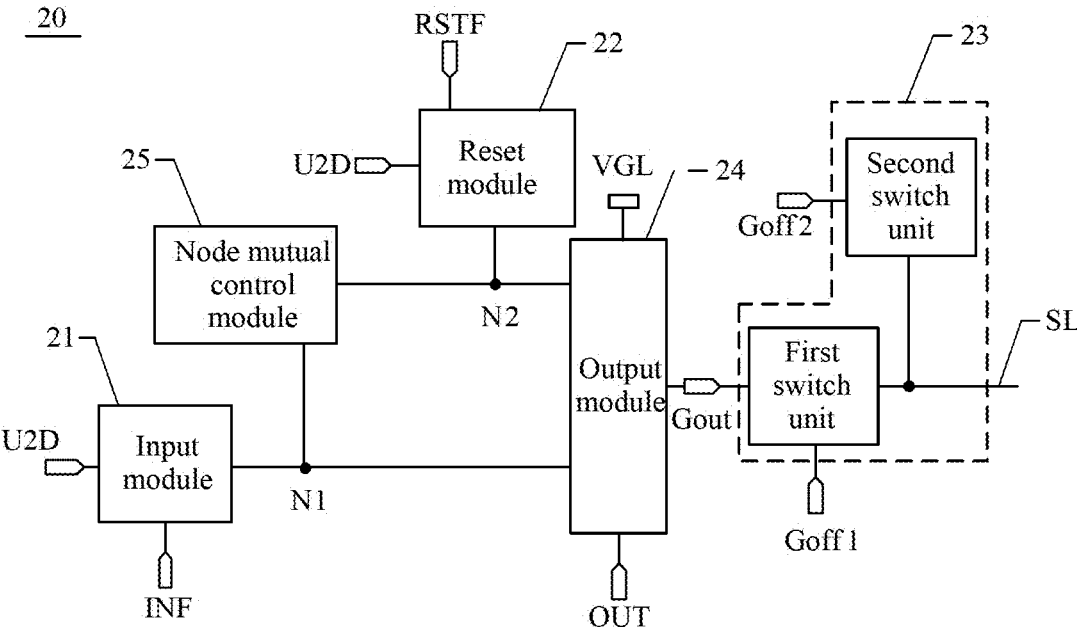
FIG. 5 is a diagram illustrating the structure of a shift register unit according to embodiments of the present application.

FIG. 4 and FIG. 5 are each a diagram illustrating the structure of a shift register unit according to embodiments of the present application. Referring to FIG. 4 and FIG. 5, the shift register unit 20 includes an input module 21, a reset module 22, a refresh control module 23, and at least one output module 24.

In the same shift register unit 20, the input module 21 is configured to receive at least an input signal INF and a scan control signal U2D and control a signal of a first node N1; the reset module 22 is configured to receive at least a reset clock signal RSTF and the scan control signal U2D and control a signal of a second node N2; the output module 24 is configured to, within at least part of the working time period of the display panel 01, receive the signal of the first node N1, the signal of the second node N2, a first level signal VGL, and an output clock signal OUT and output a gate drive signal Gout; and the refresh control module 23 is configured to receive at least a first refresh control signal Goff1 and a second refresh control signal Goff2, to control, according to the first refresh control signal Goff1, the time interval of the active level of the gate drive signal Gout output by the shift register unit 20, and to control, according to the second refresh control signal Goff2, the time period of the inactive level of the gate drive signal Gout output by the shift register unit 20. The time interval between an active pulse of the first refresh control signal Goff1 and an active pulse of the second refresh control signal Goff2 is $\Delta t$. $\Delta t > 0$.

In an embodiment, the input module 21 can control the signal of the first node N1 to be at an active level when both the input signal INF and the scan control signal U2D are at an active level. The reset module 22 can control the signal of the second node N2 to be at an active level when both the reset clock signal RSTF and the scan control signal U2D are at an active level. When the output module 24 can receive the signal from the first node N1 and the signal of the first node N1 is at an active level, the output module 24 can output the output clock signal OUT as the gate drive signal Gout. If at this stage, the output clock signal OUT is at an active level, and the gate drive signal Gout output by the output module 24 is also at an active level. When the output module 24 receives the signal of the second node N2 and the signal of the second node N2 is at an active level, the output module 24 can output the first level signal VGL as the gate drive signal Gout. At this time period, the gate drive signal Gout is at an inactive level. The refresh control module 23 can control the transmission path of the signal from the first node N1 to the output module 24, as shown in FIG. 4; or the refresh control module 23 can control the transmission path of the gate drive signal Gout output by the output module 24 to the scan line SL, as shown in FIG. 5, to control whether the shift register unit 20 can provide an active pulse of the gate drive signal Gout to the scan line SL.

When the first refresh control signal Goff1 is at an active level and the second refresh control signal Goff2 is at an inactive level, the refresh control module 23 is on. At this stage, if both the signal of the first node N1 and the clock signal OUT are at an active level, the shift register unit 20 can provide an active pulse of the gate drive signal Gout to the scan line SL. When the second refresh control signal Goff2 is at an active level and the first refresh control signal Goff1 is at an inactive level, the refresh control module 23 is off. At this stage, the shift register unit 20 cannot provide an active pulse of the gate drive signal Gout to the scan line SL, and the gate drive signal Gout provided for the scan line SL by the shift register unit 20 is at an inactive level.

$\Delta t > 0$. The first refresh control signal Goff1 and the second refresh control signal Goff2 cannot be at an active level simultaneously. This prevents the refresh control module 23 from being partially turned on or partially turned off, rendering uncontrollable the working state of the refresh control module 23, rendering uncontrollable the potential of the gate drive signal Gout output by the shift register unit 20, and thus affecting the display quality of the display panel 01.

Figure 6:
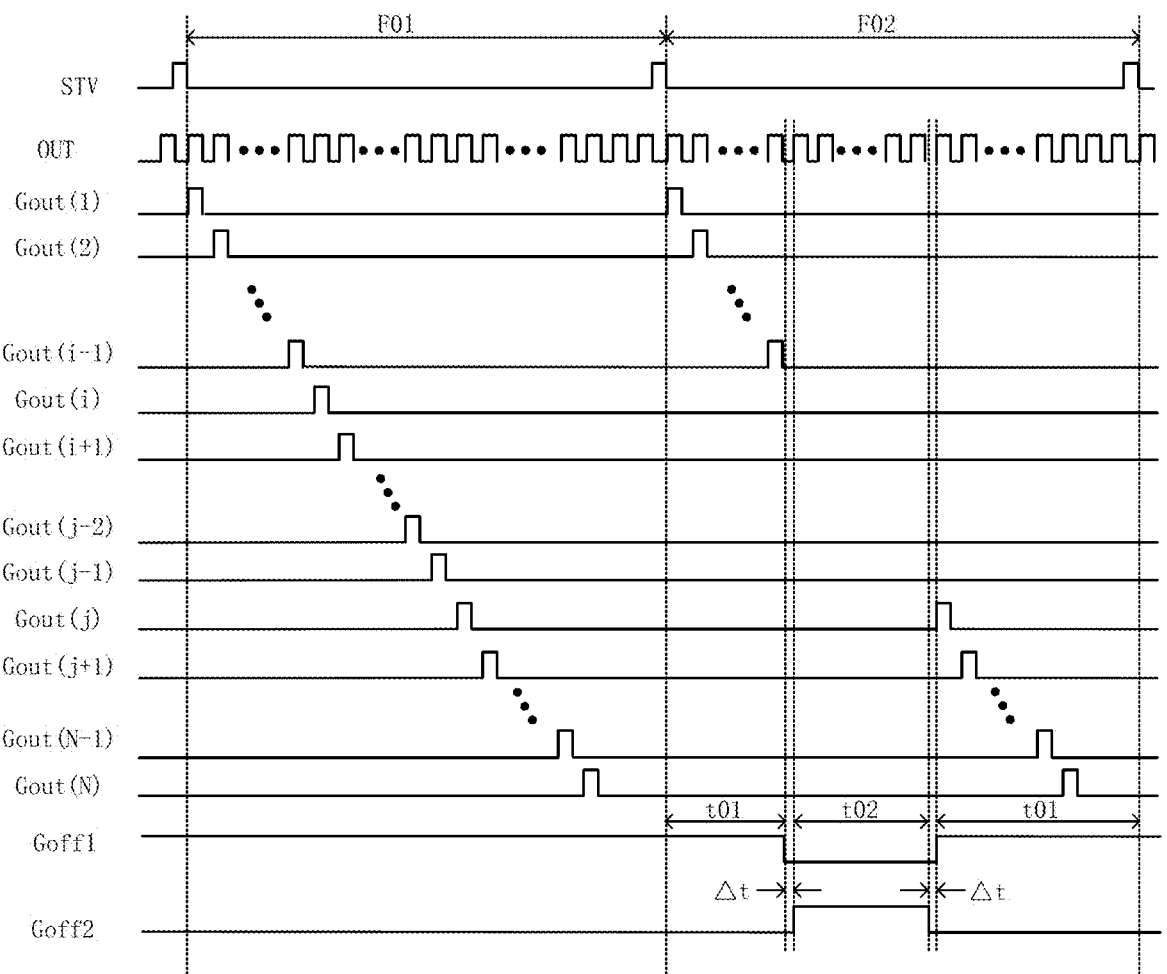
FIG. 6 is a timing diagram of a driver circuit according to embodiments of the present application.

For example, the active level is a high level, the inactive level is a low level, and the first level signal VGL is an inactive level. FIG. 6 is a timing diagram of a driver circuit according to embodiments of the present application. i<j<N. i, j, and N are each a positive integer. Referring to FIG. 1 and FIGS. 4 to 6, in the pixel refresh time period of a certain display frame of the display panel 01, for example, in the pixel refresh time period F01 of a single-frequency display frame, if the first refresh control signal Goff1 remains at an active level and the second refresh control signal Goff2 remains at an inactive level, the shift register unit 20 of the driver circuit 10 can provide an active pulse of the gate drive signal Gout to the scan line SL, ensuring that all pixels P refresh normally and their refresh rates do not change. Alternatively, if the second refresh control signal Goff2 remains at an active level and the first refresh control signal Goff1 remains at an inactive level (not shown), the shift register unit 20 of the driver circuit 10 cannot provide an active pulse of the gate drive signal Gout to the scan line SL. The time period during which the gate drive signal Gout provided for the scan line SL by the shift register unit 20 is at an inactive level is extended, resulting in a reduced refresh rate of all pixels P. The pixel refresh time period refers to the time period during which the data signal is written to the pixel P. The pixel refresh time period of a display frame refers to the time period taken to write data signals from the first row of pixels P to the last row of pixels P.

With continued reference to FIG. 1 and FIGS. 4 to 6, in the pixel refresh time period of another display frame of the display panel, for example, in the pixel refresh time period F02 of a multi-frequency display frame, at stage t01, if the first refresh control signal Goff1 is at an active level and the second refresh control signal Goff2 is at an inactive level, some shift register units 20 can provide active pulses of the gate drive signal Gout to the scan line SL, allowing some pixels P to refresh normally. In the pixel refresh time period of consecutive display frames, the time intervals at which these shift register units 20 output active levels of the gate drive signal Gout are small, ensuring that the refresh rate of these pixels P is not reduced. At stage t02, when the first refresh control signal Goff1 is inactive and the second refresh control signal Goff2 is active, some shift register units 20 cannot provide active pulses of the gate drive signal Gout to the scan line SL. In the pixel refresh time period F02 of a multi-frequency display frame, these shift register units 20 continuously provide an inactive-level gate drive signal Gout to the scan line SL, extending the time period during which these shift register units 20 output an inactive-level gate drive signal Gout, causing some pixels P to stop refreshing. In the pixel refresh time period of consecutive display frames, the time period during which these shift register units 20 output an inactive level gate drive signal Gout increases, resulting in a reduced refresh rate for these pixels P.

In the display mode including the preceding multi-frequency display frame, the time period during which some shift register units 20 output an inactive-level gate drive signal Gout is extended. Simultaneously, the time intervals between active-level gate drive signals Gout from these shift register units 20 increase. As a result, the shift register units 20 of the driver circuit 10 cannot provide active pulses of the gate drive signal Gout to the scan line SL at the same frequency. At this time period, the refresh rate of some pixels P decreases, achieving low-frequency refresh which is beneficial for reducing power consumption. At the same time period, the refresh rate of some other pixels P remains unchanged, allowing them to maintain their original refresh frequency to satisfy the smooth display requirements of video content in part of the display area AA.

In an optional embodiment, with continued reference to FIG. 1 and FIGS. 4 to 6, the display panel 01 also includes a first refresh control line GL1 and a second refresh control line GL2. The first refresh control line GL1 is configured to transmit the first refresh control signal Goff1, while the second refresh control line GL2 is configured to transmit the second refresh control signal Goff2. At least some shift register units 20 in the driver circuit 10 are electrically connected to the first refresh control line GL1, and at least some shift register units 20 in the driver circuit 10 are electrically connected to the second refresh control line GL2.

In an embodiment, in the driver circuit 10, some shift register units 20 are equipped with a refresh control module 23. In an embodiment, only some of the shift register units 20 are electrically connected to the first refresh control line GL1, and these shift register units 20 are also connected to the second refresh control line GL2.

For example, in the driver circuit 10, shift register units 20 that are electrically connected to pixels P in the middle area of the display area AA do not have a refresh control module 23. However, shift register units 20 that are electrically connected to pixels P in the upper and lower border areas of the display area AA are equipped with a refresh control module 23. In the pixel refresh time period of any display frame, shift register units 20 with no refresh control module 23 can all output an active pulse of the gate drive signal Gout. This enables pixels P in the middle area to achieve a higher refresh rate, satisfying the requirements for smooth video display. In the pixel refresh time period of a single-frequency display frame, the first refresh control signal Goff1 can remain active, and the second refresh control signal Goff2 can remain inactive, allowing pixels P in the upper and lower border areas to refresh normally. In the pixel refresh time period of a multi-frequency display frame, the first refresh control signal Goff1 can remain inactive, and the second refresh control signal Goff2 can remain active (not shown). This allows only the shift register units 20 equipped with a refresh control module 23 to control the gate drive signal Gout, ensuring that in the pixel refresh time period of a multi-frequency display frame, the gate drive signal Gout remains inactive. This lowers the refresh rate of pixels P in the upper and lower border areas.

In this embodiment, the refresh control module 23 is disposed in the shift register units 20 that are electrically connected to pixels P in the areas where low-frequency refresh is desired. In the areas where high-frequency refresh is required, the shift register units 20 have no refresh control module 23. This configuration serves several purposes: On one hand, in the pixel refresh time period of multi-frequency display frame, the first refresh control signal Goff1 and the second refresh control signal Goff2 can remain at a consistent level, allowing for low-frequency refresh of some pixels P. This helps reduce the frequency of voltage amplitude changes on the first refresh control line GL1 and the second refresh control line GL2, contributing to lower power consumption of the display panel 01. On the other hand, by connecting the first refresh control line GL1 and the second refresh control line GL2 to only some shift register units 20, the overall load on these lines is reduced. This reduction in load contributes to lowering the power consumption of the display panel 01. Additionally, the lighter load on the first refresh control line GL1 and the second refresh control line GL2 helps minimize signal delay of the first refresh control signal Goff1 and the second refresh control signal Goff2. This enhances the response speed of the refresh control module 23. In this case, the time interval Δt between the active pulse of the first refresh control signal Goff1 and the active pulse of the second refresh control signal Goff2 can be set relatively small, ensuring that Δt>0.

In another embodiment, a refresh control module 23 is disposed in each of shift register units 20 of the driver circuit 10. In other words, in the driver circuit 10, all shift register units 20 are electrically connected to the first refresh control line GL1 and to the second refresh control line GL2.

For example, the pixel refresh time period of a display frame includes the pixel refresh time period of the first row of pixels P, the pixel refresh time period of the second row of pixels P, . . . , and the pixel refresh time period of the Nth row of pixels P. In the pixel refresh time period of a multi-frequency display frame, in the pixel refresh time period of one or multiple rows of pixels P that require high-frequency refresh, the first refresh control signal Goff1 is set to an active level, while the second refresh control signal Goff2 is set to an inactive level. For example, as shown in FIG. 6, if the first to (i–1)th rows and the jth to Nth rows of pixels P require high-frequency refresh, then in the pixel refresh time period of these rows, it is required to control the first refresh control signal Goff1 to be at an active level and the second refresh control signal Goff2 to be at an inactive level. Stage t01 includes the pixel refresh time period of the first to (i–1)th rows and the jth to Nth rows of pixels P. At stage t01 of the pixel refresh time period F02 of the multi-frequency display frame, the first refresh control signal Goff1 is at an active level, and the second refresh control signal Goff2 is at an inactive level.

Similarly, in the pixel refresh time period of one or multiple rows of pixels P that require low-frequency refresh, the first refresh control signal Goff1 is set to an inactive level, while the second refresh control signal Goff2 is set to an active level. For example, as shown in FIG. 6, if the ith to (j–1)th rows of pixels P require low-frequency refresh, then in the pixel refresh time period of these rows, it is required to control the first refresh control signal Goff1 to be at an inactive level and the second refresh control signal Goff2 to be at an active level. Stage t02 includes the pixel refresh time period of the ith to (j–1)th rows of pixels P. At stage t02 of the pixel refresh time period F02 of the multi-frequency display frame, the first refresh control signal Goff1 is at an inactive level, and the second refresh control signal Goff2 is at an active level.

In this embodiment, a refresh control module 23 is disposed in each of register units 20. By controlling the time period during which the first refresh control signal Goff1 is active and the time period during which the second refresh control signal Goff2 is active, it is possible to adjust the refresh frequency of any single or multiple rows of pixels P, thereby achieving adjustment of the refresh frequency for all areas of the display panel 01. Meanwhile, the first refresh control line GL1 and the second refresh control line GL2 have a significant load, which may affect the signal delay of the first refresh control signal Goff1 and the second refresh control signal Goff2, resulting in longer transition time period for Goff1 and Goff2. To ensure that the refresh control module 23 does not receive active pulses from Goff1 and Goff2 simultaneously, a larger time interval Δt between the active pulses of Goff1 and Goff2 is set, for example, Δt≥100 ns. This prevents the refresh control module 23 from malfunctioning.

This solution of embodiments of the present application involves disposing a refresh control module in the shift register unit. When data signals required to be written to pixels in certain areas are continuously the same or similar across consecutive display frames, the time interval of the active pulse of the gate drive signal output by some shift register units may be increased. Meanwhile, the time period during which the gate drive signal output by these shift register units remains at an inactive level may be extended. This reduces the frequency of the active pulse of the gate drive signal output by these shift register units, thereby lowering the refresh rate of pixels in these areas. Moreover, the time interval of the active pulse of the gate drive signal output by other shift register units as well as the time period during which the output gate drive signal remains at an inactive level may be different. This allows pixels in other areas to continue being refreshed at a high frequency. Thus, not only can the refresh rate of pixels in certain areas be reduced, but the high refresh rate requirements for smooth display in other areas can also be satisfied. This ensures the display quality while reducing the power consumption of the display panel. Additionally, the active pulse of the first refresh control signal and that of the second refresh control signal do not overlap and the time interval between them is greater than zero so that the first refresh control signal and the second refresh control signal are prevented from being at an active level at the same time period. This prevents the refresh control module from becoming uncontrollable, thereby improving the reliability of the refresh control module and benefiting the display effect of the display panel.

Optionally, referring to FIGS. 4 and 5, the shift register unit 20 also includes a node mutual control module 25. The node mutual control module 25 is configured to receive at least the signal of the first node N1 and the signal of the second node N2, to control the signal of the second node N2 according to the signal of the first node N1, and to control the signal of the first node N1 according to the signal of the second node N2.

In an embodiment, when the signal of the first node N1 is active, the node mutual control module 25 can control the signal of the second node N2 to be inactive. When the signal at the second node N2 is active, the node mutual control module 25 can control the signal of the first node N1 to be inactive. Therefore, this ensures that the signal of the first node N1 and the signal of the second node N2 mutual control each other. The signal of the first node N1 and the signal of the second node N2 cannot be active at the same time period, advantageous for maintaining the orderly operation of the shift register units 20. This improves the accuracy and stability of the gate output signal Gout from the shift register unit 20. This prevents the signal of the first node N1 and the signal of the second node N2 from being active at the same time period. If the output module 24 outputs the first level signal VGL and the output clock signal OUT as the gate output signal Gout simultaneously, the shift register unit 20 may experience significant bias in the gate drive signal Gout. This affects the conductivity of the switch device in pixel P, leading to inaccurate data signals written into pixel P and low display quality.

Figure 7:
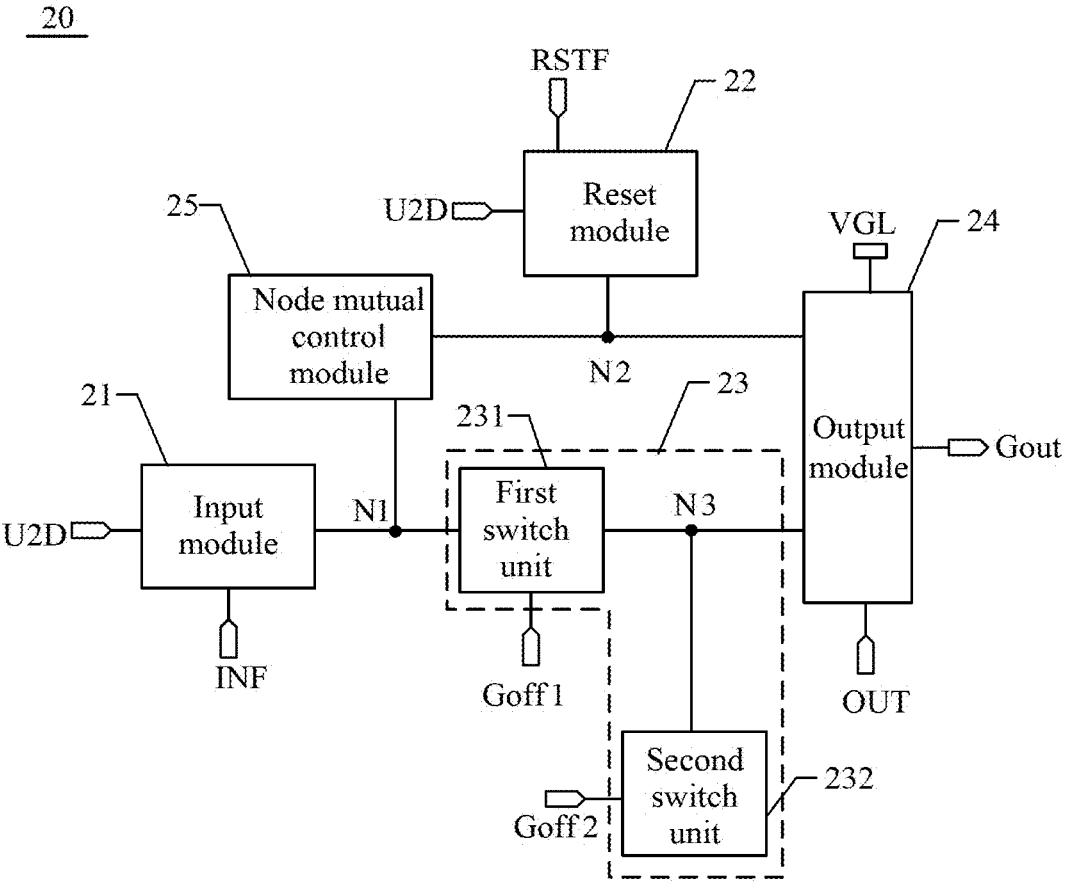
FIG. 7 is a diagram illustrating the structure of a shift register unit according to embodiments of the present application.

Optionally, FIG. 7 is a diagram illustrating the structure of a shift register unit according to embodiments of the present application. Referring to FIG. 7, the refresh control module 23 includes a first switch unit 231 and a second switch unit 232. The first switch unit 231 is configured to receive at least the signal of the first node N1 and the first refresh control signal Goff1 and control a transmission path for transmission of the signal of the first node N1 to a third node N3 to control a time interval during which the third node N3 is at an active level. The second switch unit 232 is configured to receive at least the first level signal VGL and the second refresh control signal Goff2 and control a time period during which the third node N3 is at an inactive level. The output module 24 is configured to receive at least a signal of the third node N3, to control the output clock signal OUT to be output as the gate drive signal Gout when the signal of the third node N3 is at an active level, and to control the first level signal VGL to be output as the gate drive signal when the signal of the second node N2 is at an active level.

The control terminal of the first switch unit 231 receives a first refresh control signal Goff1. The control terminal of the second switch unit 232 receives a second refresh control signal Goff2. The output terminal of the input module 21 is electrically connected to the input terminal of the first switch unit 231 at the first node N1. The input terminal of the second switch unit 232 receives a first level signal VGL. The output terminal of the first switch unit 231, the output terminal of the second switch unit 232, and the first control terminal of the output module 24 are electrically connected to the third node N3. The first input terminal of the output module 24 receives an output clock signal OUT from the input module 21. The output terminal of the reset module 22 is electrically connected to the second control terminal of the output module 24 at the second node N2. The second input terminal of the output module 24 receives a first level signal VGL. The output terminal of the output module 24 is electrically connected to the output terminal of the shift register unit 20. The output terminal of the shift register unit 20 is electrically connected to the scan line SL. In other words, the gate drive signal Gout output from the output terminal of the output module 24 is the gate drive signal Gout provided for the scan line SL by the shift register unit 20.

Figure 8:
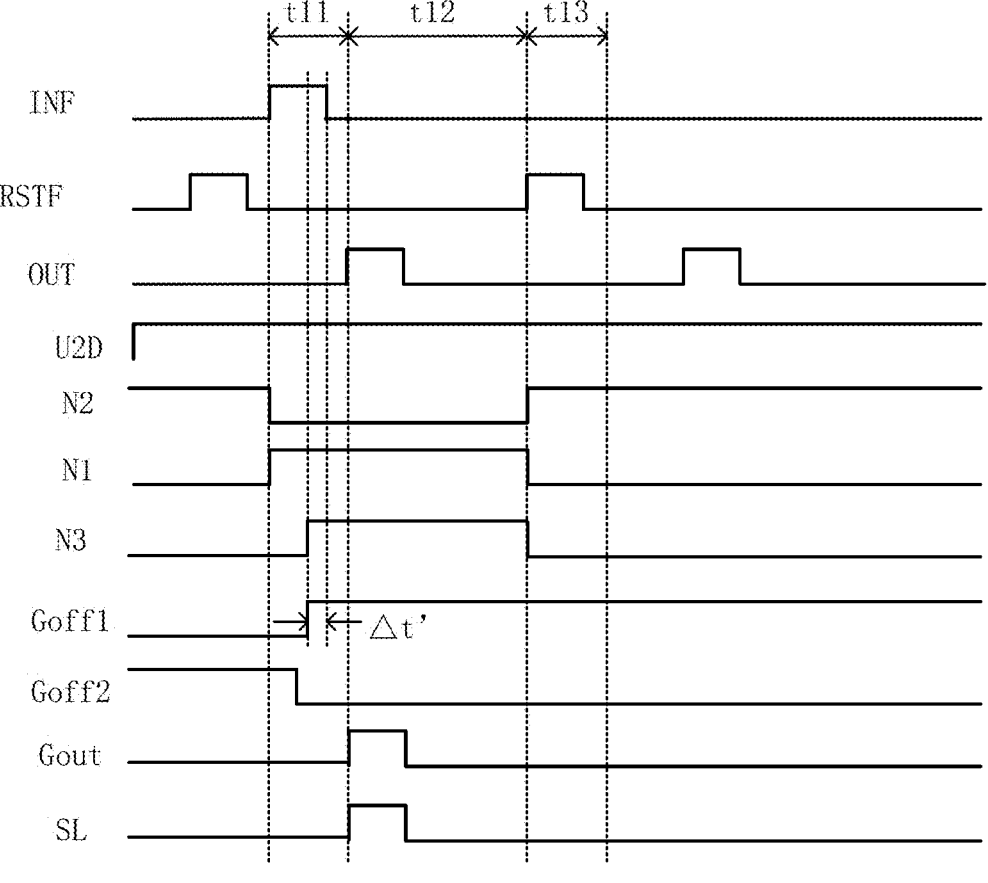
FIG. 8 is a timing diagram of a shift register unit according to embodiments of the present application.

For example, the active level is a high level, the inactive level is a low level, and the first level signal VGL is an inactive level. FIG. 8 is a timing diagram of a shift register unit according to embodiments of the present application. Referring to FIG. 7 and FIG. 8, at stage t11, both the input signal INF and the scan control signal U2D are at an active level. The input module 21 can output a high-level signal, making the signal of the first node N1 be at a high level. Under the control of the signal of the first node N1, the node control module 25 can control the signal of the second node N2 to be at a low level. Meanwhile, the reset clock signal RSTF is at a low level, the reset module 22 cannot output a high-level signal, and the signal of the second node N2 remains at a low level.

At stage t11, when the first refresh control signal Goff1 is at a low level, the first switch unit 231, under the control of Goff1, can interrupt the signal transmission path from the first node N1 to the third node N3. As a result, the third node N3 cannot receive the signal of the first node N1, thereby increasing the time interval of the active level of the third node N3. Meanwhile, if the second refresh control signal Goff2 is at a high level, the second switch unit 232, controlled by Goff2, can transmit the low level of the first level signal VGL to the third node N3, thereby increasing the time period during which the third node N3 remains in an inactive level. Additionally, the first control terminal of the output module 24 can receive the low level of the first level signal VGL through the second switch unit 232. This prevents the output module 24 from outputting the clock signal OUT as the gate drive signal Gout, thereby increasing the time period during which the gate drive signal Gout from output module 24 remains in an inactive level.

At stage t11, when the first refresh control signal Goff1 is at a high level, the first switch unit 231, under the control of Goff1, can establish a transmission path for signal from the first node N1 to the third node N3. This allows the third node N3 to receive the high-level signal from the first node N1. At this time period, the signal of the third node N3 corresponds to the high-level signal from the first node N1, thereby reducing the time interval at which the third node N3 remains at an active level. Meanwhile, when the second refresh control signal Goff2 is at a low level, the second switch unit 232, controlled by Goff2, interrupts the transmission path of the first level signal VGL to the third node N3. This prevents the inactive level of the first level signal VGL from being transmitted to the third node N3. Additionally, the first control terminal of output module 24 can receive the high-level signal from the first node N1 through the first switch unit 231. This allows the output module 24 to output the clock signal OUT as the gate drive signal Gout.

At stage t12, the input signal INF and the reset clock signal RSTF are both at a low level. The signal of the first node N1 remains at a high level, and the signal of the second node N2 remains at a low level. Meanwhile, the first refresh control signal Goff1 remains at a high level, and the second refresh control signal Goff2 remains at a low level. This allows the signal of the third node N3 to remain at a high level. At this stage, the output module 24 can continue outputting the clock signal OUT as the gate drive signal Gout. Stage t12 includes the active time period of the output clock signal OUT, enabling the output module 24 to output an active pulse of the gate drive signal Gout at t12. This means that the scan line SL electrically connected to the shift register unit 20 can also receive an active pulse of the gate drive signal Gout at t12.

At stage t13, the reset clock signal RSTF and the scan control signal U2D are both at a high level. The reset module 22 can output a high-level signal, causing the signal of the second node N2 to be at a high level. The node control module 25, under the control of the signal at the second node N2, controls the signal of the first node N1 to be at a low level. Meanwhile, the input signal INF is at a low level, preventing the input module 21 from outputting a high-level signal, and the signal of the first node N1 is at a low level. The second control terminal of the output module 24 can receive the high-level signal from the second node N2, allowing the output module 24 to output the low level of the first level signal VGL as the gate drive signal Gout.

At stage t13, the first refresh control signal Goff1 remains at a high level, and the first switch unit 231 can control the signal of the third node N3 to be at a low level of the first node N1. At this time period, the first control terminal of the output module 24 receives a low-level signal, the output module 24 stops outputting the clock signal OUT as the gate drive signal Gout, and regardless of whether the output clock signal OUT is at a high level or at a low level, the output module 24 outputs the low level of the first level signal VGL as the gate drive signal Gout.

After stage t13, the input signal INF continues remaining at a low level. The reset clock signal RSTF alternates between high and low levels, causing the signal of the second node N2 to remain at a high level and the signal of the first node N1 to remain at a low level. The gate drive signal Gout output by the output module 24 continues remaining at a low level. This condition persists until the input signal INF changes back to a high level. Only when the input signal INF changes back to a high level, does the signal of the first node N1 change to a high level. Only under the influence of both the first switch unit 231 and the second switch unit 232, can the gate drive signal Gout change to a high level.

Based on the previous embodiments, with continued reference to FIG. 7 and FIG. 8, before the shift register unit 20 outputs an active pulse of the gate drive signal Gout, the overlap time period Δt' between the active pulse time period of the first refresh control signal Goff1 and the active pulse time period of the input signal INF received by the input module 21 is greater than zero (Δt'>0).

In an embodiment, before the shift register unit 20 outputs an active pulse of the gate drive signal Gout, the first refresh control signal Goff1 transitions to its active level. This allows the active level of the first node N1 to be transmitted to the third node N3. Consequently, the first control terminal of output module 24 can receive the active level of the first node N1, and the output module 24 can output an active pulse of the output clock signal OUT as an active pulse of the gate drive signal Gout. The input signal INF and the scan control signal U2D are both an active signal provided by a driver chip. During the active pulse time period of the input signal INF, the input module 21 can transmit either the input signal INF or the scan control signal U2D to the first node N1. At this stage, the signal of the first node N1 is also an active signal. At this stage, if the first refresh control signal Goff1 is active, the active signal of the first node N1 can transfer enough charge to the third node N3 to change its potential. This allows the signal of the third node N3 to reach the expected active level.

For example, the active level is a high level, the inactive level is a low level, and the first level signal VGL is an inactive level. With continued reference to FIG. 7 and FIG. 8, at stage t11, when the input signal INF and the scan control signal U2D are both at a high level, the input module 21 is on. The input signal INF or the scan control signal U2D can be transmitted to the first node N1. The signal of the first node N1 is high and active. Meanwhile, the first refresh control signal Goff1 is also at a high level, and the first switch unit 231, under the control of Goff1, can establish a transmission path for the signal from the first node N1 to the third node N3. At this time period, the first node N1 has enough charge to raise the potential at the third node N3, allowing the high-level signal from the first node N1 to be accurately transmitted to the third node N3. This enables effective control of the output module 24 to output the clock signal OUT as the gate drive signal Gout.

Assuming that the (j−1)th row of pixels P require low-frequency refresh and the jth row of pixels P require high-frequency refresh, as shown in FIG. 6, then before the input signal INF received by the shift register unit 20 connected to jth row of pixels P transitions to a low level, the first refresh control signal Goff1 must transition to a high level. This ensures that when the signal of the first node N1 of the shift register unit 20 is at an active level, the potential of the third node N3 can be raised to a high level so that the accuracy of the potential of the third node N3 is increased, preventing the scenario where the transmission path from the first node N1 to the third node N3 is made conductive when the signal of the first node N1 becomes floating after the input signal INF transitions to a low level. In this case, although the potential of the first node N1 can still remain high, since the signal of the first node N1 is inactive, no sufficient charge can raise the potential of the third node N3, and the potential of the third node N3 may not be raised to the expected high level. This may affect the gate drive signal Gout output by the output module 24, leading to inaccuracy in the gate drive signal Gout on the scan line SL. As a result, the switch device in the pixel P may be not fully turned on, preventing accurate data signal writing and affecting the display quality.

In an optional embodiment, Δt'≥half of the active pulse width of the input signal INF.

In an embodiment, before the shift register unit 20 outputs an active pulse of the gate drive signal Gout, the time period during which both the first refresh control signal Goff1 and the input signal INF received by input module 21 of the shift register unit 20 are at an active level is at least half of the active pulse width of the input signal INF. This ensures that the active signal of the first node N1 has enough time period to transfer charge to the third node N3, thereby altering the third node N3 and making the signal of the third node N3 achieve the expected active level.

In another optional embodiment, Δt'≥650 ns.

In an embodiment, before the shift register unit 20 outputs an active pulse of the gate drive signal Gout, the time period during which both the first refresh control signal Goff1 and the input signal INF received by input module 21 are at an active level is at least 650 ns. This time period ensures that the active signal of the first node N1 has enough time period to transfer charge to the third node N3, thereby altering the third node N3 and making the signal of the third node N3 achieve the expected active level.

Figure 9:
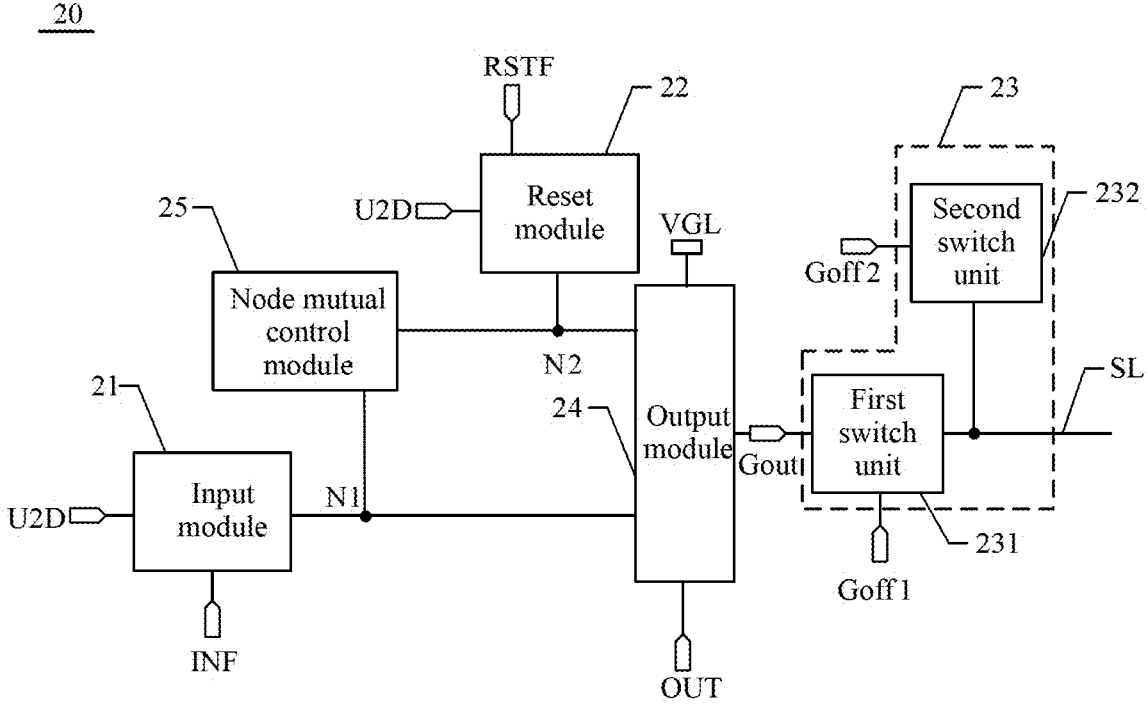
FIG. 9 is a diagram illustrating the structure of a shift register unit according to embodiments of the present application.

Optionally, FIG. 9 is a diagram illustrating the structure of a shift register unit according to embodiments of the present application. Referring to FIG. 9, the refresh control module 23 includes a first switch unit 231 and a second switch unit 232. The first switch unit 231 is configured to receive at least the gate drive signal Gout output by the output module 24 and the first refresh control signal and control the output time period of the active level of the gate drive signal Gout. The second switch unit 232 is configured to receive at least the first level signal VGL and the second refresh control signal Goff2 and control the time period during which the gate drive signal Gout output by the shift register unit 20 is at an inactive level.

The output time period of the active level of the gate drive signal Gout refers to the time period during which the gate drive signal Gout provided for the scan line SL by the shift register unit 20 is at an active level.

The output terminal of the input module 21 and the first control terminal of the output module 24 are electrically connected to the first node N1. The first input terminal of the output module 24 receives an output clock signal OUT. The output terminal of the reset module 22 and the second control terminal of the output module 24 are electrically connected to the second node N2. The second input terminal of the output module 24 receives a first level signal VGL. The output terminal of the output module 24 is electrically connected to the input terminal of the first switch unit 231. The output terminal of the first switch unit 231 is electrically connected to the output terminal of the shift register unit 20. The control terminal of the first switch unit 231 receives a first refresh control signal Goff1. The input terminal of the second switch unit 232 receives a first level signal VGL. The output terminal of the second switch unit 232 is also electrically connected to the output terminal of the shift register unit 20. The control terminal of the second switch unit 232 receives a second refresh control signal Goff2. The output terminal of the shift register unit 20 is electrically connected to the scan line SL.

For example, when the first refresh control signal Goff1 is at an active level, the second refresh control signal Goff2 is at an inactive level, the first switch unit 231 can transmit the gate drive signal Gout output by the output module 24 to the output terminal of the shift register unit 20, and the second switch unit 232 cannot transmit the first level signal VGL to the output terminal of the shift register unit 20 so that the gate drive signal Gout provided for the scan line SL by the shift register unit 20 is the same as the gate drive signal Gout output by the output terminal of the output module 24. In this case, if the gate drive signal Gout output by the output module 24 is at an active level, the gate drive signal Gout provided for the scan line SL by the shift register unit 20 is also at an active level. The output time period of the active level of the gate drive signal Gout is the time period during which the gate drive signal Gout output by the output module 24 and the first refresh control signal Goff1 are both at an active level.

When the second refresh control signal Goff2 is at an active level, the first refresh control signal Goff1 is at an inactive level, the second switch unit 232 can transmit the first level signal VGL to the output terminal of the shift register unit 20, and the first switch unit 232 stop transmitting the gate drive signal Gout output by the output module 24 to the output terminal of the shift register unit 20 so that the gate drive signal Gout provided for the scan line SL by the shift register unit 20 is constantly the inactive level of the first level signal VGL. In this case, no matter the gate drive signal Gout output by the output module 24 is at an active level or not, the gate drive signal Gout provided for the scan line SL by the shift register unit 20 is at an inactive level. The time period during which the gate drive signal Gout output by the shift register unit 20 is at an inactive level is the time period during which the gate drive signal Gout output by the output module 24 is at an inactive level plus the time period during which the gate drive signal Gout output by the output module 24 and the second refresh control signal Goff2 are both at an active level.

Figure 10:
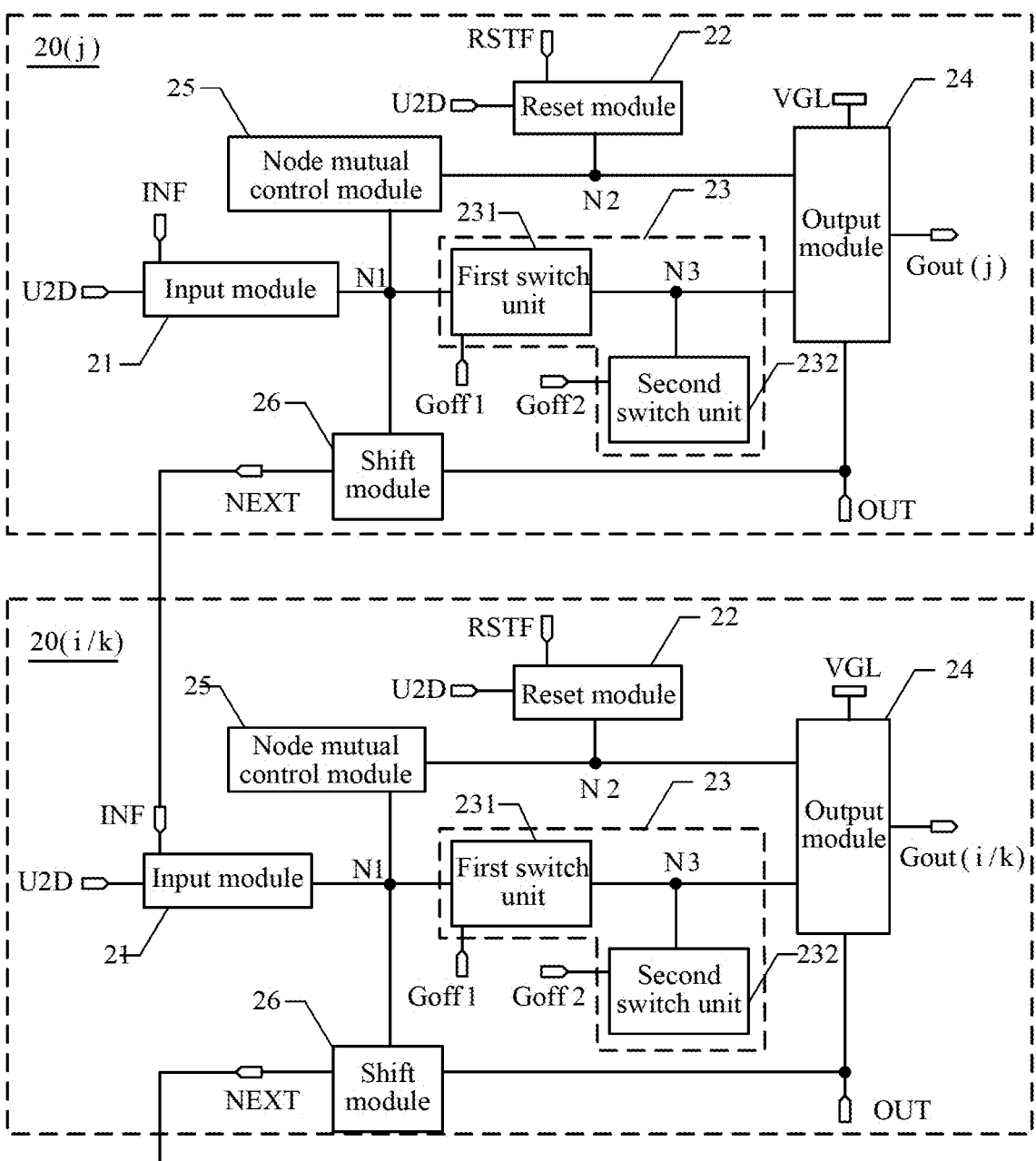
FIG. 10 is a diagram illustrating the structure of a driver circuit according to embodiments of the present application.

FIG. 10 is a diagram illustrating the structure of a driver circuit according to embodiments of the present application. Optionally, referring to FIG. 10, the shift register unit 20 also includes a shift module 26. In the jth-stage shift register unit 20 (j), the shift module 26 is configured to receive at least the signal of the first node N1 and the output clock signal OUT and control, according to the signal of the first node N1, the transmission path for transmission of the output clock signal OUT as a shift input signal NEXT to the input module 21 of the ith-stage and/or kth-stage shift register unit 20 (i/k). i, j, and k are each a positive integer. 1≤i<j<k≤N.

The control terminal of the shift module 26 is electrically connected to the first node N1. The input terminal of the shift module 26 receives an output clock signal OUT. The output terminal of the shift module 26 is electrically connected to the input module 21 of the ith-stage and/or kth-stage shift register unit 20 (i/k). The signal of the first node N1 is not affected by the working state of the output module 24. That is, regardless of what level is the signal output by the output module 24 and regardless of whether the jth-stage shift register unit 20 (j) can provide an active level of the gate drive signal Gout (j) for the scan line SL (j), the shift module 26 is not affected in outputting the shift input signal NEXT as the input signal INF to the ith-stage and/or kth-stage shift register unit 20 (i/k). This allows the ith-stage and/or kth-stage shift register unit 20 (i/k) to output an active or inactive level of the gate drive signal Gout (i/k) according to the received input signal INF, the first refresh control signal Goff1, and the second refresh control signal Goff2. When the output terminal of the shift module 26 is electrically connected to the input module 21 of the ith-stage shift register unit 20 (i), the shift register units 20 are cascaded in reverse order, that is, the input signal INF received by the input module 21 of the shift register unit 20 comes from the next stage of shift register unit 20, and the driver circuit 10 can perform reverse scanning of the display panel 01, for example, control rows of pixels P to refresh successively from bottom to top. When the output terminal of the shift module 26 is electrically connected to the input module 21 of the kth-stage shift register unit 20 (k), the shift register units 20 are cascaded in forward order, that is, the input signal INF received by the input module 21 of the shift register unit 20 comes from the previous stage of shift register unit 20, and the driver circuit 10 can perform forward scanning of the display panel 01, for example, control rows of pixels P to refresh successively from top to bottom. The output terminal of the shift module 26 can also be electrically connected to both the input module 21 of the ith-stage shift register unit 20 (i) and the input module 21 of the kth-stage shift register unit 20 (k). In this case, the shift register units 20 can be cascaded in forward order or in reverse order. The cascading direction of the shift register units 20 can be controlled by the scan control signal U2D.

Figure 11:
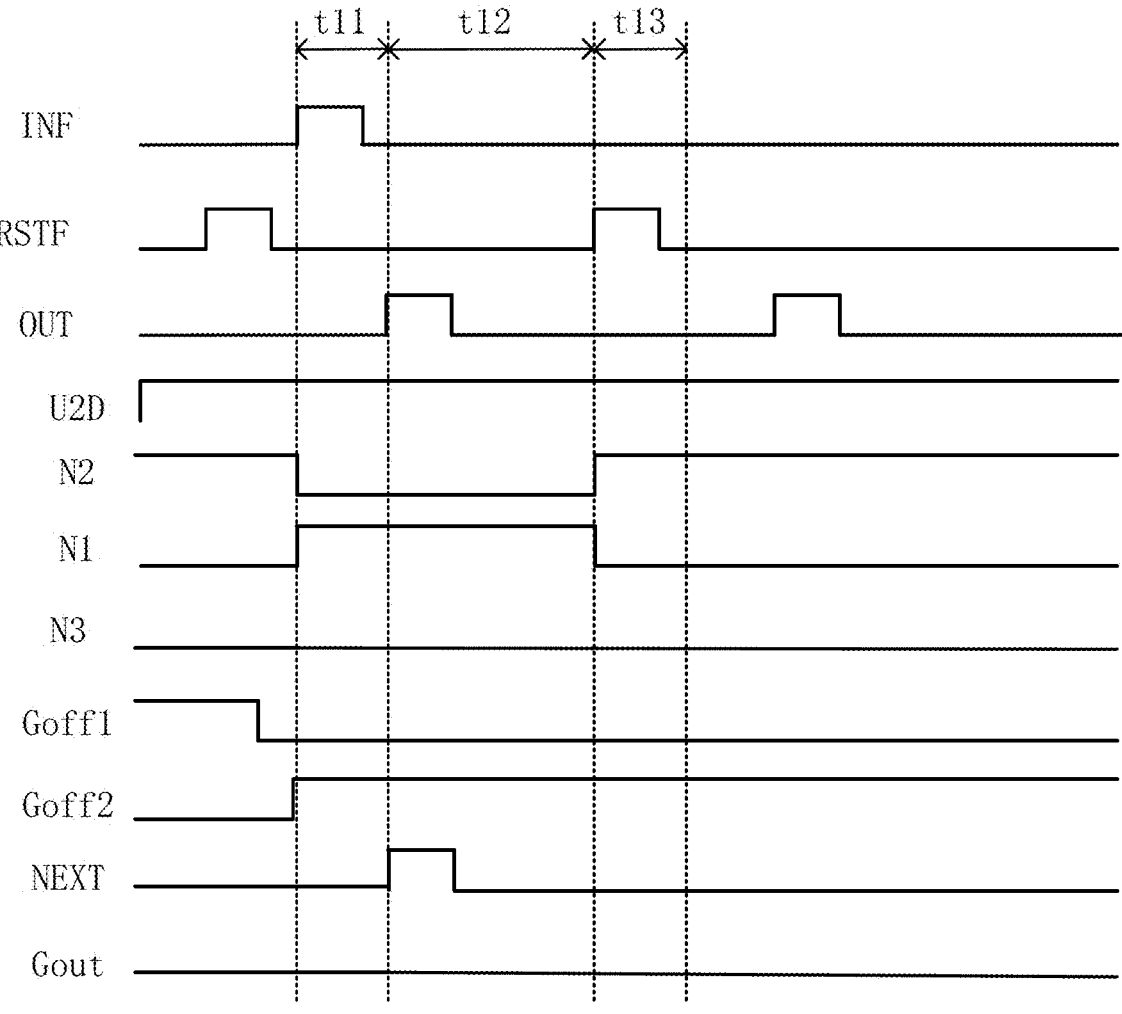
FIG. 11 is a timing diagram of a shift register unit according to embodiments of the present application.

For example, the active level is a high level, the inactive level is a low level, and the first level signal VGL is an inactive level. FIG. 11 is a timing diagram of a shift register unit according to embodiments of the present application. Referring to FIG. 10 and FIG. 11, in the jth-stage shift register unit 20 (j), at stage t11, the input signal INF and the scan control signal U2D are both at a high level, the reset clock signal RSTF is at a low level, the input module 21 can output a high-level signal, and the reset module 22 cannot output a high-level signal so that the signal of the first node N1 is a high-level signal, the signal of the second node N2 is a low-level signal, and the shift module 26 turns on under the control of the high-level signal of the first node N1. At this time period, the shift module 26 can output the clock signal OUT to the input module 21 of the ith-stage and/or kth-stage shift register unit 20 (i/k). Meanwhile, the first refresh control signal Goff1 is at a low level, the second refresh control signal Goff2 is at a high level, the refresh control module 23 is off, and the high-level signal of the first node N1 cannot be transmitted to the third node N3 so that the signal of the third node N3 is a low-level signal, and the output module 24 cannot receive the high-level signal of the first node N1 and cannot output the clock signal OUT as the gate drive signal Gout.

At stage t12, the input signal INF and the reset clock signal RSTF are both at a low level, the first refresh control signal Goff1 remains at a low level, the second refresh control signal Goff2 remains at a high level, the signal of the first node N1 remains at a high level, and the signal of the second node N2 and the signal of the third node N3 remain at a low level. At this stage, the shift module 26 may continue outputting the clock signal OUT to the input module 21 of the ith-stage and/or kth-stage shift register unit 20 (i/k). Stage t12 includes the active time period of the output clock signal OUT, allowing the shift module 26 to provide an active pulse of the output clock signal OUT as an active pulse of the shift input signal NEXT to the input module 21 of the ith-stage and/or kth-stage shift register unit 20 (i/k) at stage t12, enabling cascading of the shift register units 20 by progressively shifting and outputting the input signals INF received by the input modules 21 of the shift register units 20.

At stage t13, the reset clock signal RSTF and the scan control signal U2D are both at a high level, the input signal INF remains at a low level, the input module 21 cannot output a high-level signal, and the reset module 22 can output a high-level signal so that the signal of the second node N2 is a high-level signal, and the signal of the first node N1 is a low-level signal. At this stage, the shift module 26 is off and stops outputting the output clock signal OUT to the input module 21 of the ith-stage and/or kth-stage shift register unit 20 (i/k) at stage t12.

After stage t13, the input signal INF remains at a low level, and the reset clock signal RSTF alternates between a high level and a low level so that the signal of the second node N2 remains at a high level, the signal of the first node N1 remains at a low level, and the shift module 26 remains off. Regardless of any change in the output clock signal OUT, the shift module 26 no longer provides a high-level shift input signal NEXT to the input module 21 of the ith-stage and/or kth-stage shift register unit 20 (i/k) at stage t12 until the input module 21 of shift register 20 (j) receives a high-level input signal INF again. In this manner, only when the signal of the first node N1 transitions to a high-level signal, does the shift module 26 provide an active pulse of the shift input signal NEXT to the input module 21 of the ith-stage and/or kth-stage shift register unit 20 (i/k).

Thus, regardless of what level is the potential of the gate drive signal Gout output by the output module 24 and regardless of whether the jth-stage shift register unit 20 (j) can provide an active pulse of the gate drive signal Gout to the connected scan line SL (j), the jth-stage shift register unit 20 (j) can output an active pulse of the shift input signal NEXT. This enables cascading of the shift register units 20 without affecting progressive shifting and outputting of the input signals INF received by the input modules 21 of the shift register units 20.

In an optional embodiment, when the refresh control module is connected to the output terminal of the output module, a shift module (not shown) can also be disposed in the shift register unit. The working principle of the shift module is the same as that described in the previous embodiments and thus is not described here.

Figure 12:
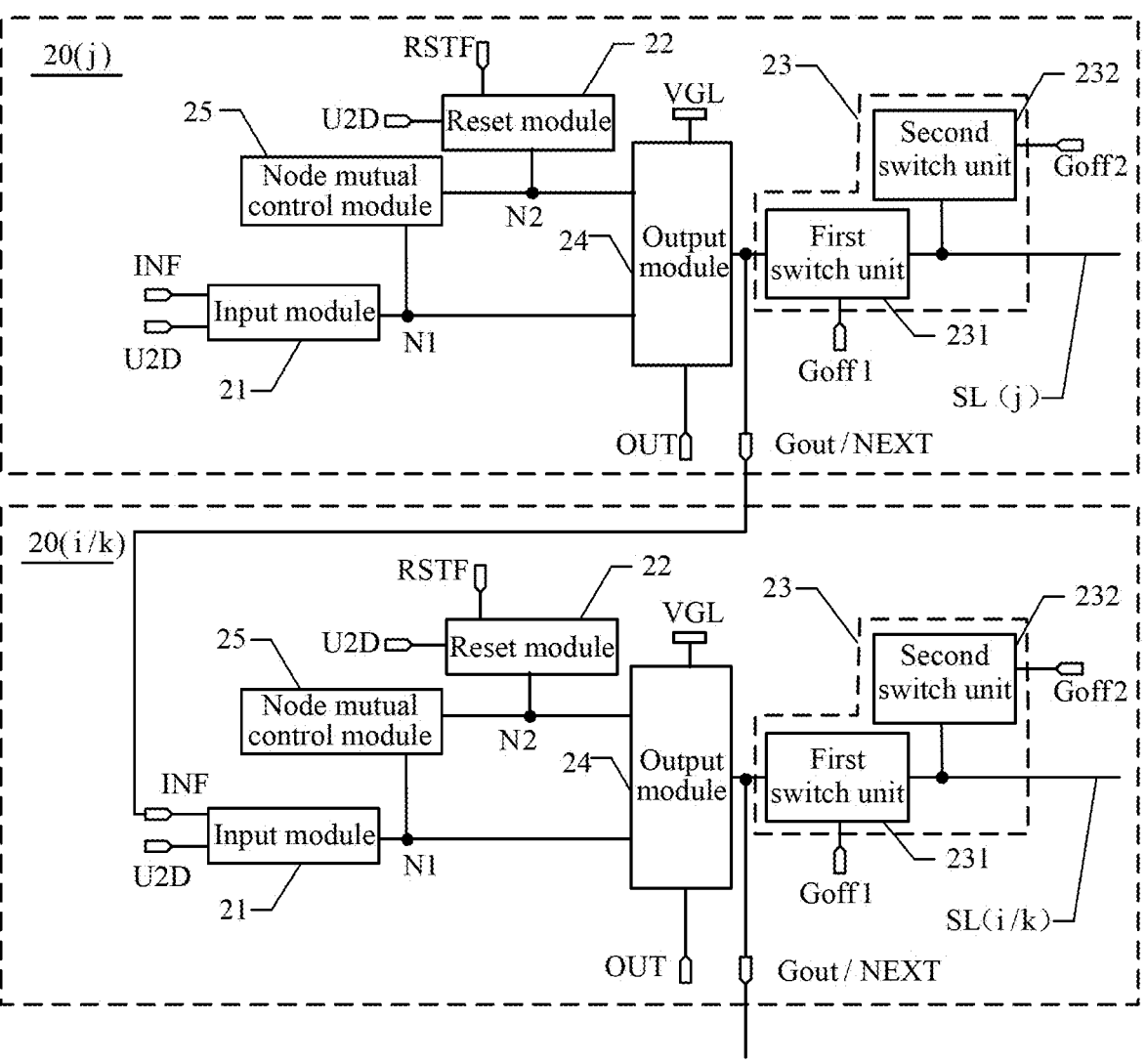
FIG. 12 is a diagram illustrating the structure of a driver circuit according to embodiments of the present application.

In other optional embodiments, referring to FIG. 12, when the refresh control module 23 is electrically connected to the output terminal of the output module 24, the gate drive signal Gout output by the output module 24 of the jth-stage shift register unit 20 (j) can also serve as the shift input signal NEXT, serving as the input signal INF received by the input module 21 of the ith-stage and/or kth-stage shift register unit 20 (i/k). Regardless of whether the jth-stage shift register unit 20 (j) can provide an active pulse of the gate drive signal Gout to the connected scan line SL (j), the jth-stage shift register unit 20 (j) can output an active pulse of the shift input signal NEXT to the ith-stage and/or kth-stage shift register unit 20 (i/k) so that the ith-stage and/or kth-stage shift register unit 20 (i/k) can provide an active level or inactive level of the gate drive signal Gout (i/k) to the connected scan line SL (i/k) according to the first refresh control signal Goff1 and the second refresh control signal Goff2. This also enables cascading of the shift register units 20 without affecting progressive shifting and outputting of the input signals INF received by the input modules 21 of the shift register units 20.

Optionally, the shift register unit includes Y output modules. Y is an integer greater than 1. In the same shift register unit, the Y output modules are configured to receive different output clock signals, and active pulses of the different output clock signals received by the shift register unit are successively shifted.

Figure 13:
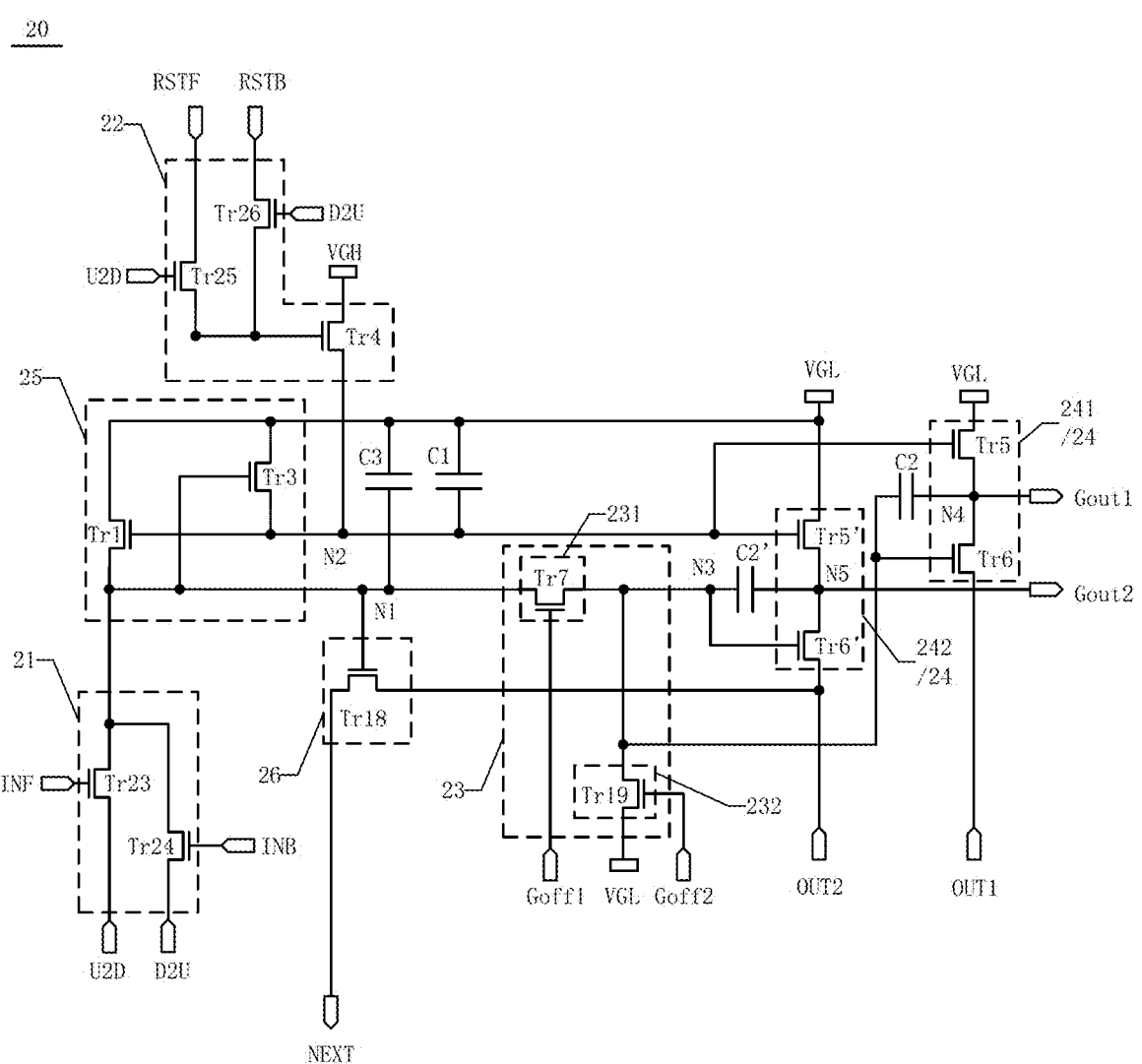
FIG. 13 is a diagram illustrating the structure of a shift register unit according to embodiments of the present application.

For example, Y=2. FIG. 13 is a diagram illustrating the structure of a shift register unit according to embodiments of the present application. Referring to FIG. 13, in the same shift register unit 20, the shift register unit 20 includes a first output module 241 and a second output module 242. The first control terminal of the first output module 241 and the first control terminal of the second output module 242 are both electrically connected to the output terminal of the first switch unit 231 and the output terminal of the second switch unit 232 at the third node N3. The first input terminal of the first output module 241 receives a first output clock signal OUT1. The first input terminal of the second output module 242 receives a second output clock signal OUT2. The second control terminal of the first output module 241 and the second control terminal of the second output module 242 are both electrically connected to the output terminal of the reset module 22 at the second node N2. The second input terminal of the first output module 241 and the second input terminal of the second output module 242 receive the first level signal VGL. The output terminal of the first output module 241 outputs a first gate drive signal Gout1. The output terminal of the second output module 242 outputs a second gate drive signal Gout2.

Figure 14:
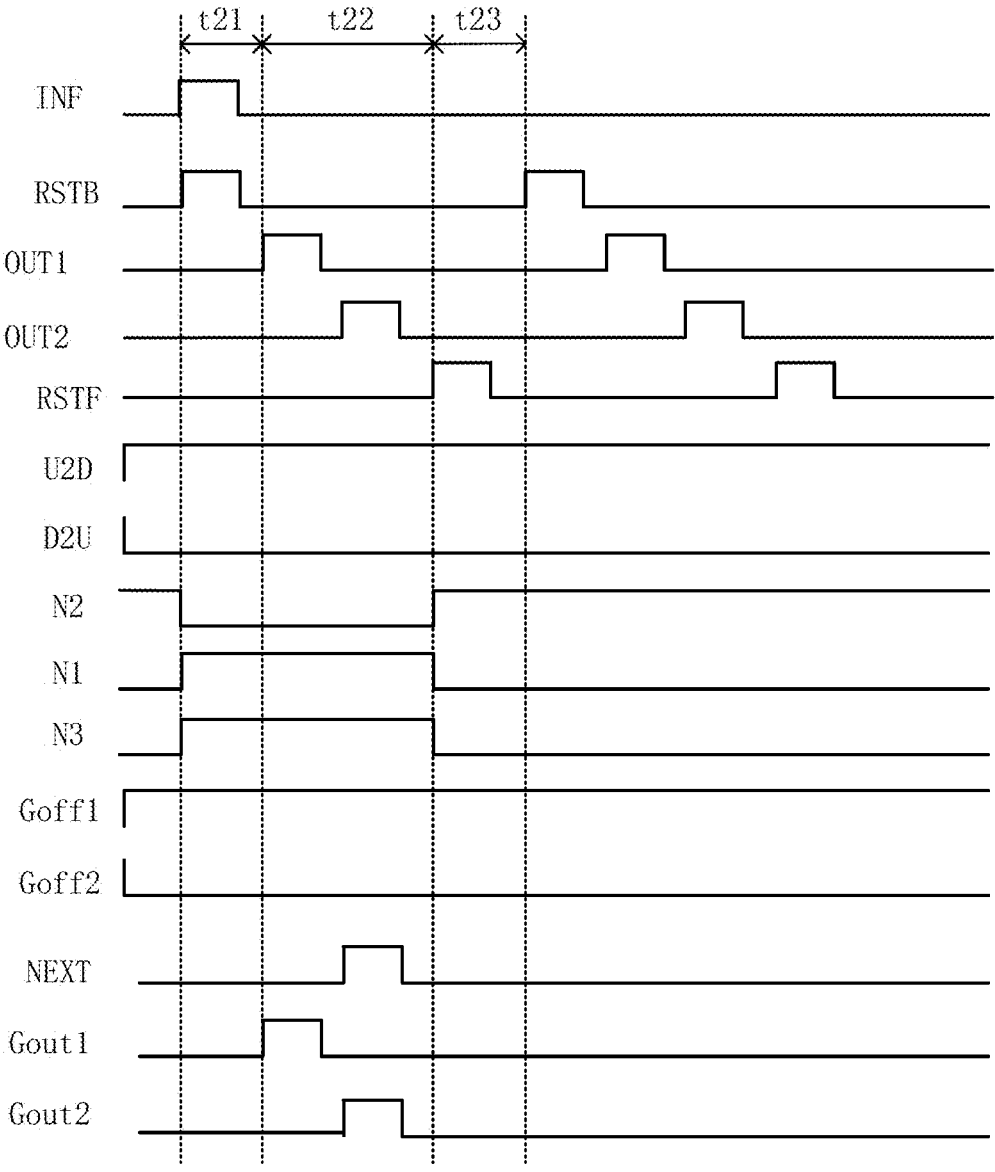
FIG. 14 is a timing diagram of a shift register unit according to embodiments of the present application.

For example, the active level is a high level, the inactive level is a low level, and the first level signal VGL is an inactive level. FIG. 14 is a timing diagram of a shift register unit according to embodiments of the present application. Referring to FIG. 13 and FIG. 14, when the first refresh control signal Goff1 is at a high level and the second refresh control signal Goff2 is at a low level, the first switch unit 231 can transmit the signal of the first node N1 to the third node N3. Therefore, the signal of the third node N3 is the signal of the first node N1. At stage t21, the input signal INF and the scan control signal U2D are both at a high level so that the signal of the first node N1 and the signal of the third node N3 are at a high level and the signal of the second node N2 is at a low level. At this stage, the first output module 241 can output the first output clock signal OUT1 as the first gate drive signal Gout1, and the second output module 242 can output the second output clock signal OUT2 as the second gate drive signal Gout2.

At stage t22, an active pulse of the first output clock signal OUT1 and an active pulse of the second output clock signal OUT2 shift successively. This results in the sequential shifting of an active pulse of the first gate drive signal Gout1 output by the first output module 241 and an active pulse of the second gate drive signal Gout2 output by the second output module 242. The active pulse of the first output clock signal OUT1 does not overlap the active pulse of the second output clock signal OUT2 so that the active pulse of the first gate drive signal Gout1 output by the first output module 241 does not overlap the active pulse of the second gate drive signal Gout2 output by the second output module 242.

At stage t23, the reset clock signal RSTF and the scan control signal U2D are both at a high level, and the input signal INF is at a low level so that the signal of the first node N1 and the signal of the third node N3 are at a low level, and the signal of the second node N2 is at a high level. At this stage, the first output module 241 stops outputting the first output clock signal OUT1 as the first gate drive signal Gout1, the second output module 242 stops outputting the second output clock signal OUT2 as the second gate drive signal Gout2, the first output module 241 outputs a low level of the first clock signal VGL as the first gate drive signal Gout1, and the second output module 242 outputs a low level of the first clock signal VGL as the second gate drive signal Gout2.

This allows the shift register unit 20 to output successively shifted first gate drive signal Gout1 and second gate drive signal Gout2, enabling one shift register unit 20 to be connected to scan lines SL in different rows simultaneously. This reduces the number of shift register units 20 in the driver circuit 10, thereby facilitating the lightweight design of the display panel 01.

Figure 15:
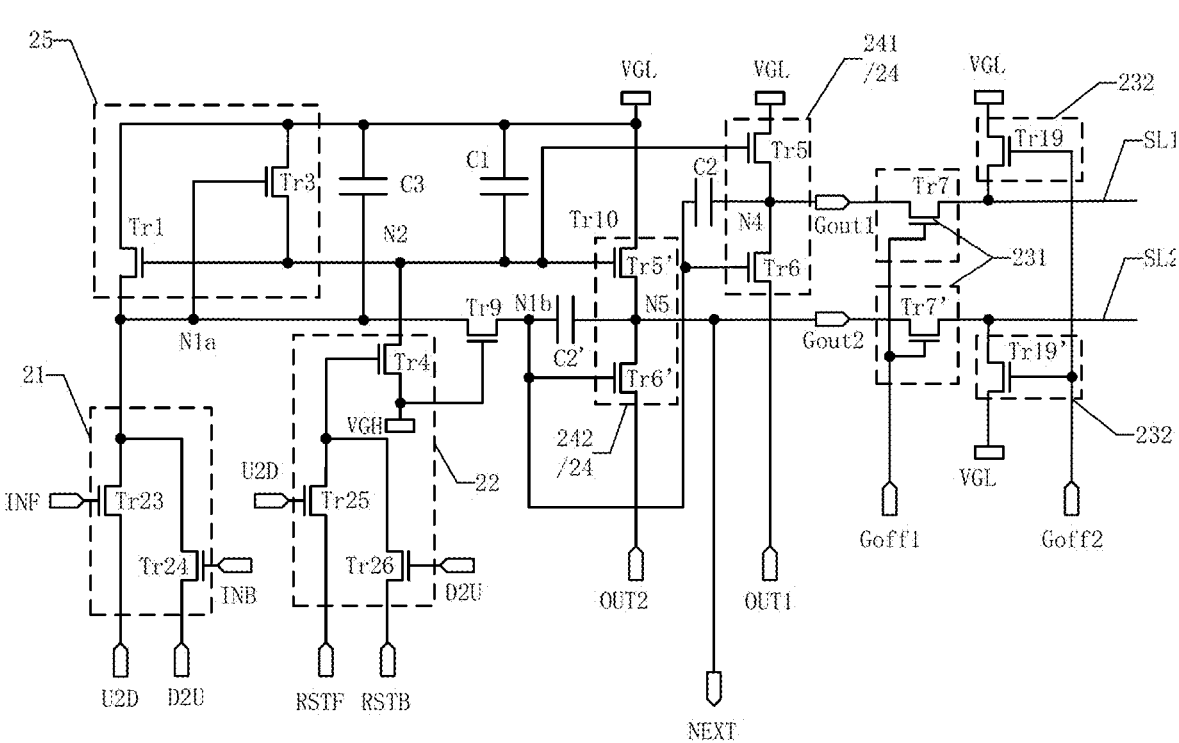
FIG. 15 is a diagram illustrating the structure of a shift register unit according to embodiments of the present application.

In other embodiments, FIG. 15 is a diagram illustrating the structure of a shift register unit according to embodiments of the present application. Referring to FIG. 15, in the same shift register unit 20, the shift register unit 20 includes a first output module 241 and a second output module 242. The first control terminal of the first output module 241 and the first control terminal of the second output module 242 both receive the signal of the first node N1. The first input terminal of the first output module 241 receives a first output clock signal OUT1. The first input terminal of the second output module 242 receives a second output clock signal OUT2. The second control terminals of the first output module 241 and the second output module 242 are electrically connected to the output terminal of the reset module 22 at the second node N2. The second input terminal of the first output module 241 and the second input terminal of the second output module 242 receive the first level signal VGL. The output terminal of the first output module 241 is electrically connected to the input terminal of the first switch unit 231. The output terminal of the first switch unit 231 and the output terminal of the second switch unit 232 are both electrically connected to the first output terminal of the shift register unit 20. The first output terminal of the shift register unit 20 is electrically connected to the first scan line SL1. The shift register unit 20 can control, according to the first refresh control signal Goff1 and the second refresh control signal Goff, the transmission path of the first gate drive signal Gout1 output by the first output module 241 to the first scan line SL1. The output terminal of the second output module 242 is electrically connected to the input terminal of another first switch unit 231. The output terminal of the another first switch unit 231 and the output terminal of another second switch unit 232 are both electrically connected to the second output terminal of the shift register unit 20. The second output terminal of the shift register unit 20 is electrically connected to the second scan line SL2. The shift register unit 20 can control, according to the first refresh control signal Goff1 and the second refresh control signal Goff, the transmission path of the second gate drive signal Gout2 output by the second output module 242 to the second scan line SL2.

Based on the previous embodiments, in the same shift register unit, the output clock signal received by the xth output module is the xth output clock signal, the active pulse time period of the xth output clock signal is before the active pulse time period of the (x+1)th output clock signal. Here, x is a positive integer less than Y. The shift module is configured to receive at least the signal of the first node and the output clock signal received by the Yth output module and control, according to the signal of the first node, the transmission path of the output clock signal received by the Yth output module as the shift input signal to the ith-stage and/or kth-stage shift register unit 20.

In an embodiment, with continued reference to FIG. 13 and FIG. 14, in the same shift register unit 20, the control terminal of the shift module 26 is electrically connected to the first node N1. The shift module 26 is configured to, when the signal of the first node N1 is at an active level, transmit the last active pulse among the output clock signals received by the output modules 24 as the active pulse of the shift input signal NEXT to the ith-stage and/or kth-stage shift register unit. This ensures that when the shift register unit 20 includes multiple output modules 24, that is, when the shift register unit 20 provides the gate drive signal Gout to multiple scan lines SL, the last active pulse of the gate drive signal Gout output by the last output module 24 of the shift register unit 20 and the active pulse of the first gate drive signal Gout output by the first output module 24 of the next stage shift register unit 20 can shift successively, thus achieving the sequential scanning of all rows of pixels P.

In an optional embodiment, with continued reference to FIG. 13 and FIG. 15, the input module 21 includes a first input transistor Tr23. The gate of the first input transistor Tr23 receives an input signal INF. The first electrode of the first input transistor Tr23 receives a scan control signal U2D. The second electrode of the first input transistor Tr23 is electrically connected to the first node N1. When the input signal INF is at an active level, the first input transistor Tr23 is on. If the scan control signal U2D is also at an active level, the signal of the first node N1 can also be at an active level.

In another optional embodiment, referring to FIG. 13 and FIG. 15, the reset module 22 includes a first reset transistor Tr5 and a reset control transistor Tr4. The gate of the first reset transistor Tr25 receives a scan control signal U2D. The first electrode of the first reset transistor Tr25 receives a reset clock signal RSTF. The second electrode of the first reset transistor Tr25 is electrically connected to the gate of the reset control transistor Tr4. The first electrode of the reset control transistor Tr4 receives a second level signal VGH. The second electrode of the reset control transistor Tr4 is electrically connected to the second node N2. When the scan control signal U2D is at an active level, the first reset transistor Tr25 is on so that the gate potential of the reset control transistor Tr4 is the same as the reset clock signal RSTF. When the reset clock signal RSTF is at an active level, the gate of the reset control transistor Tr4 is on, and the signal of the second node N2 is an active level of the second level signal VGH.

In another optional embodiment, the refresh control module 23 includes a first refresh control transistor Tr7 and a second refresh control transistor Tr19. The gate of the first refresh control transistor Tr7 receives a first refresh control signal Goff1. The first terminal of the first refresh control transistor Tr7 is electrically connected to the first node N1. The second terminal of the first refresh control transistor Tr7 is electrically connected to the third node N3. The gate of the second refresh control transistor Tr19 receives a second refresh control signal Goff2. The first terminal of the second refresh control transistor Tr19 receives a first voltage signal VGL. The second terminal of the second refresh control transistor Tr19 is electrically connected to the third node N3. See FIG. 13. Alternatively, for example, the shift register unit 20 includes two output modules 24. The refresh control module 23 includes first refresh control transistors Tr7 and Tr7' and second refresh control transistors Tr19 and Tr19'. See FIG. 15. The gate of the first refresh control transistor Tr7 and the gate of the first refresh control transistor Tr7' both receive the first refresh control signal Goff1. The first terminal of the first refresh control transistor Tr7 and the first terminal of the first refresh control transistor Tr7' are connected to the output terminal of the first output module 241 and the output terminal of the second output module 242 respectively. The second terminal of the first refresh control transistor Tr7 and the second terminal of the first refresh control transistor Tr7' are connected to the first output terminal of the shift register unit 20 and the second output terminal of the shift register unit 20 respectively. The gate of the second refresh control transistor Tr19 and the gate of the second refresh control transistor Tr19' both receive the second refresh control signal Goff2. The first terminal of the second refresh control transistor Tr19 and the first terminal of the second refresh control transistor Tr19' both receive the first voltage signal VGL. The second terminal of the second refresh control transistor Tr19 and the second terminal of the second refresh control transistor Tr19' are connected to the first output terminal of the shift register unit 20 and the second output terminal of the shift register unit 20 respectively.

In another optional embodiment, referring to FIG. 13 and FIG. 15, the shift register unit 20 includes two output modules 24. The first output module 241 includes a first output transistor Tr6 and a second output transistor Tr5. The gate of the first output transistor Tr6 is configured to receive the signal of the first node N1. The second output transistor Tr5 is configured to receive the signal of the second node N2. The first electrode of the first output transistor Tr6 receives a first output clock signal OUT1. The first electrode of the second output transistor Tr5 receives a first level signal VGL. The second electrode of the first output transistor Tr6 and the second electrode of the second output transistor Tr5 are electrically connected to the fourth node N4. The second output module 242 includes a first output transistor Tr6' and a second output transistor Tr5'. The gate of the first output transistor Tr6' is configured to receive the signal of the first node N1. The second output transistor Tr5' is configured to receive the signal of the second node N2. The first electrode of the first output transistor Tr6' receives a second output clock signal OUT2. The first electrode of the second output transistor Tr5' receives a first level signal VGL. The second electrode of the first output transistor Tr6' and the second electrode of the second output transistor Tr5' are electrically connected to the fifth node N5.

In another optional embodiment, with continued reference to FIG. 13 and FIG. 15, the node interlock module 25 includes a first interlock transistor Tr1 and a second interlock transistor Tr3. The first electrode of the first interlock transistor Tr1 is connected to the first node N1. The gate of the first interlock transistor Tr1 is connected to the second node N2. The second electrode of the first interlock transistor Tr1 receives a first level signal VGL. The gate of the second interlock transistor Tr3 is electrically connected to the first node N1. The first electrode of the second interlock transistor Tr3 is electrically connected to the second node N2. The second electrode of the second interlock transistor Tr3 receives a first level signal VGL. When the first node N1 is at an active level, the second mutual control transistor Tr3 is on so that the second node N2 is at a low level and the first mutual control transistor Tr1 is off. When the second node N2 is at an active level, the first mutual control transistor Tr1 is on so that the first node N1 is at a low level and the second mutual control transistor Tr3 is off.

In another optional embodiment, with continued reference to FIG. 13 and FIG. 15, the shift module 26 includes a shift transistor Tr18. The gate of the shift transistor Tr18 is connected to the first node N1. The first electrode of the shift transistor Tr18 receives a first output clock signal OUT1. The second electrode of the shift transistor Tr18 is configured to provide the shift input signal NEXT to the input module of other stages of shift register units.

In another optional embodiment, with continued reference to FIG. 13 and FIG. 15, the shift register unit 20 also includes a storage capacitor C1 and a storage capacitor C3. The first plate of the storage capacitor C1 and the first plate of the storage capacitor C2 are electrically connected to the second node N2 the first node N1 respectively to store the signal of the second node N2 and the signal of the first node N1. When no new signal is written into the shift register unit 20, the signal of the second node N2 and the signal of the first node N1 can remain stable.

In another optional embodiment, with continued reference to FIG. 13 and FIG. 15, the shift register unit 20 includes two output modules 24 by way of example. The shift register unit 20 also includes a bootstrap capacitor C2 and a bootstrap capacitor C2'. The first plate of the bootstrap capacitor C2 and the first plate of the bootstrap capacitor C2' are configured to receive the signal of the first node N1 and are connected to the gate of the first output transistor Tr6 and the gate of the first output transistor Tr6' respectively. The second plate of the bootstrap capacitor C2 and the second plate of the bootstrap capacitor C2' are electrically connected to the fourth node N4 and the fifth node N5 respectively. When the fourth node N4 or the fifth node N5 is at an active level, the coupling effect of the bootstrap capacitor C2 or C2' is used to change the gate potential of the first output transistor Tr6 or the gate potential of the first output transistor Tr6' so that the first output transistor Tr6 or the first output transistor Tr6' is fully on, thereby reducing the signal delay.

In another optional embodiment, with continued reference to FIG. 15, the shift register unit 20 also includes a voltage regulator transistor Tr9. The gate of the voltage regulator transistor Tr9 receives a second level signal VGH, which is at an active level, causing the voltage regulator transistor Tr9 to be on at the most time period. The first node N1 includes a first subnode N1$a$ and a second subnode N1$b$. The first subnode N1$a$ is electrically connected to the input module 21, the node mutual control module 25, and the first electrode of the voltage regulator transistor Tr9 separately. The second subnode N1$b$ is electrically connected to the second electrode of the voltage regulator transistor Tr9, the second output transistor Tr6, and the gate of Tr6' separately.

In an embodiment, when the potential at the second subnode N1$b$ fluctuates significantly due to the bootstrapping effect of bootstrap capacitor C2 and/or C2', the difference between the gate voltage of the voltage regulator transistor Tr9 and the second electrode voltage of the voltage regulator transistor Tr9 becomes less than the threshold voltage of the voltage regulator transistor Tr9, causing the voltage regulator transistor Tr9 to briefly turn off. When the potential at the second subnode N1$b$ returns to normal, that is, when the difference between the gate voltage of the voltage regulator transistor Tr9 and the second electrode voltage of the voltage regulator transistor Tr9 becomes greater than the threshold voltage of the voltage regulator transistor Tr9, the voltage regulator transistor Tr9 turns on. This prevents fluctuating signals from propagating to the first electrode of the first input transistor Tr23 when voltage at N1$b$, that is, voltage at the gate of the second output transistor Tr6 and/or Tr6' (the second subnode N1$b$) fluctuations. Such propagation may lead to an excessive voltage difference across the first input transistor Tr23 when the first input transistor Tr23 is on, thus damaging the first input transistor Tr23.

In another optional embodiment, referring to FIG. 13 and FIG. 15, the input module 21 also includes a second input transistor Tr24. The gate of the second input transistor Tr24 receives a reverse input signal INB. The first electrode of the second input transistor Tr24 receives a reverse scan control signal D2U. The second electrode of the second input transistor Tr24 is electrically connected to the first node N1.

For example, when an input signal INF comes from the previous stage of shift register unit 20, a reverse input signal INB can come from the next stage of shift register unit 20. In this case, the scan control signal U2D can enable forward scanning from top to bottom. When U2D is at an active level, all the stages of shift register units 20 can successively shift the input signal INF from bottom to top and successively output an active pulse of the gate drive signal Gout. Conversely, the reverse scan control signal D2U can enable reverse scanning from bottom to top. When D2U is at an active level, all stages of shift register units 20 can successively shift the reverse input signal INB from bottom to top and successively output an active pulse of the gate drive signal Gout.

Based on the previous embodiments, the reset module 22 also includes a second reset transistor Tr26. The gate of the second reset transistor Tr26 receives a reverse scan control signal D2U. The first electrode of the second reset transistor Tr26 receives a reverse reset clock signal RSTB. The second electrode of the second reset transistor Tr26 is electrically connected to the gate of the reset control transistor Tr4. When the reverse scan control signal D2U is at an active level, the second reset transistor Tr26 is on so that the gate potential of the reset control transistor Tr4 is the same as the reverse reset clock signal RSTB. When the reverse reset clock signal RSTB is at an active level, the gate of the reset control transistor Tr4 is on, and the signal of the second node N2 is an active level of the second level signal VGH.

Figure 16:
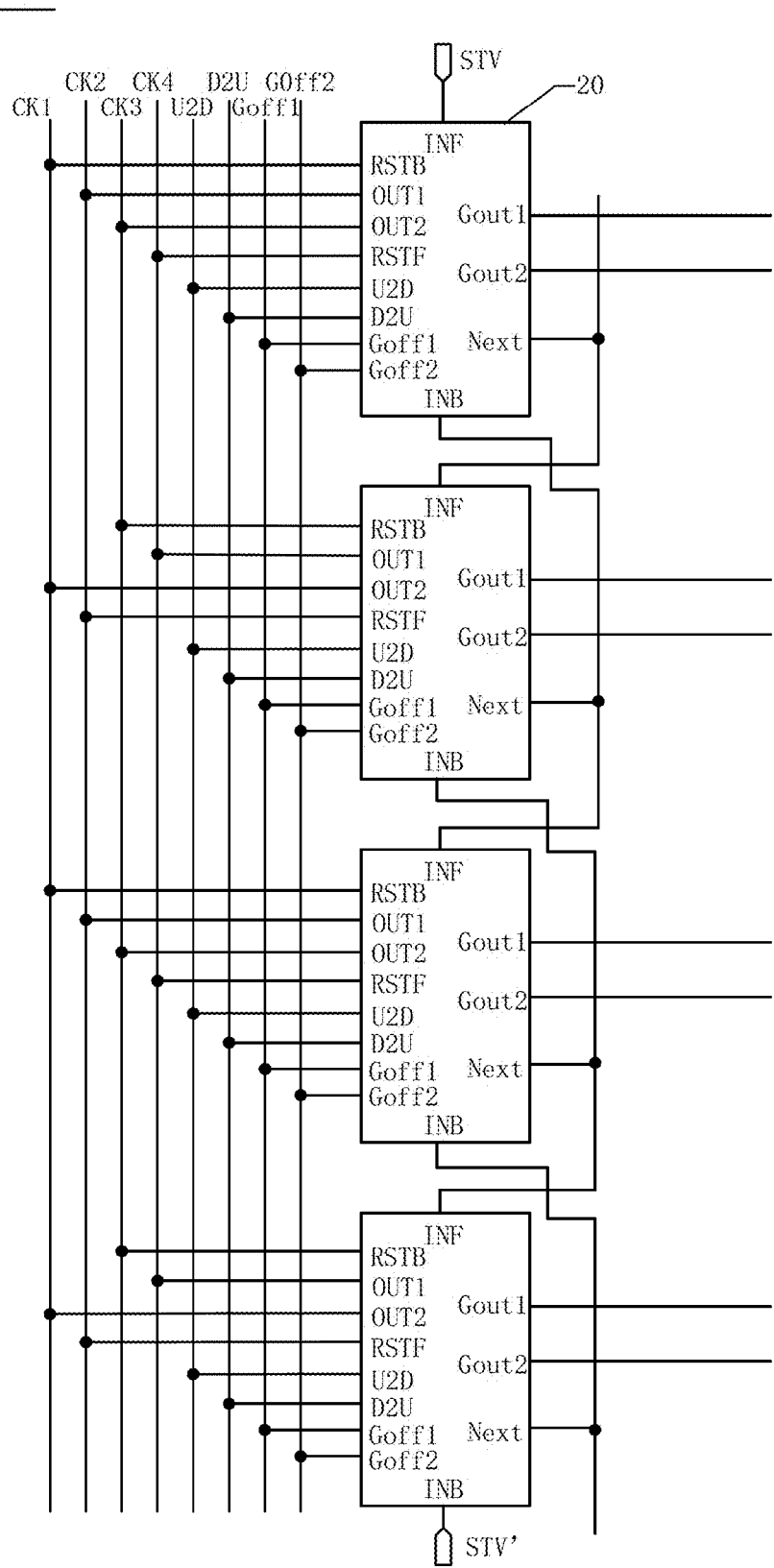
FIG. 16 is a diagram illustrating the structure of a driver circuit according to embodiments of the present application.

FIG. 16 is a diagram illustrating the structure of a driver circuit according to embodiments of the present application. Illustratively, when multiple shift register units 20 are cascaded, the input signal INF of the first stage of shift register unit 20 may be a start signal STV from the driver circuit 10. The reverse input signal INB of the last stage of shift register unit 20 may be a reverse start signal STV' from the driver circuit 10. For shift register units 20 other than the first stage of shift register unit 20 and the last stage of shift register unit 20, the input signal INF of a shift register unit 20 is the shift input signal NEXT of the previous stage of shift register unit 20, and the shift input signal NEXT of the current stage of shift register unit 20 can serve as the input signal INF of the next stage of shift register unit 20; and the reverse input signal INB is the shift input signal NEXT of the next stage of shift register unit 20, and the shift input signal NEXT of the current stage of shift register unit 20 can serve as the reverse input signal INB of the previous stage of shift register unit 20.

The cascaded shift register units 20 may receive the same scan control signal U2D and the same reverse scan control signal D2U. When the shift register unit 20 performs a forward scan driving process, the scan control signal U2D may be constantly at an active level, and the reverse scan control signal D2U may be constantly at an inactive level. Thus, the signal of the first node N1 in the current stage of shift register unit 20 is not affected by the shift input signal NEXT of the next stage of shift register unit 20. When the shift register unit 20 performs a reverse scan driving process, the scan control signal U2D may be constantly at an inactive level, and the reverse scan control signal D2U may be constantly at an active level. Thus, the signal of the first node N1 in the current stage of shift register unit 20 is not affected by the shift input signal NEXT of the previous stage of shift register unit 20.

The reverse reset clock signal RSTB, the first output clock signal OUT1, the second output clock signal OUT2, and the reset clock signal RSTF received by the same shift register unit 20 are different clock signals. For example, these signals may be clock signals CK1, CK2, CK3, and CK4. The active pulses of clock signals CK1, CK2, CK3, and CK4 are shifted successively. Among the cascaded shift register units 20, the reverse reset clock signal RSTB, the first output clock signal OUT1, the second output clock signal OUT2, and the reset clock signal RSTF received by the jth-stage shift register unit 20 are the same as the reverse reset clock signal RSTB, the first output clock signal OUT1, the second output clock signal OUT2, and the reset clock signal RSTF received by the (j+2)th-stage shift register unit 20 respectively. Among the cascaded shift register units 20, the reverse reset clock signal RSTB, the first output clock signal OUT1, the second output clock signal OUT2, and the reset clock signal RSTF received by the jth-stage shift register unit 20 are the same as the second output clock signal OUT2, the reset clock signal RSTF, the reverse reset clock signal RSTB, and the first output clock signal OUT1 received by the (j+1)th-stage shift register unit 20 respectively. J is a positive integer.

In other words, the port located in the jth-stage shift register unit 20 and configured to receive a reverse reset clock signal RSTB and the port located in the (j+2)th-stage shift register unit 20 and configured to receive a reverse reset clock signal RSTB are connected to the same clock signal line and receive the same clock signal; the port located in the jth-stage shift register unit 20 and configured to receive a first output clock signal OUT1 and the port located in the (j+2)th-stage shift register unit 20 and configured to receive a first output clock signal OUT1 are connected to the same clock signal line and receive the same clock signal; the port located in the jth-stage shift register unit 20 and configured to receive a second output clock signal OUT2 and the port located in the (j+2)th-stage shift register unit 20 and configured to receive a second output clock signal OUT2 are connected to the same clock signal line and receive the same clock signal; and the port located in the jth-stage shift register unit 20 and configured to receive a reset clock signal RSTF and the port located in the (j+2)th-stage shift register unit 20 and configured to receive a reset clock signal RSTF are connected to the same clock signal line and receive the same clock signal. The port located in the jth-stage shift register unit 20 and configured to receive a reverse reset clock signal RSTB and the port located in the (j+1)th-stage shift register unit 20 and configured to receive a second output clock signal OUT2 are connected to the same clock signal line and receive the same clock signal; the port located in the jth-stage shift register unit 20 and configured to receive a first output clock signal OUT1 and the port located in the (j+1)th-stage shift register unit 20 and configured to receive a reset clock signal RSTF are connected to the same clock signal line and receive the same clock signal; the port located in the jth-stage shift register unit 20 and configured to receive a second output clock signal OUT2 and the port located in the (j+1)th-stage shift register unit 20 and configured to receive a reverse reset clock signal RSTB are connected to the same clock signal line and receive the same clock signal; and the port located in the jth-stage shift register unit 20 and configured to receive a reset clock signal RSTF and the port located in the (j+1)th-stage shift register unit 20 and configured to receive a first output clock signal OUT1 are connected to the same clock signal line and receive the same clock signal.

The figure shows an example in which transistors in the shift register unit are all N-type. In other embodiments, part or all of the transistors in the shift register unit may be P-type. Embodiments of the present application do not limit the type of transistors in the shift register unit.

Optionally, the first switch unit includes a first subtransistor and a second subtransistor that are connected in parallel, and/or the second switch unit includes a third subtransistor and a fourth subtransistor that are connected in parallel. The first refresh control signal is configured to control the conduction state of the first subtransistor and the conduction state of the second subtransistor, and/or the second refresh control signal is configured to control the conduction state of the third subtransistor and the conduction state of the fourth subtransistor.

In an embodiment, the first refresh control signal can control the first subtransistor to turn on and the second subtransistor to turn off, or the first refresh control signal can control the first subtransistor to turn off and the second subtransistor to turn on; and/or, the second refresh control signal can control the third subtransistor to turn on and the fourth subtransistor to turn off, or the second refresh control signal can control the third subtransistor to turn off and the fourth subtransistor to turn on.

Figure 17:
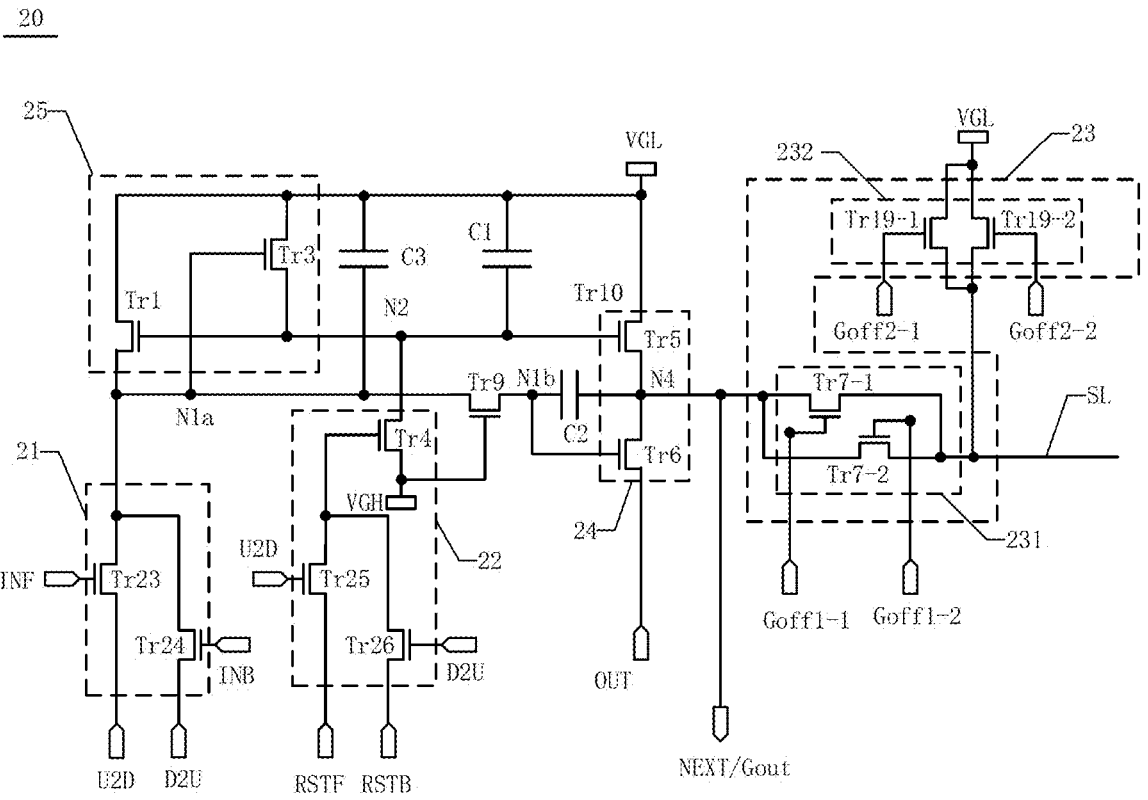
FIG. 17 is a diagram illustrating the structure of a shift register unit according to embodiments of the present application.

FIG. 17 is a diagram illustrating the structure of a shift register unit according to embodiments of the present application. Referring to FIG. 17, the first switch unit 231 includes a first subtransistor Tr7-1 and a second subtransistor Tr7-2 that are connected in parallel. The first refresh control signal Goff1 includes a first subcontrol signal Goff1-1 and a second subcontrol signal Goff1-2. The gate of the first subtransistor Tr7-1 receives a first subcontrol signal Goff1-1. The gate of the second subtransistor Tr7-2 receives a second subcontrol signal Goff1-2. The first subcontrol signal Goff1-1 and the second subcontrol signal Goff1-2 can control the conduction state of the first subtransistor Tr7-1 and the conduction state of the second subtransistor Tr7-2 respectively. Thus, the first subcontrol signal Goff1-1 and the second subcontrol signal Goff1-2 in the first refresh control signal Goff1 can control the first subtransistor Tr7-1 and the second subtransistor Tr7-2 in the first switch unit 231 to conduct alternately, preventing the first subtransistor Tr7-1 and/or the second subtransistor Tr7-2 from being on for a long time period, from affecting the lifespan and threshold voltage of the transistors, from making inaccurate the gate drive signal Gout provided for the shift register unit 20, from affecting data signals written to pixels P, and from leading to a poor display quality.

With continued reference to FIG. 17, the second switch unit 232 includes a third subtransistor Tr19-1 and a fourth subtransistor Tr19-2 connected in parallel. The second refresh control signal Goff2 includes a third subcontrol signal Goff2-1 and a fourth subcontrol signal Goff2-2. The gate of the third subtransistor Tr19-1 receives a third subcontrol signal Goff2-1. The gate of the fourth subtransistor Tr19-2 receives a fourth subcontrol signal Goff2-2. The third subcontrol signal Goff2-1 and the fourth subcontrol signal Goff2-2 can control the conduction state of the third subtransistor Tr19-1 and the conduction state of the fourth subtransistor Tr19-2 respectively. Thus, the third subcontrol signal Goff2-1 and the fourth subcontrol signal Goff2-2 in the second refresh control signal Goff2 can control the third subtransistor Tr19-1 and the fourth subtransistor Tr19-2 in the second switch unit 232 to conduct alternately, preventing the third subtransistor Tr19-1 and/or the fourth subtransistor Tr19-2 from being on for a long time period, from affecting the lifespan and threshold voltage of the transistors, from making inaccurate the gate drive signal Gout provided for the shift register unit 20, from affecting data signals written to pixels P, and from leading to a poor display quality.

In other optional embodiments, the first subtransistor and the second subtransistor that are connected in parallel may have different channel types, and the same first refresh control signal can control one of the first subtransistor or the second subtransistor to turn on and the other of the first subtransistor or the second subtransistor to turn off; and/or the third subtransistor and the fourth subtransistor that are connected in parallel may have different channel types, and the same second refresh control signal can control one of the third subtransistor or the fourth subtransistor to turn on and the other of the third subtransistor or the fourth subtransistor to turn off.

FIG. 17 illustrates that the first subtransistor and the second subtransistor are connected in parallel between the output terminal of the output module and the output terminal of the shift register unit and that the third subtransistor and the fourth subtransistor are connected in parallel between the fixed potential terminal of the first level signal and the output terminal of the shift register unit. In other optional embodiments, the first subtransistor and the second subtransistor may be connected in parallel between the first node and the gate of the first output transistor, and the third subtransistor and the fourth subtransistor may be connected in parallel between the fixed potential terminal of the first level signal and the gate of the first output transistor.

Based on the previous embodiments, the display panel includes multiple display frames. Within at least part of the working time period of the display panel, two adjacent display frames are a first display frame and a second display frame. In at least part of the pixel refresh time period of the first display frame, the first refresh control signal is configured to control the first subtransistor to stay on and control the second subtransistor to stay off, and in at least part of the pixel refresh time period of the second display frame, the first refresh control signal is configured to control the first subtransistor to stay off and control the second subtransistor to stay on; and/or in at least part of the pixel refresh time period of the first display frame, the second refresh control signal is configured to control the third subtransistor to stay on and control the fourth subtransistor to stay off, and in at least part of the pixel refresh time period of the second display frame, the second refresh control signal is configured to control the third subtransistor to stay off and control the fourth subtransistor to stay on.

Figure 18:
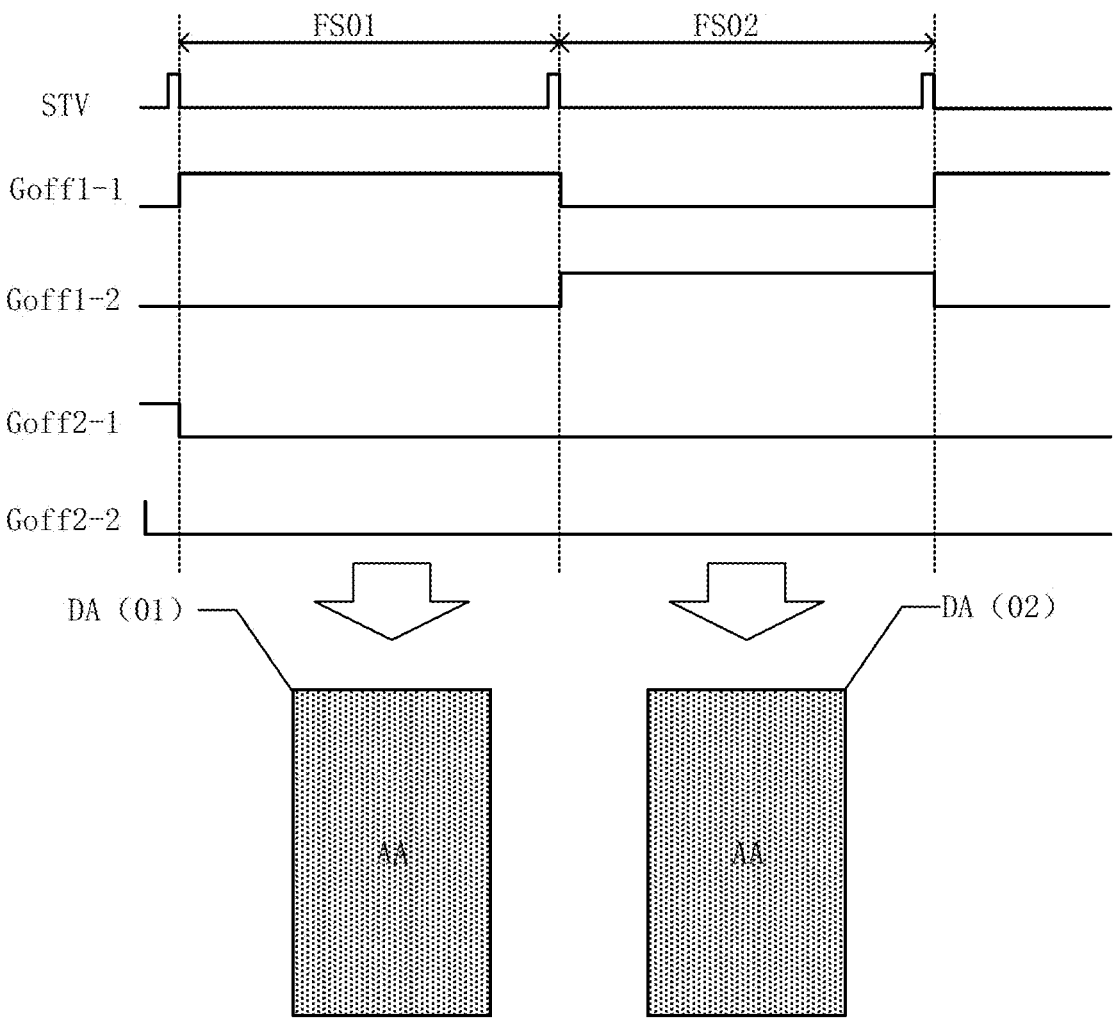
FIG. 18 is a timing diagram of a shift register unit according to embodiments of the present application.

For example, the active level is a high level, the inactive level is a low level, and transistors in the shift register unit 20 are each an N-type transistor. FIG. 18 is a timing diagram of a shift register unit according to embodiments of the present application. Referring to FIG. 17 and FIG. 18, if the first display frame DA (01) and the second display frame DA (02) are each a single-frequency display frame and if the shift register unit 20 can output an active pulse of the gate drive signal Gout, then it is required to control the first switch unit 231 to stay on and the second switch unit 232 to stay off in the pixel refresh time period FS01 of the first display frame DA (01) and the pixel refresh time period FS02 of the second display frame DA (02). In the pixel refresh time period FS01 of the first display frame DA (01), the first subcontrol signal Goff1-1 is at a high level, and the second subcontrol signal Goff1-2, the third subcontrol signal Goff2-1, and the fourth subcontrol signal Goff2-2 are all at a low level; and the first subtransistor Tr7-1 is on, and the second subtransistor Tr7-2, the third subtransistor Tr19-1, and the fourth subtransistor Tr19-2 are all off. In the pixel refresh time period FS02 of the second display frame DA (02), the second subcontrol signal Goff1-2 is at a high level, and the first subcontrol signal Goff1-1, the third subcontrol signal Goff2-1, and the fourth subcontrol signal Goff2-2 are all at a low level; and the second subtransistor Tr7-2 is on, and the first subtransistor Tr7-1, the third subtransistor Tr19-1, and the fourth subtransistor Tr19-2 are all off. When the first switch unit 231 is required to stay on in the pixel refresh time period of two consecutive display frames, the first subtransistor Tr7-1 and the second subtransistor Tr7-2 in the first switch unit 231 can turn on alternately. This allows the first subtransistor Tr7-1 to briefly turn off in the pixel refresh time period of at least one of the display frames and the second subtransistor Tr7-2 to briefly turn off in the pixel refresh time period of at least the other of the display frames. In this manner, the two subtransistors of the first switch unit 231 can briefly turn off in the pixel refresh time period of two consecutive display frames without affecting the continuous conduction of the first switch unit 231. This prevents the subtransistors in the first switch unit 231 from being continuously on for a long time period, thereby enhancing the reliability of the refresh control module 23.

Figure 19:
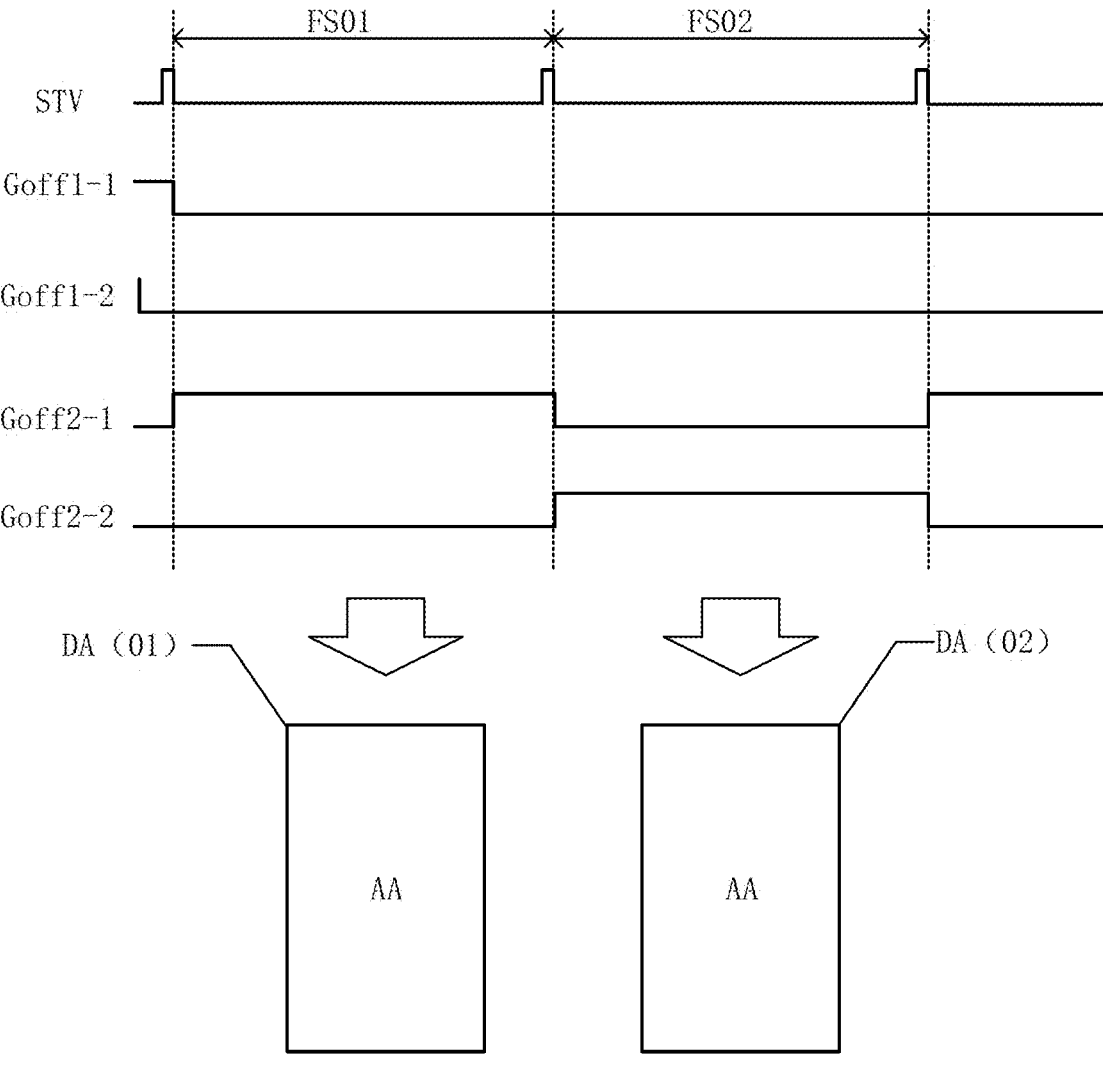
FIG. 19 is a timing diagram of a shift register unit according to embodiments of the present application.

Referring to FIG. 17 and FIG. 19, if the first display frame DA (01) and the second display frame DA (02) are both a single-frequency display frame and if the gate drive signal Gout output by the shift register unit 20 is at an inactive level, then it is required to turn on the second switch unit 232 and turn off the first switch unit 231 in the pixel refresh time period of the first display frame DA (01) and the pixel refresh time period of the second display frame DA (02). When the second switch unit 232 is required to stay on in the pixel refresh time period of two consecutive display frames, the third subtransistor Tr19-1 and the fourth subtransistor Tr19-2 in the second switch unit 232 may be on alternately. This allows the third subtransistor Tr19-1 to stay off in the pixel refresh time period of at least one of the display frames and the fourth subtransistor Tr19-2 to stay off in the pixel refresh time period of at least the other of the display frames. In this manner, the two subtransistors of the second switch unit 232 can briefly turn off in the pixel refresh time period of two consecutive display frames without affecting the continuous conduction of the second switch unit 232. This prevents the subtransistors in the second switch unit 232 from being continuously on for a long time period, thereby enhancing the reliability of the refresh control module 23.

With continued reference to FIG. 17, if at least some shift register units 20 output an active pulse of the gate drive signal Gout only once in the pixel refresh time period FS01 and FS02 of the first display frame DA (01) and the second display frame DA (02), it is necessary to control the first switch unit 231 to stay on and the second switch unit 232 to stay off in at least part of the pixel refresh time period of one of the display frames so that at least one shift register unit 20 can output an active pulse of the gate drive signal Gout; and to control the second switch unit 232 to stay on and the first switch unit 231 to stay off in at least part of the pixel refresh time period of the other of the display frames so that at least one shift register unit 20 can stop outputting an active pulse of the gate drive signal Gout.

Figure 20:
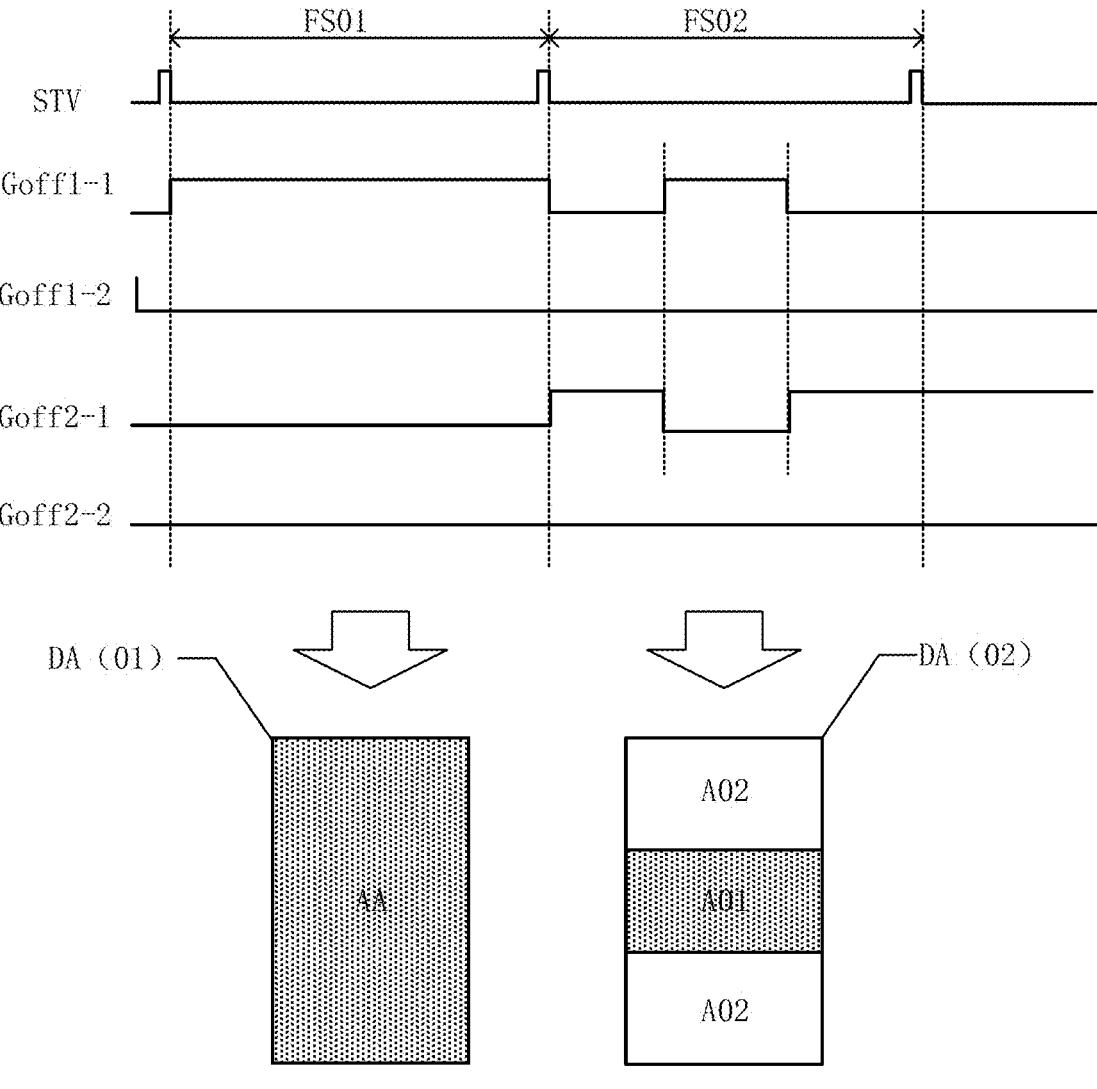
FIG. 20 is a timing diagram of a shift register unit according to embodiments of the present application.

For example, as shown in FIG. 20, the first display frame DA (01) is a single-frequency display frame, and the second display frame DA (02) is a multi-frequency display frame. In the pixel refresh time period FS01 of the first display frame DA (01), the first subtransistor Tr7-1 is on, and the second subtransistor Tr7-2, the third subtransistor Tr19-1, and the fourth subtransistor Tr19-2 are off so that all shift register units 20 can output an active pulse of the gate drive signal Gout. In the pixel refresh time period FS02 of the second display frame DA (02), the first subtransistor Tr7-1 and the third subtransistor Tr19-1 turn on alternately, and the second subtransistor Tr7-2 and the fourth subtransistor Tr19-2 are off; thus, some shift register units 20 can output an active pulse of the gate drive signal Gout, and the gate drive signal Gout output by some shift register units 20 is at an inactive level. This causes some shift register units 20 to output an active pulse of the gate drive signal Gout only once in the pixel refresh time period of the first display frame and the pixel refresh time period of the second display frame. In this manner, the subtransistors of the first switch unit 231 and the subtransistors of the second switch unit 232 can both briefly turn off in at least some of the pixel refresh time period of two consecutive display frames. This prevents the first switch unit 231 and the second switch unit 232 from staying on, thereby enhancing the reliability of the refresh control module 23.

Based on the previous embodiments, the working process of the display panel includes multiple display frames. The first refresh control signal controls one of the first subtransistor or the second subtransistor to stay off in the pixel refresh time period of the same display frame and controls the other of the first subtransistor or the second subtransistor to stay off in at least part of the pixel refresh time period of this display frame; and/or the second refresh control signal controls one of the third subtransistor or the fourth subtransistor to stay off in the pixel refresh time period of the same display frame and controls the other of the third subtransistor or the fourth subtransistor to stay off in at least part of the pixel refresh time period of this display frame.

In an optional embodiment, a certain display frame is a single-frequency display frame, and in the pixel refresh time period of this single-frequency display frame, the shift register unit 20 can output an active pulse of the gate drive signal Gout. At this time period, referring to the first display frame DA (01) or the second display frame DA (02) shown in FIG. 18, the second refresh control signal Goff2 can control both the third subtransistor Tr19-1 and the fourth subtransistor Tr19-2 to stay off in the pixel refresh time period of the same display frame. That is, the second refresh control signal Goff2 can control one of the third subtransistor Tr19-1 or the fourth subtransistor Tr19-2 to stay off in the pixel refresh time period of this display frame and control the other of the third subtransistor Tr19-1 or the fourth subtransistor Tr19-2 to stay off in the pixel refresh time period of this display frame.

In an optional embodiment, a certain display frame is a single-frequency display frame, and in the pixel refresh time period of this single-frequency display frame, the shift register unit 20 can output an active pulse of the gate drive signal Gout. At this time period, referring to the first display frame DA (01) or the second display frame DA (02) shown in FIG. 19, the first refresh control signal Goff1 can control both the first subtransistor Tr7-1 and the second subtransistor Tr7-2 to stay off in the pixel refresh time period of the same display frame. That is, the first refresh control signal Goff1 can control one of the first subtransistor Tr7-1 or the second subtransistor Tr7-2 to stay off in the pixel refresh time period of this display frame and control the other of the first subtransistor Tr7-1 or the second subtransistor Tr7-2 to stay off in the pixel refresh time period of this display frame.

In another optional embodiment, a certain display frame is a multi-frequency display frame, and in the pixel refresh time period of this multi-frequency display frame, some shift register units 20 can output an active pulse of the gate drive signal Gout, and the gate drive signal Gout output by some shift register units 20 is at an inactive level. At this time period, referring to the second display frame DA (02) shown in FIG. 20, the first refresh control signal Goff1 can control one of the first subtransistor Tr7-1 or the second subtransistor Tr7-2 to stay off in the pixel refresh time period of this display frame and control the other of the first subtransistor Tr7-1 or the second subtransistor Tr7-2 to stay off in at least part of the pixel refresh time period of this display frame; and the second refresh control signal Goff2 can control one of the third subtransistor Tr19-1 or the fourth subtransistor Tr19-2 to stay off in the pixel refresh time period of this display frame and control the other of the third subtransistor Tr19-1 or the fourth subtransistor Tr19-2 to stay off in at least part of the pixel refresh time period of this display frame.

In summary, in the pixel refresh time period of two adjacent display frames, each subtransistor in the first switch unit and the second switch unit can be off in at least part of the time period. This prevents prolonged conduction that affects the lifespan and threshold voltage of the transistors. Consequently, this ensures the accuracy of the gate drive signal output by the shift register unit, prevents poor writing of data signals into pixels, and thus maintains high display quality.

Figure 21:
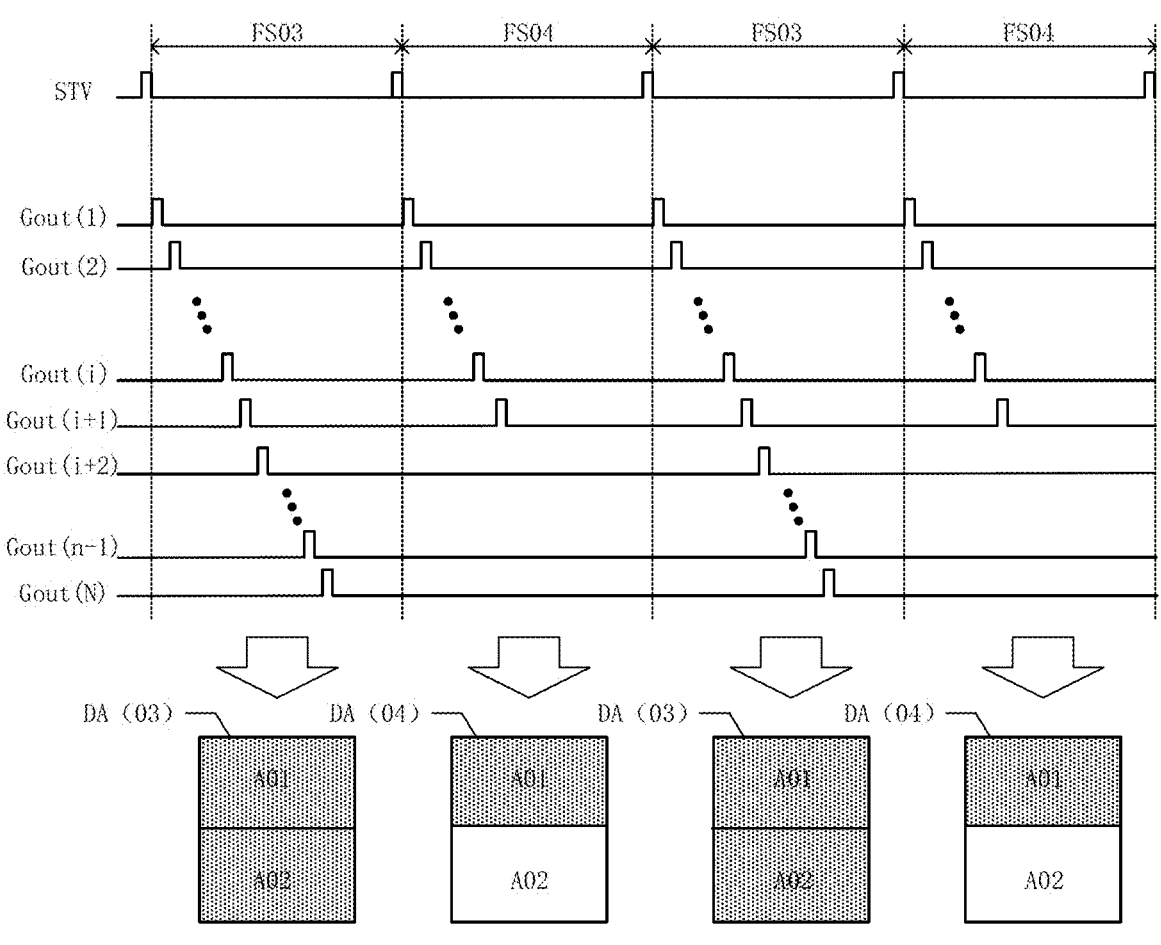
FIG. 21 is a timing diagram of a display panel in a multi-frequency drive display mode according to embodiments of the present application.

Optionally, the display panel 01 includes a multi-frequency drive display mode. FIG. 21 is a timing diagram of a display panel in a multi-frequency drive display mode according to embodiments of the present application. Referring to FIG. 21, in the multi-frequency drive display mode, the display area AA includes a high-frequency display area A01 and a low-frequency display area A02. The multi-frequency drive display mode includes multiple display periods. Each display period includes a third display frame DA (03) and at least one fourth display frame DA (04). The third display frame DA (03) is before the at least one fourth display frame DA (04). In the pixel refresh time period FS03 of the third display frame DA (03), the shift register units 20 of the driver circuit 10 successively output an active pulse of the gate drive signal Gout. In the pixel refresh time period FS04 of the fourth display frame DA (04), the gate drive signal provided by the driver circuit 10 for a pixel in the high-frequency display area A01 by the driver circuit 10 includes an active level, and the gate drive signal Gout provided for a pixel in the low-frequency display area A02 by the driver circuit 10 includes an inactive level.

In an embodiment, in the same display period, in the pixel refresh time period FS03 of the third display frame DA (03), data signals are rewritten to both pixels P located in the high-frequency display area A01 and pixels P located in the low-frequency display area A02. In the pixel refresh time period FS04 of the fourth display frame DA (04), data signals are rewritten to pixels P located in the high-frequency display area A01 while data signals are not rewritten to pixels P located in the low-frequency display area A02. In the pixel refresh time period FS04 of the fourth display frame DA (04), pixels P located in the low-frequency display area A02 retain data signals written in the pixel refresh time period FS03 of the third display frame DA (03).

For example, the display period includes the third display frame DA (03) and one fourth display frame DA (04). Referring to FIG. 21, data signals can be rewritten to pixels P located in the high-frequency display area A01 in the pixel refresh time period of each display frame, and data signals can be rewritten to pixels P located in the low-frequency display area A02 only in the pixel refresh time period FS03 of the third display frame DA (03). The refresh rate of pixels P located in the high-frequency display area A01 is twice that of pixels P located in the low-frequency display area A02. The refresh rate of pixels P located in the low-frequency display area A02 is reduced to ½ of the refresh rate of pixels P located in the high-frequency display area A01.

Understandably, when the display period includes the third display frame DA (03) and h fourth display frames DA (04), the refresh rate of pixels P located in the low-frequency display area A02 is reduced to 1/(h+1) of the refresh rate of pixels P located in the high-frequency display area A01. Here h is a positive integer.

Figure 22:
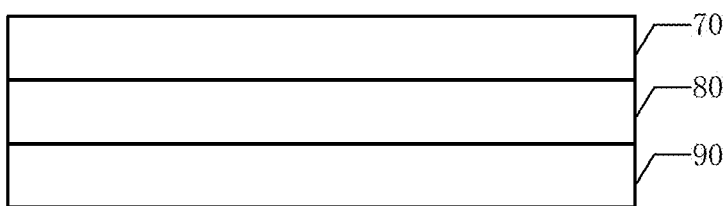
FIG. 22 is a section view of a display panel according to embodiments of the present application.

FIG. 22 is a section view of a display panel according to embodiments of the present application. Referring to FIG. 1 and FIG. 22, optionally, the display panel 01 also includes a backlight module 90, a circuit layer 80 located on the light emission side of the backlight module 90, and a liquid crystal layer 70 located on the side of the circuit layer 80 facing away from the backlight module 90; and the driver circuit 10 also includes a source driver circuit 30 configured to control multiple source drive signals.

In an embodiment, referring to FIG. 1, FIG. 3, and FIG. 22, the display area AA of the display panel 01 includes multiple pixels P. The pixel P includes a pixel electrode Vp and a common electrode Vcom. These electrodes can be located on one side or both sides of the liquid crystal layer 30 (not shown). The source driver circuit 30 can provide a source drive signal for a data line DL. When the pixel P receives an active level of the gate drive signal Gout, the signal on the data line DL can be written to the pixel P. The signal on the data line DL is a data signal. By writing the data signal on the data line DL to the pixel electrode Vp of the pixel P, it is possible to control the electric field between the pixel electrode Vp and the common electrode Vcom, altering the alignment state (not shown) of liquid crystal molecules in the liquid crystal layer 30, making the light transmission adjusted, and achieving the desired display grayscale level for the pixel P.

For example, referring to FIG. 1, the source driver circuit 30 in the driver circuit 10 is electrically connected to multiple data lines DL. In the pixel refresh time period of one row of pixels P, the source driver circuit 30 can provide multiple source drive signals for these data lines DL. In the pixel refresh time period of the next row of pixels P, the source driver circuit 30 can provide multiple source drive signals for multiple data lines DL again. The amplitude and polarity of the source drive signals provided for the same data line DL by the source driver circuit 30 may vary in the pixel refresh time period of different rows of pixels P.

Figure 23:
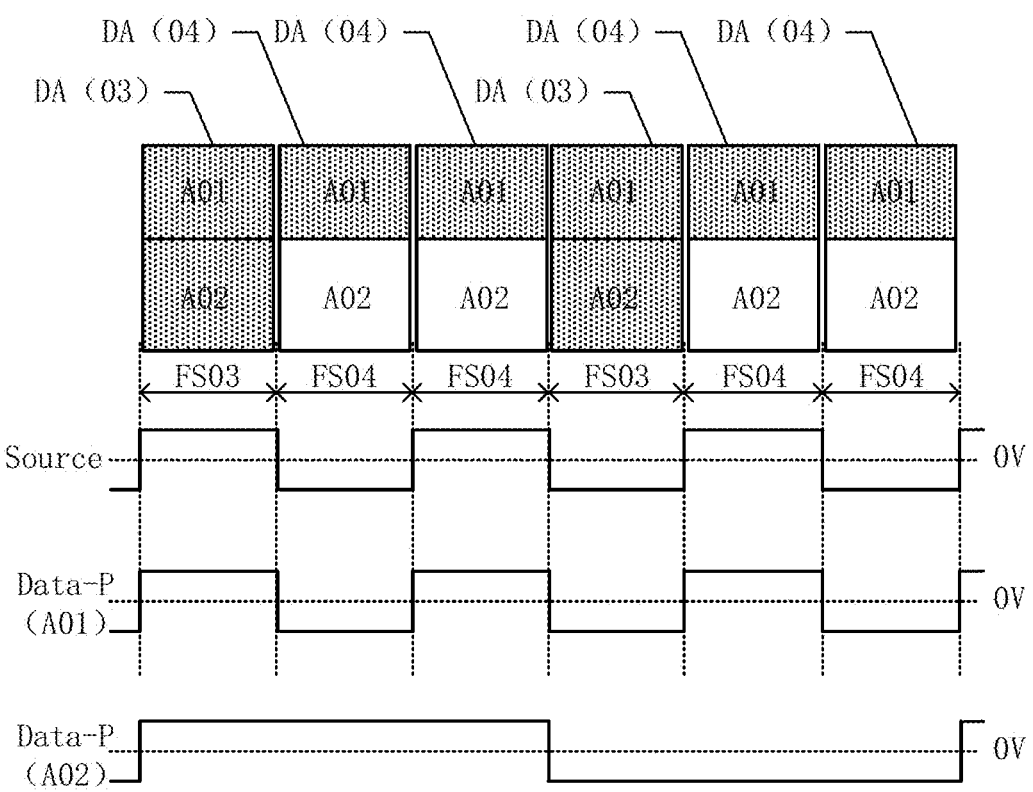
FIG. 23 is a timing diagram of a display panel in a multi-frequency drive display mode according to embodiments of the present application.

In an optional embodiment, FIG. 23 is a timing diagram of a display panel in a multi-frequency drive display mode according to embodiments of the present application. Referring to FIG. 23, for each of the third display frame DA (03) or the at least one fourth display frame DA (04), the polarity source drive signal Source in the pixel refresh time period of a third display frame DA (03) or fourth display frame DA (04) is different from the polarity source drive signal Source in the pixel refresh time period of an adjacent third display frame DA (03) or fourth display frame DA (04). Additionally, each source drive signal Source in the pixel refresh time period FS03/FS04 of the same third display frame DA (03) or fourth display frame DA (04) has the same polarity.

In an embodiment, the source driver circuit 30 provides source drive signals Source having the same polarity for the data lines DL in the pixel refresh time period of the same display frame and provides source drive signals Source having a polarity different from the preceding polarity in the pixel refresh time period of an adjacent display frame. That is, if the source driver circuit 30 provides source drive signals Source having a positive polarity for the data lines DL in the pixel refresh time period of a certain display frame, then the source driver circuit 30 provides source drive signals Source having a negative polarity in the pixel refresh time period of an earlier adjacent display frame or a later adjacent display frame; or if the source driver circuit 30 provides source drive signals Source having a negative polarity for the data lines DL in the pixel refresh time period of a certain display frame, then the source driver circuit 30 provides source drive signals Source having a positive polarity in the pixel refresh time period of an earlier adjacent display frame or a later adjacent display frame.

For example, if the source driver circuit 30 provides source drive signals Source having a positive polarity for the data lines DL in the pixel refresh time period of the same display frame, then the polarity of the data signals Data-P (A01) in pixels P located in the high-frequency display area A01 and the polarity of the data signals Data-P (A02) in pixels P located in the low-frequency display area A02 are both positive. In the pixel refresh time period FS04 of the fourth display frame DA (04), the polarity of the data signals Data-P (A01) in pixels P located in the high-frequency display area A01 may be consistent with the polarity of the source drive signals Source, allowing the polarity of signals of the pixel electrodes Vp of pixels P in the high-frequency display area A01 to switch between different display frames. In the pixel refresh time period FS04 of the fourth display frame DA (04), the polarity of the data signals Data-P (A02) in pixels P located in the low-frequency display area A02 remains unchanged and stays positive, making the polarity of the data signals Data-P (A02) in pixels P in the low-frequency display area A02 stay positive in the display period.

When the display period includes an odd number of display frames, that is, one third display frame DA (03) and an even number of fourth display frames DA (04), as shown in FIG. 23, in the next display period, in the pixel refresh time period FS03 of the third display frame DA (03), the source driver circuit 30 provides source drive signals Source having a negative polarity. The polarity of the data signals Data-P (A02) in pixels P located in the low-frequency display area A02 can stay negative in this display period. Consequently, over consecutive display periods, the polarity of the data signals Data-P (A02) in pixels P located in the low-frequency display area A02 can switch in the pixel refresh time period FS03 of the third display frame DA (03) of different display periods. The polarity of the signals of the pixel electrodes Vp of pixels P located in the high-frequency display area A01 can switch in the pixel refresh time period of different display frames. Meanwhile, the polarity of the signals of the pixel electrodes Vp of pixels P located in the low-frequency display area A02 can switch in the pixel refresh time period of different display periods. This helps prevent the polarization of liquid crystal molecules in both the high-frequency display area A01 and the low-frequency display area A02, thereby improving the display quality.

Figure 24:
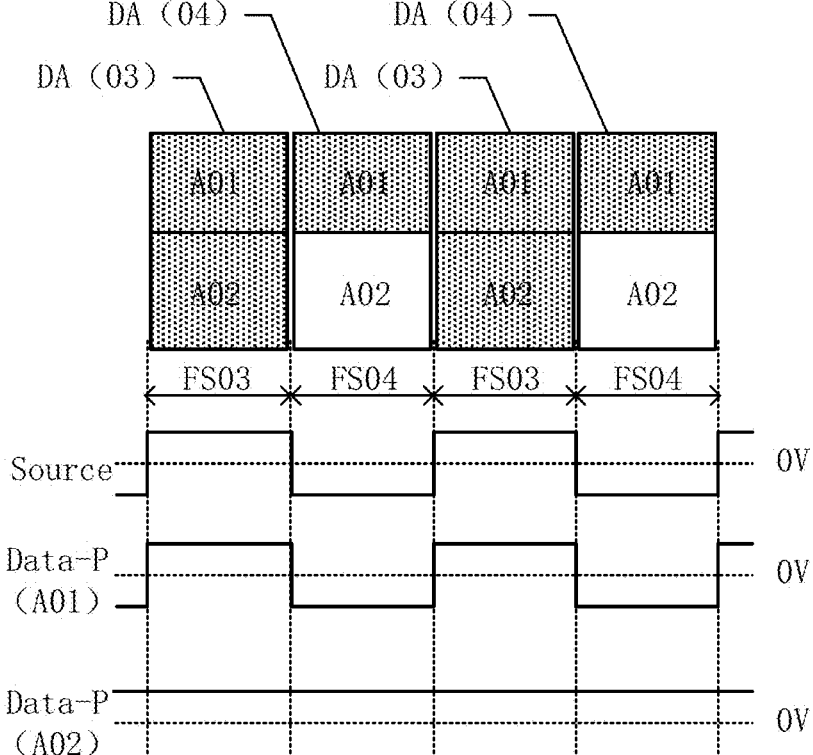
FIG. 24 is a timing diagram of a display panel in a multi-frequency drive display mode according to embodiments of the present application.

However, when the display period includes an even number of display frames, that is, one third display frame DA (03) and an odd number of fourth display frames DA (04), as shown in FIG. 24, in the next display period, in the pixel refresh time period FS03 of the third display frame DA (03), the source driver circuit 30 provides source drive signals Source having a positive polarity. The polarity of the data signals Data-P (A02) in pixels P located in the low-frequency display area A02 can stay positive in this display period. Consequently, over consecutive display periods, the polarity of the data signals Data-P (A02) in pixels P located in the low-frequency display area A02 can stay positive. If the signals of the pixel electrodes Vp of pixels P located in the low-frequency display area A02 have a certain polarity for a long time period, polarization of the liquid crystal molecules in the low-frequency display area A02 may occur. This may lead to image retention on the display panel 01, thereby affecting the display quality.

Figure 25:
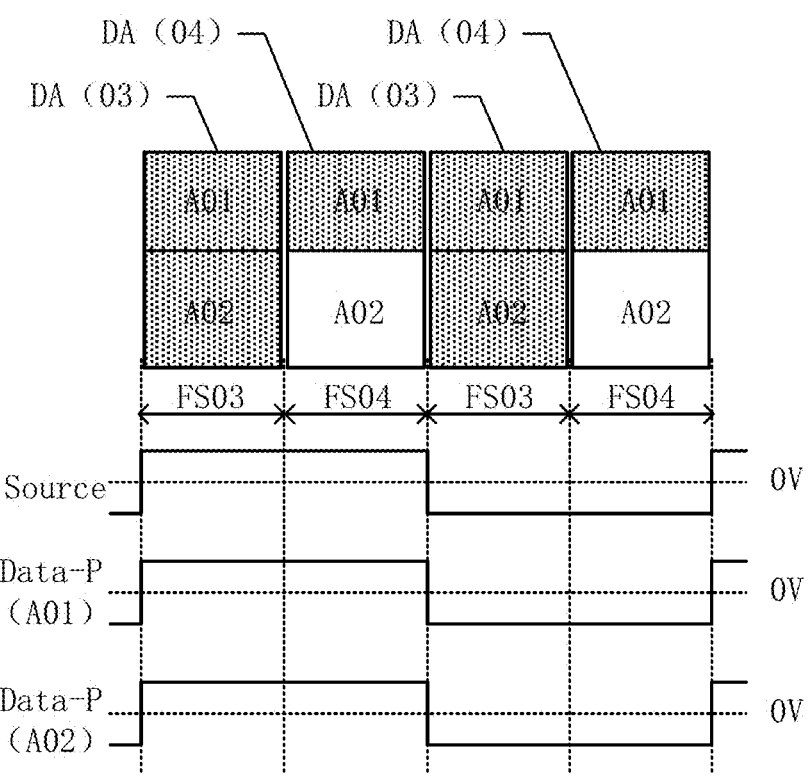
FIG. 25 is a timing diagram of a display panel in a multi-frequency drive display mode according to embodiments of the present application.

In another optional embodiment, FIG. 25 is a timing diagram of a display panel in a multi-frequency drive display mode according to embodiments of the present application. Referring to FIG. 25, for each display period, the polarity source drive signal Source in the pixel refresh time period of a display period is different from the polarity source drive signal Source in the pixel refresh time period of an adjacent display period, and each source drive signal Source in the pixel refresh time period of the same display period has the same polarity.

For example, in the pixel refresh time period FS03 of the third display frame DA (03) in the current display period and the pixel refresh time period FS04 of the fourth display frame DA (04) in the current display period, the source driver circuit 30 provides a source drive signal Source having a positive polarity to the data line DL, making positive both the polarity of the signals of the pixel electrodes Vp of pixels P located in the high-frequency display area A01 and the polarity of the signals of the pixel electrodes Vp of pixels P located in the low-frequency display area A02; and in the pixel refresh time period FS03 of the third display frame DA (03) in the next display period and the pixel refresh time period FS04 of the fourth display frame DA (04) in the next display period, the source driver circuit 30 provides a source drive signal Source having a negative polarity to the data line DL, making negative both the polarity of the signals of the pixel electrodes Vp of pixels P located in the high-frequency display area A01 and the polarity of the signals of the pixel electrodes Vp of pixels P located in the low-frequency display area A02. Thus, regardless of whether the display period includes an odd number of display frames or an even number of display frames or whether the display period includes an even number of fourth display frames DA (04) or an odd number of fourth display frames DA (04), both the polarity of the signals of the pixel electrodes Vp of pixels P located in the high-frequency display area A01 and the polarity of the signals of the pixel electrodes Vp of pixels P located in the low-frequency display area A02 can switch in the pixel refresh time period of different display periods, effectively preventing the polarization of liquid crystal molecules in both the high-frequency display area A01 and the low-frequency display area A02 and thereby improving the display quality.

Figure 26:
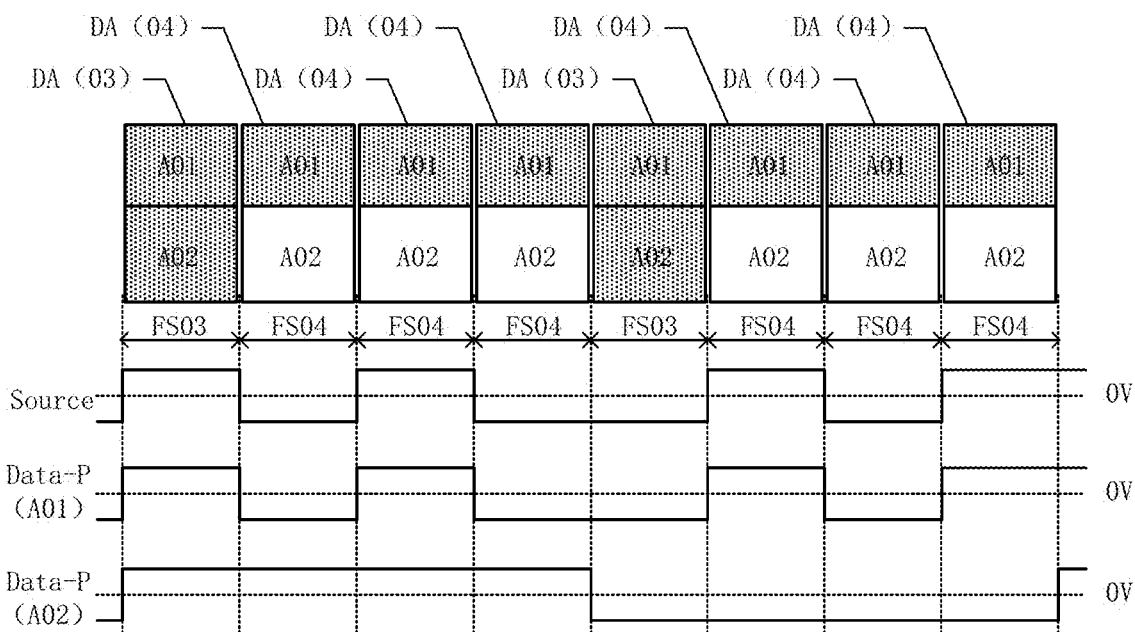
FIG. 26 is a timing diagram of a display panel in a multi-frequency drive display mode according to embodiments of the present application.

In another optional embodiment, FIG. 26 is a timing diagram of a display panel in a multi-frequency drive display mode according to embodiments of the present application. Referring to FIG. 26, the display period includes an odd number of fourth display frames DA (04); and in the same display period, for each of the third display frame DA (03) or the display frames DA (04), the polarity source drive signal Source in the pixel refresh time period FS03/FS04 of a third display frame DA (03) or fourth display frame DA (04) is different from the polarity source drive signal Source in the pixel refresh time period of an adjacent third display frame or fourth display frame, and each source drive signal Source in the pixel refresh time period of the same third display frame or fourth display frame has the same polarity. The polarity source drive signal Source in the pixel refresh time period FS04 of the last fourth display frame DA (04) in the display period is the same as the polarity source drive signal Source in the pixel refresh time period FS03 of the third display frame DA (03) in the next and adjacent display period.

In an embodiment, the source driver circuit 30 provides source drive signals Source having the same polarity for the data lines DL in the pixel refresh time period of the same display frame and provides source drive signals Source having a polarity different from the preceding polarity in the pixel refresh time period of an adjacent display frame in the same display period; and in different display periods, the polarity of the source drive signal Source provided for the data line DL by the source driver circuit 30 in the pixel refresh time period of the last display frame in the current display period is the same as the polarity of the source drive signal Source provided for the data line DL by the source driver circuit 30 in the pixel refresh time period of the first display frame in the next display period.

For example, referring to FIG. 26, if the source driver circuit 30 provides source drive signals Source having a positive polarity for the data lines DL in the pixel refresh time period FS03 of the third display frame DA (03) in the current display period, then the source driver circuit 30 provides source drive signals Source having a negative polarity in the pixel refresh time period FS04 of the last fourth display frame DA (04) in the current display period and provides source drive signals Source having a negative polarity in the pixel refresh time period FS03 of the third display frame DA (03) in the next display period so that the polarity of the data signals Data-P (A02) in pixels P in the low-frequency display area A02 is positive in the current display period and is negative in the next display period. Thus, the polarity of the signals of the pixel electrodes Vp of pixels P located in the low-frequency display area A02 can switch in the pixel refresh time period of different display periods; and the polarity of the signals of the pixel electrodes Vp of pixels P located in the high-frequency display area A01 can switch in the pixel refresh time period of different display frames in the same display period, thereby better mitigating liquid crystal polarization.

In FIGS. 23 to 26, that the potential of the source drive signal Source is above 0 V indicates that the polarity of the source drive signal Source provided for the data line DL by the source driver circuit 30 is positive; and that the potential of the source drive signal Source is below 0 V indicates that the polarity of the source drive signal Source provided for the data line DL by the source driver circuit 30 is negative. In practical use, the source driver circuit 30 may provide different source drive signals Source for the data lines DL and may provide different source drive signals Source for the same data line DL in the refresh time period of different rows of pixels. In FIGS. 23 to 26, that the potential of the data signal Data-P (A01) is above 0 V or below 0 V indicates that the data signal Data-P (A01) written to a pixel P in the high-frequency display area A01 has a positive polarity or a negative polarity; but in practical use, different data signals Data-P (A01) may be written to different pixels P in the high-frequency display area A01. In FIGS. 23 to 26, that the potential of the data signal Data-P (A02) is above 0 V or below 0 V indicates that the data signal Data-P (A02) written to a pixel P in the low-frequency display area A02 has a positive polarity or a negative polarity; but in practical use, different data signals Data-P (A02) may be written to different pixels P in the low-frequency display area A02.

Figure 27:
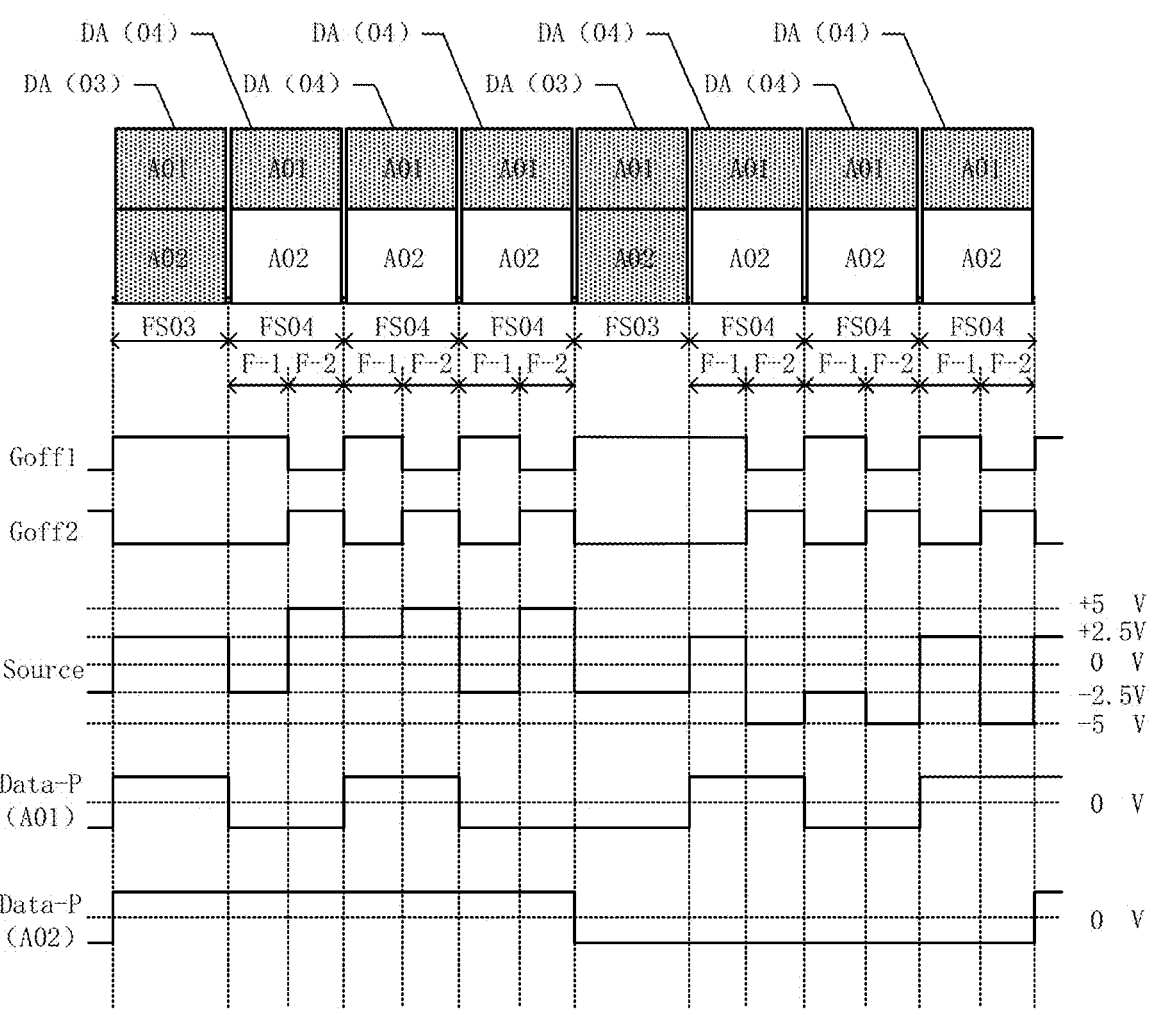
FIG. 27 is a timing diagram of a display panel in a multi-frequency drive display mode according to embodiments of the present application.

FIG. 27 is a timing diagram of a display panel in a multi-frequency drive display mode according to embodiments of the present application. Optionally, referring to FIG. 1 and FIG. 27, the driver circuit 10 also includes a source driver circuit 30 configured to control multiple source drive signals Source; and the pixel refresh time period FS04 of each fourth display frame DA (04) includes a high-frequency pixel refresh time period F-1 and a low-frequency pixel refresh time period F-2, the high-frequency pixel refresh time period F-1 overlaps the active pulse of the first refresh control signal Goff1, and the low-frequency pixel refresh time period F-2 overlaps the active pulse of the second refresh control signal Goff2. In the low-frequency pixel refresh time period F-2 of each fourth display frame DA (04) in each display period, each source drive signal Source includes a highest level 5 V, and the highest level 5 V of each source drive signal Source corresponds to the highest pixel display grayscale, for example, 255.

For example, the active level is a high level, and the inactive level is a low level. Referring to FIGS. 1, 4, 5, and 27, in the high-frequency pixel refresh time period F-1 of the fourth display frame DA (04): The first refresh control signal Goff1 is at an active level, and the second refresh control signal Goff2 is at an inactive level. This configuration enables the refresh control module 23 in the shift register unit 20 to turn on. The shift register unit 20 can provide an active level of the gate drive signal Gout to pixels P in the high-frequency display area A01, and data signals on the data lines DL can be written to these pixels P. At this stage, the source drive signals Source provided for the data lines DL by the source driver circuit 30 can be written to pixels P in the high-frequency display area A01, and data signals Data-P (A02) in pixels P in the low-frequency display area A02 are signals written in the pixel refresh time period FS03 of the third display frame DA (03) in this display period.

In the low-frequency pixel refresh time period F-2 of the fourth display frame DA (04): The first refresh control signal Goff1 is at an inactive level, and the second refresh control signal Goff2 is at an active level. This configuration enables the refresh control module 23 in the shift register unit 20 to turn off. The shift register unit 20 can provide an inactive level of the gate drive signal Gout to pixels P in the low-frequency display area A02, and data signals on the data lines DL cannot be written to these pixels P. At this stage, data signals Data-P (A01) in pixels P in the high-frequency display area A01 are signals written in the high-frequency pixel refresh time period F-1 of the fourth display frame DA (04), and data signals Data-P (A02) in pixels P in the low-frequency display area A02 are signals written in the pixel refresh time period FS03 of the third display frame DA (03) in this display period.

In the high-frequency pixel refresh time period F-1 and the low-frequency pixel refresh time period F-2 of all the fourth display frames DA (04) in the same display period, data signals Data-P (A02) in pixels P in the low-frequency display area A02 are required to be signals written in the pixel refresh time period FS03 of the third display frame DA (03) in this display period. By controlling the source drive signal Source to be at the highest level for at least part of the low-frequency pixel refresh time period F-2 of the at least one fourth display frame DA (04) in the display period, that is, controlling the source drive signal Source to be at the level corresponding to the highest display grayscale of pixel P in at least part of the time period, it is feasible to provide the highest level of the source drive signal Source for the data line DL in the low-frequency pixel refresh time period F-2 when the source driver circuit 30 is not required to provide the source drive signal Source corresponding to the pixel P in the high-frequency display area A01 for the data line DL. Data signals DL of the highest display grayscale are precharged to the data lines DL, allowing the charge on the data line DL to leak to the pixel P located in the low-frequency display area A02, reducing the charge leakage from the pixel P to the data line DL caused by the pixel P in the low-frequency display area A02 holding a fixed data signal Data-P (A02) for a long time period. Therefore, in the pixel refresh time period FS03 of the third display frame DA (03) of the next display period, when new data signals Data-P (A02) are written to pixels P in the low-frequency display area A02, the voltage amplitude change is reduced, and low-frequency flickers are mitigated. Additionally, in the low-frequency pixel refresh time period F-2, the data signal of the highest display grayscale is precharged to the data line DL, facilitating the charge leakage from the data line DL to the pixel P in the low-frequency display area A02 in the low-frequency pixel refresh time period F-2, regardless of the display grayscale of the pixel P in the low-frequency display area A02. This effectively reduces the charge leakage from all pixels P in the low-frequency display area A02 to the data line DL. Thus, in the pixel refresh time period FS03 of the third display frame DA (03) in the next display period, the voltage amplitude change of the data signal Data-P (A02) of the pixel P located in the low-frequency display area A02 is reduced, and low-frequency flickers are mitigated.

In an optional embodiment, referring to FIG. 27, the polarity source drive signal Source in the low-frequency pixel refresh time period F-2 is the same as the polarity source drive signal Source in the pixel refresh time period F03 of the third display frame DA (03) in the same display period.

In an embodiment, the source driver circuit 30 provides source drive signals Source having the same polarity for the data lines DL in the pixel refresh time period of the same display frame; and in the same display period, the polarity of the data signals Data-P (A02) in pixels Pin the low-frequency display area A02 is the polarity source drive signal Source in the pixel refresh time period F03 of the third display frame DA (03). In the low-frequency pixel refresh time period F-2, the polarity of the source drive signal Source provided for each data line DL is the same as the polarity of the data signals Data-P (A02) in pixels P in the low-frequency display area A02. This ensures that the data signal of the highest display grayscale precharged to the data line DL is the same as the polarity of the data signals Data-P (A02) in pixels P in the low-frequency display area A02. This helps effectively reduce current leakage.

The highest level of the source drive signal Source is +5 V or −5 V in FIG. 27 by way of example. Embodiments of the present application do not limit the highest level of the source drive signal Source.

The level of +2.5 V or −2.5 V of the source drive signal Source in FIG. 27 indicates that the positive or negative polarity of the source drive signal Source provided for each data line DL by the source driver circuit 30 and that the source drive signal Source provided for the data line DL by the source driver circuit 30 includes the level corresponding to a non-highest display grayscale. This is not a limitation on the source drive signal Source. In practical use, the source driver circuit 30 may provide different source drive signals Source for the data lines DL and may provide different source drive signals Source for the same data line DL in the refresh time period of different rows of pixels.

Figure 28:
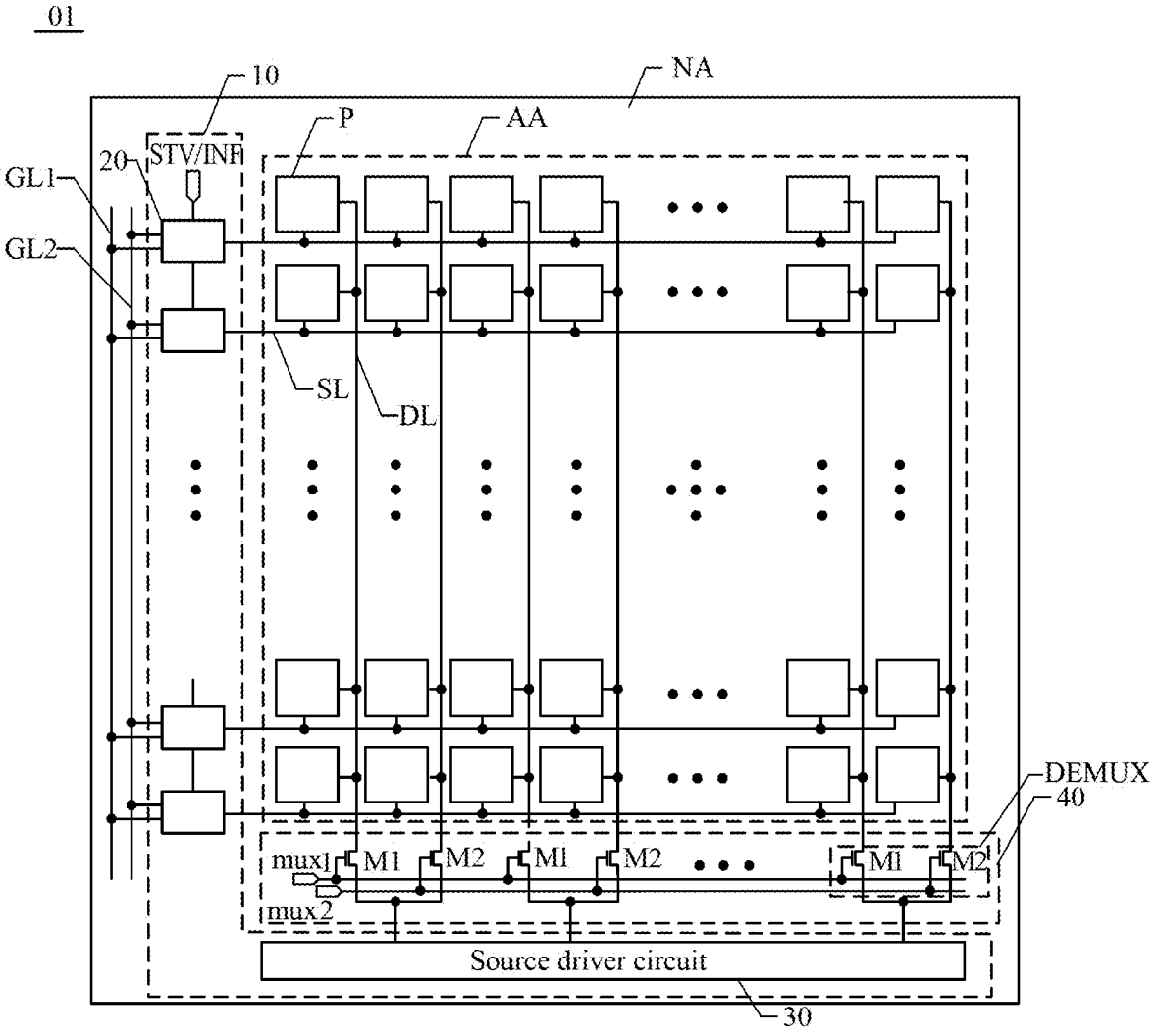
FIG. 28 is a top view of a display panel according to embodiments of the present application.
Figure 29:
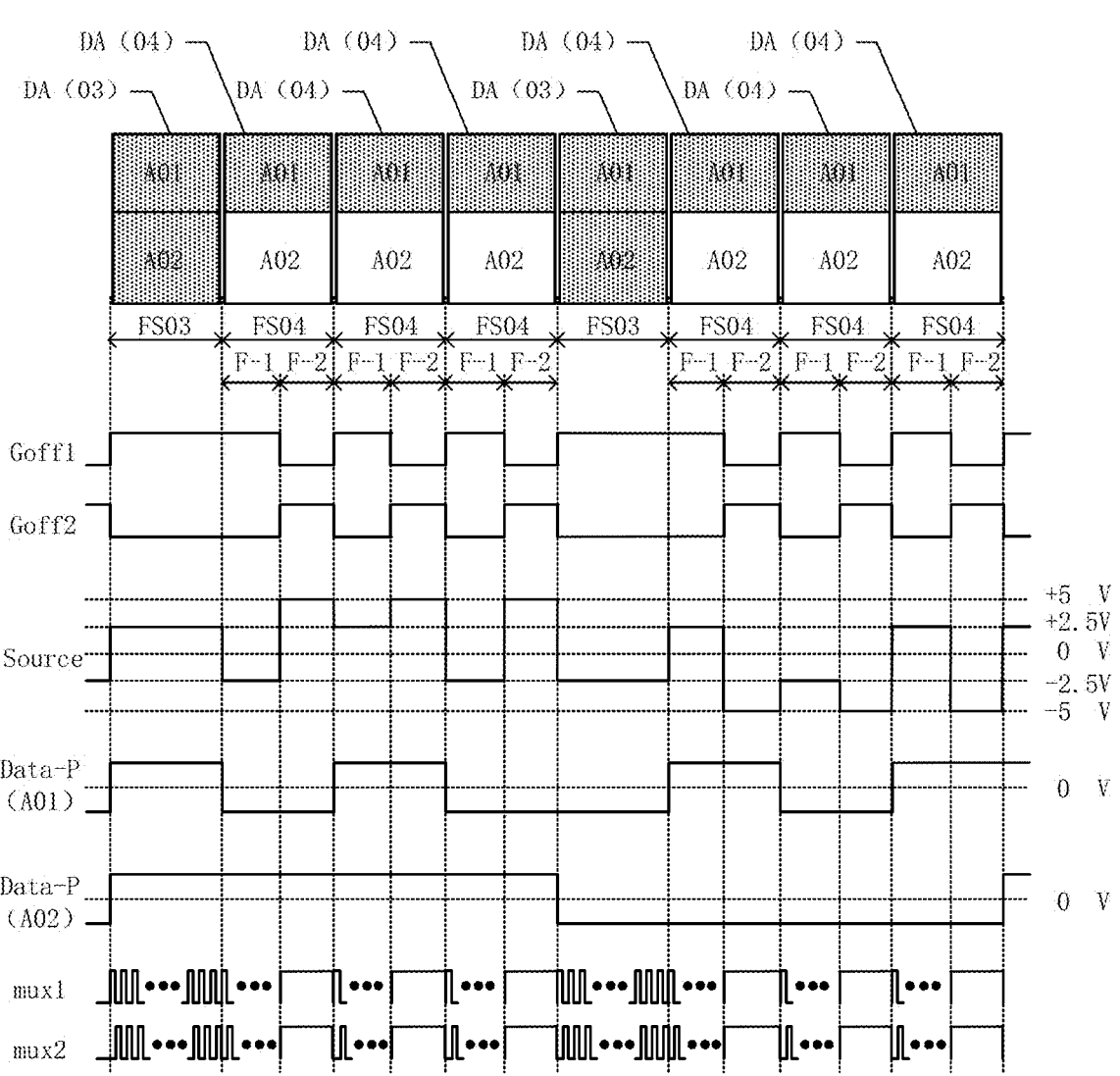
FIG. 29 is a timing diagram of a display panel in a multi-frequency drive display mode according to embodiments of the present application.

FIG. 28 is a top view of a display panel according to embodiments of the present application. FIG. 29 is a timing diagram of a display panel in a multi-frequency drive display mode according to embodiments of the present application. Based on the previous embodiments, referring to FIG. 28 and FIG. 29, the display panel 01 also includes a gating circuit 40 configured to receive at least gating control signals (mux1, mux2) and various source drive signals Source and control data signals on the data lines DL according to the gating control signals (mux1, mux2). The low-frequency pixel refresh time period F-2 of the at least one fourth display frame DA (04) in a display period overlaps active pulses of the gating control signals (mux1, mux2).

For example, the gating circuit 40 includes multiple demultiplexing circuits DEMUX. The DEMUX includes a first gating transistor M1 and a second gating transistor M2. The first terminal of the first gating transistor M1 and the first terminal of the second gating transistor M2 are electrically connected to the source driver circuit 30 and configured to receive the source drive signal Source. The second terminal of the first gating transistor M1 is electrically connected to pixels Pin an odd-numbered column via a data line DL. The second terminal of the second gating transistor M2 is electrically connected to pixels P in an even-numbered column via a data line DL. The gate of the first gating transistor M1 receives a first gating control signal mux1. The gate of the second gating transistor M2 receives a second gating control signal mux2. The gating circuit 40 can transmit the source drive signals Source to the data line DL electrically connected to pixels P in an odd-numbered column and the data line DL electrically connected to pixels P in an even-numbered column in a time period-sharing manner according to the first gating control signal mux1 and the second gating control signal mux2.

In the third display frame DA (03) of the display period, the pixel refresh time period FS03 of the third display frame DA (03) overlaps an active pulse of the first gating control signal mux1 and an active pulse of the second gating control signal mux2. This ensures that at this phase, multiple source signals Source provided by the source driver circuit 30 can be transmitted to all data lines DL. In the pixel refresh time period FS03 of the third display frame DA (03) in the display period, the first gating control signal mux1 and the second gating control signal mux2 each include multiple time periods of active levels. In the row pixel refresh time period, the active pulses of the first gating control signal mux1 and the second gating control signal mux2 shift consecutively. This allows the gating circuit 40 to transmit the source drive signals Source corresponding to all rows of pixels P to the data lines DL, enabling corresponding signals to be written to pixels P and enabling corresponding grayscales to be displayed.

In the fourth display frame DA (04) in the display period, the high-frequency pixel refresh time period F-1 of the fourth display frame DA (04) also overlaps the active pulses of the first gating control signal mux1 and the second gating control signal mux2. This enables the gating circuit 40 to transmit the source drive signals Source corresponding to all rows of pixels P in the high-frequency display area A01 to the data lines DL, enabling corresponding signals to be written to pixels P in the high-frequency display area A01 and enabling corresponding grayscales to be displayed.

The low-frequency pixel refresh time period F-2 of the at least one fourth display frame DA (04) in a display period overlaps the active pulses of the first gating control signal mux1 and the second gating control signal mux2. This allows the gating circuit 40 to transmit the highest-level source driving signal Source to the data line DL. This effectively reduces the charge leakage from all pixels P in the low-frequency display area A02 to the data line DL. Thus, in the pixel refresh time period FS03 of the third display frame DA (03) in the next display period, the voltage amplitude change of the data signal Data-P (A02) of the pixel P located in the low-frequency display area A02 is reduced, and low-frequency flickers are mitigated.

In an optional embodiment, the active pulse widths of the gating control signals (mux1, mux2) overlapping the low-frequency pixel refresh time period F-2 of the fourth display frame DA (04) of the display period are equal to the active pulse widths of the gating control signals (mux1, mux2) overlapping the high-frequency pixel refresh time period F-1 of the fourth display frame DA (04); and/or the active pulse widths of the gating control signals (mux1, mux2) overlapping the low-frequency pixel refresh time period F-2 of the fourth display frame DA (04) of the display period are equal to the active pulse widths of the gating control signals (mux1, mux2) overlapping the pixel refresh time period FS03 of the third display frame DA (03). Thus, in the pixel refresh time period of different display frames in the display period, the gating control signals (mux1, mux2) remain the same. In the low-frequency pixel refresh time period F-2 of the fourth display frame DA (04) in the display period, there is no need to change the gating control signals (mux1, mux2). This helps simplify the timing, reduce power consumption, and also contribute to shortening the development cycle and lowering the development costs.

In another optional embodiment, the active pulse widths of the gating control signals (mux1, mux2) overlapping the low-frequency pixel refresh time period F-2 are greater than the active pulse widths of the gating control signals (mux1, mux2) overlapping the pixel refresh time period FS03 of the third display frame DA (03) and are also greater than the active pulse widths of the gating control signals (mux1, mux2) overlapping the high-frequency pixel refresh time period F-1.

In the pixel refresh time period FS03 of the third display frame DA (03), the first refresh control signal Goff1 is at an active level, the second refresh control signal Goff2 is at an inactive level, and the shift register unit 20 can provide an active level of the gate drive signal Gout to the pixel P, causing the switch device in the pixel P to turn on, allowing the data signal on the data line DL to be written to the pixel P in a short time period. The active pulse widths of the gating control signals (mux1, mux2) overlapping the pixel refresh time period FS03 of the third display frame DA (03) are relatively narrow. This means the time period for the gating circuit 40 to transmit the source drive signal Source to the data line DL is short. With this configuration, without affecting the writing of the corresponding data signal to the pixel P, the row pixel refresh time period can be shortened. This is beneficial for increasing the refresh rate and improving the display effect.

In the high-frequency pixel refresh time period F-1, the first refresh control signal Goff1 is at an active level, the second refresh control signal Goff2 is at an inactive level, and the shift register unit 20 can provide an active level of the gate drive signal Gout to the pixel P in the high-frequency display area A01, causing the switch device in the pixel P in the high-frequency display area A01 to turn on, allowing the data signal on the data line DL to be written to the pixel P in the high-frequency display area A01 in a short time period. The active pulse widths of the gating control signals (mux1, mux2) overlapping the high-frequency pixel refresh time period F-1 are relatively narrow. This means the time period for the gating circuit 40 to transmit the source drive signal Source to the data line DL is relatively short. With this configuration, without affecting the writing of the corresponding data signal to the pixel P, the row pixel refresh time period can be shortened. This is beneficial for increasing the refresh rate and improving the display effect.

In the low-frequency pixel refresh time period F-2, the first refresh control signal Goff1 is at an inactive level, the second refresh control signal Goff2 is at an active level, and the shift register unit 20 provides an inactive level of the gate drive signal Gout to the pixel P in the low-frequency display area A02, causing the switch device in the pixel P in the high-frequency display area A01 to turn off. The active pulse widths of the gating control signals (mux1, mux2) overlapping the low-frequency pixel refresh time period F-2 are relatively wide. This means the time period for the gating circuit 40 to transmit the source drive signal Source to the data line DL is relatively long. The active pulse widths of the gating control signals (mux1, mux2) overlapping the low-frequency pixel refresh time period F-2 are set to be relatively wide, allowing the charge on the data line DL to have enough time period to slowly leak to the pixel P in the low-frequency display area A02. This can effectively reduce the charge leakage from the pixel P in the low-frequency display area A02 to the data line DL. Thus, in the pixel refresh time period FS03 of the third display frame DA (03) in the next display period, the voltage amplitude variation of the data signal Data-P (A02) of the pixel P in the low-frequency display area A02 is reduced, thereby mitigating the low-frequency flickers. This avoids having too short a time period for the gating circuit 40 to transmit the source drive signal Source to the data line DL in the low-frequency pixel refresh time period F-2. In other words, this prevents the data line DL from having too short a precharge time period in which the highest-level source drive signal is precharged in the low-frequency pixel refresh time period F-2, failing to effectively mitigate low-frequency flickers.

In another optional embodiment, in the low-frequency pixel refresh time period F-2, the active pulses of the gating control signals (mux1 and mux2) that control different gating transistors overlap. In this manner, the demultiplexing circuit DEMUX can transmit the source drive signals Source to the data line DL electrically connected to pixels P in an odd-numbered column and the data line DL electrically connected to pixels P in an even-numbered column simultaneously. This helps to widen the active pulse widths of the gating control signals (mux1, mux2) overlapping the low-frequency pixel refresh time period F-2, thereby mitigating low-frequency flickers.

Figure 30:
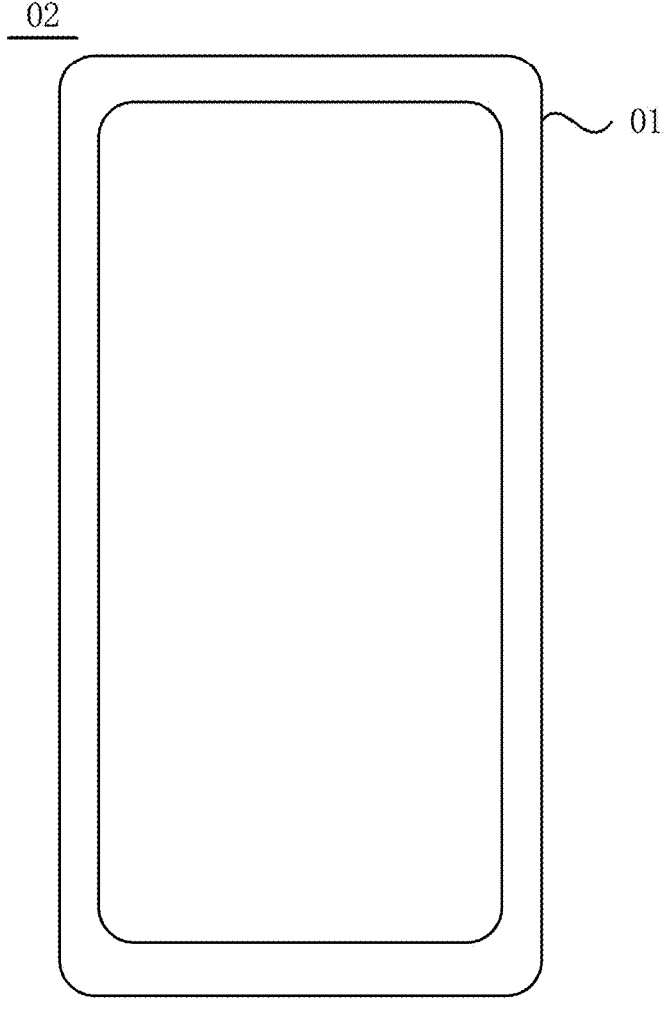
FIG. 30 is a diagram illustrating the structure of a display device according to embodiments of the present application.

Based on the same inventive concept, embodiments of the present application also provide a display device. FIG. 30 is a diagram illustrating the structure of a display device according to embodiments of the present application. Referring to FIG. 30, the display device 02 includes the display panel 01 of any embodiment of the present application. The display device 02 of embodiments of the present application may be the cellphone shown in FIG. 30 or may be any other electronic product having a display function. The electronic product includes, but is not limited to, a television, a laptop, a desktop display, a tablet, a digital camera, a smart bracelet, smart glasses, an in-vehicle display, a medical device, an industrial control device, or an interactive touch terminal. Embodiments of the present application are not limited to these examples.

It is to be noted that the preceding are preferred embodiments of the present application and technical principles used therein. It will be understood by those skilled in the art that the present disclosure is not limited to the specific embodiments described herein. Those skilled in the art can make various apparent modifications, adaptations and substitutions without departing from the scope of the present disclosure. Therefore, although the present application has been described in detail through the preceding embodiments, the present application is not limited to the preceding embodiments and may include other equivalent embodiments without departing from the concept of the present application. The scope of the present application is determined by the scope of the appended claims.

What is claimed is:

1. A display panel, comprising a driver circuit, wherein the driver circuit comprises N shift register units which are cascaded, wherein N is a positive integer;

a shift register unit of the N shift register units comprises an input module, a reset module, a refresh control module, and at least one output module; and in a same shift register unit of the N shift register units:

the input module is configured to receive an input signal and control a signal of a first node;

the reset module is configured to control a signal of a second node; and the output module is configured to, within at least part of a working time period of the display panel, receive the signal of the first node, the signal of the second node, a first level signal, and an output clock signal and output a gate drive signal; and wherein the refresh control module comprises a first switch unit and a second switch unit;

the first switch unit is configured to receive at least the signal of the first node and the first refresh control signal and control a transmission path for transmission of the signal of the first node to a third node to control a time interval during which the third node is at an active level;

the second switch unit is configured to receive at least the first level signal and the second refresh control signal and control a time period during which the third node is at the inactive level; and the output module is configured to receive at least a signal of the third node, to control the output clock signal to be output as the gate drive signal when the signal of the third node is at the active level, and to control the first level signal to be output as the gate drive signal when the signal of the second node is at an active level.

2. The display panel of claim 1, wherein a time interval between an active pulse of the first refresh control signal and an active pulse of the second refresh control signal is $\Delta t$, and wherein $\Delta t \geq 100$ ns.

3. The display panel of claim 1, wherein before the shift register unit outputs an active pulse of the gate drive signal, an overlap time period between an active pulse time period of the first refresh control signal and an active pulse time period of the input signal received by the input module of the shift register unit is $\Delta t'$, wherein $\Delta t' > 0$.

4. The display panel of claim 3, wherein $\Delta t' \geq$ half of an active pulse width of the input signal.

5. The display panel of claim 1, wherein the shift register unit further comprises a shift module; and in a jth-stage shift register unit of the N cascaded shift register units, the shift module is configured to receive at least the signal of the first node and the output clock signal and control, according to the signal of the first node, a transmission path for transmission of the output clock signal as a shift input signal to the input module of at least one of an ith-stage shift register unit or a kth-stage shift register unit of the N cascaded shift register units, wherein i, j, and k are each a positive integer, wherein $1 \leq i < j < k \leq N$.

6. The display panel of claim 5, wherein the shift register unit comprises Y output modules, wherein Y is an integer greater than 1; and in the same shift register unit, the Y output modules are configured to receive different output clock signals, and active pulses of the different output clock signals received by the shift register unit are successively shifted.

7. The display panel of claim 6, wherein in the same shift register unit, an output clock signal received by an xth output module of the Y output modules is an xth output clock signal, and an active pulse time period of the xth output clock signal is before an active pulse time period of an (x+1)th output clock signal, wherein x is a positive integer, and x is less than Y; and the shift module is configured to receive at least the signal of the first node and the output clock signal received by an Yth output module of the Y output modules and control, according to the signal of the first node, a transmission path for transmission of the output clock signal received by the Yth output module as the shift input signal to the at least one of the ith-stage shift register unit or the kth-stage shift register unit of the N cascaded shift register units.

8. The display panel of claim 1, wherein at least one of the following is satisfied: the first switch unit comprises a first subtransistor and a second subtransistor that are connected in parallel, or the second switch unit comprises a third subtransistor and a fourth subtransistor that are connected in parallel; and at least one of the following is satisfied: the first refresh control signal is configured to control a conduction state of the first subtransistor and a conduction state of the second subtransistor, or the second refresh control signal is configured to control a conduction state of the third subtransistor and a conduction state of the fourth subtransistor.

9. The display panel of claim 8, comprising a plurality of display frames, wherein within at least part of a working time period of the display panel, two adjacent display frames of the plurality of display frames are a first display frame and a second display frame; and at least one of the following is satisfied:

in at least part of a pixel refresh time period of the first display frame, the first refresh control signal is configured to control the first subtransistor to stay on and control the second subtransistor to stay off, and in at least part of a pixel refresh time period of the second display frame, the first refresh control signal is configured to control the first subtransistor to stay off and control the second subtransistor to stay on; or in at least part of the pixel refresh time period of the first display frame, the second refresh control signal is configured to control the third subtransistor to stay on and control the fourth subtransistor to stay off, and in at least part of the pixel refresh time period of the second display frame, the second refresh control signal is configured to control the third subtransistor to stay off and control the fourth subtransistor to stay on.

10. The display panel of claim 8, comprising a plurality of display frames, wherein at least one of the following is satisfied:

in a pixel refresh time period of a same display frame of the plurality of display frames, the first refresh control signal is configured to control one of the first subtransistor or the second subtransistor to stay off and control the other of the first subtransistor or the second subtransistor to stay off in at least part of the pixel refresh time period of the display frame; or in a pixel refresh time period of a same display frame of the plurality of display frames, the second refresh control signal is configured to control one of the third subtransistor or the fourth subtransistor to stay off and control the other of the third subtransistor or the fourth subtransistor to stay off in at least part of the pixel refresh time period of the display frame.

11. The display panel of claim 1, comprising a multi-frequency drive display mode, wherein in the multi-frequency drive display mode, the display area comprises a high-frequency display area and a low-frequency display area;

the multi-frequency drive display mode comprises a plurality of display periods, a display period of the plurality of display periods comprises a third display frame and at least one fourth display frame, and the third display frame is before the at least one fourth display frame;

in a pixel refresh time period of the third display frame, the N shift register units of the driver circuit are configured to successively output an active pulse of the gate drive signal; and in a pixel refresh time period of a fourth display frame of the at least one fourth display frame, the gate drive signal provided for pixels in the high-frequency display area by the driver circuit comprises an active level, and the gate drive signal provided for pixels in the low-frequency display area by the driver circuit is the inactive level.

12. The display panel of claim 11, comprising a backlight module; a circuit layer located on a light emission side of the backlight module; and a liquid crystal layer located on a side of the circuit layer facing away from the backlight module, wherein the driver circuit further comprises a source driver circuit configured to control a plurality of source drive signals.

13. The display panel of claim 12, wherein in the display period, a polarity of the plurality of source drive signals in a pixel refresh time period of a display period is different from a polarity of the plurality of source drive signals in a pixel refresh time period of an adjacent display period, and the plurality of source drive signals in a pixel refresh time period of a same display period have a same polarity.

14. The display panel of claim 12, wherein the display period comprises an even number of fourth display frames; and a polarity of the plurality of source drive signals in a pixel refresh time period of the third display frame or fourth display frame is different from a polarity of the plurality of source drive signals in a pixel refresh time period of an adjacent third display frame or fourth display frame, and the plurality of source drive signals in a pixel refresh time period of a same third display frame or fourth display frame have a same polarity.

15. The display panel of claim 12, wherein the display period comprises an odd number of fourth display frames;

in a same display period of the plurality of display periods, a polarity of the plurality of source drive signals in a pixel refresh time period of the third display frame or fourth display frame is different from a polarity of the plurality of source drive signals in a pixel refresh time period of an adjacent third display frame or fourth display frame, and the plurality of source drive signals in a pixel refresh time period of a same third display frame or fourth display frame have a same polarity; and a polarity of the plurality of source drive signals in a pixel refresh time period of a last fourth display frame of the odd number of fourth display frames in the display period is the same as a polarity of the plurality of source drive signals in the pixel refresh time period of the third display frame in a next and adjacent display period of the plurality of display periods.

16. The display panel of claim 11, wherein the driver circuit further comprises a source driver circuit configured to control a plurality of source drive signals;

a pixel refresh time period of the fourth display frame comprises a high-frequency pixel refresh time period and a low-frequency pixel refresh time period, the high-frequency pixel refresh time period overlaps the active pulse of the first refresh control signal, and the low-frequency pixel refresh time period overlaps the active pulse of the second refresh control signal; and in the pixel refresh time period of the at least one fourth display frame in the display period, the plurality of source drive signals comprise a highest level, and the highest level of the plurality of source drive signals corresponds to a highest pixel display grayscale.

17. The display panel of claim 16, wherein a polarity of the plurality of source drive signals in the low-frequency pixel refresh time period is the same as a polarity of the plurality of source drive signals in the pixel refresh time period of the third display frame in a same display period of the plurality of display periods.

18. The display panel of claim 16, further comprising a gating circuit configured to receive at least a gating control signal and the plurality of source drive signals and control a data signal according to the gating control signal; and the low-frequency pixel refresh time period of the at least one fourth display frame in the plurality of display periods overlaps an active pulse of the gating control signal;

wherein an active pulse width of the gate control signal that overlaps the low-frequency pixel refresh time period is greater than an active pulse width of the gate control signal that overlaps the pixel refresh time period of the third display frame; and the active pulse width of the gate control signal that overlaps the low-frequency pixel refresh time period is also greater than an active pulse width of the gate control signal that overlaps the high-frequency pixel refresh time period.

19. A display device, comprising a display panel comprising a driver circuit, wherein the driver circuit comprises N shift register units which are cascaded, wherein N is a positive integer;

a shift register unit of the N shift register units comprises an input module, a reset module, a refresh control module, and at least one output module; and in a same shift register unit of the N shift register units:

the input module is configured to receive an input signal and control a signal of a first node;

the reset module is configured to control a signal of a second node; and the output module is configured to, within at least part of a working time period of the display panel, receive the signal of the first node, the signal of the second node, a first level signal, and an output clock signal and output a gate drive signal; and wherein the refresh control module comprises a first switch unit and a second switch unit;

the first switch unit is configured to receive at least the signal of the first node and the first refresh control signal and control a transmission path for transmission of the signal of the first node to a third node to control a time interval during which the third node is at an active level;

the second switch unit is configured to receive at least the first level signal and the second refresh control signal and control a time period during which the third node is at the inactive level; and the output module is configured to receive at least a signal of the third node, to control the output clock signal to be output as the gate drive signal when the signal of the third node is at the active level, and to control the first level signal to be output as the gate drive signal when the signal of the second node is at an active level.

\* \* \* \* \*